(12) United States Patent
Muro et al.

(10) Patent No.: US 8,735,483 B2
(45) Date of Patent: May 27, 2014

(54) POLYMERIZABLE COMPOSITION

(71) Applicant: Fujifilm Corporation, Tokyo (JP)

(72) Inventors: Naotsugu Muro, Shizuoka (JP); Kimi Ikeda, Shizuoka (JP); Kazuto Shimada, Shizuoka (JP); Daisuke Arioka, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/680,477

(22) Filed: Nov. 19, 2012

(65) Prior Publication Data

US 2013/0072615 A1    Mar. 21, 2013

Related U.S. Application Data

(63) Continuation of application No. PCT/JP2011/061706, filed on May 17, 2011.

(60) Provisional application No. 61/351,407, filed on Jun. 4, 2010.

(30) Foreign Application Priority Data

May 19, 2010   (JP) ................................. 2010-115841
Nov. 15, 2010   (JP) ................................. 2010-255380
Feb. 25, 2011   (JP) ................................. 2011-040902

(51) Int. Cl.
*C08L 35/02*    (2006.01)

(52) U.S. Cl.
USPC ........................................ 524/406

(58) Field of Classification Search
USPC ......................................................... 524/406
See application file for complete search history.

(56) References Cited

U.S. PATENT DOCUMENTS

| 6,806,028 | B2 | 10/2004 | Kubota |
| 2005/0056903 | A1 | 3/2005 | Yamamoto et al. |
| 2006/0178254 | A1* | 8/2006 | Takeda et al. ............ 501/1 |
| 2007/0148593 | A1* | 6/2007 | Shimada et al. ...... 430/270.1 |
| 2011/0124824 | A1 | 5/2011 | Nagata et al. |
| 2012/0244473 | A1 | 9/2012 | Okuda et al. |

FOREIGN PATENT DOCUMENTS

| EP | 2508947 A1 | 10/2012 |
| JP | 06-251621 A | 9/1994 |
| JP | 2007-147854 A | 6/2007 |
| JP | 2007-248925 A | 9/2007 |
| JP | 2007-310291 A | 11/2007 |
| JP | 2008-257045 A | 10/2008 |
| JP | 2009-194396 A | 8/2009 |
| JP | 2009-205029 A | 9/2009 |
| WO | 2010-038836 A1 | 4/2010 |
| WO | 2011-067998 A1 | 9/2011 |
| WO | 2012/015076 A1 | 2/2012 |
| WO | 2012/074136 A1 | 6/2012 |

OTHER PUBLICATIONS

Machine translation of JP 06-251621.*
Machine translation of JP 2007-310291.*

(Continued)

*Primary Examiner* — Vu A Nguyen
(74) *Attorney, Agent, or Firm* — Sughrue Mion, PLLC

(57) ABSTRACT

A polymerizable composition includes: a polymerization initiator; a polymerizable compound; a tungsten compound; and an alkali-soluble binder.

30 Claims, 10 Drawing Sheets

(56) References Cited

OTHER PUBLICATIONS

International Search Report (PCT/ISA/210) issued Jun. 28, 2011, for corresponding Application No. PCT/JP2011/061706.

Written Opinion (PCT/ISA/237) issued Jun. 28, 2011, for corresponding Application No. PCT/JP2011/061706.

Extended European Search Report dated Dec. 20, 2013, issued by the European Patent Office in corresponding European Application No. 11783674.2.

* cited by examiner

POLYMERIZABLE COMPOSITION

CROSS REFERENCE TO RELATED APPLICATIONS

This application is a continuation of PCT application No. PCT/JP2011/061706 filed May 17, 2011, claims priority from Japanese Patent Application No. 2010-255380 filed Nov. 15, 2010, Japanese Patent Application No. 2010-115841 filed May 19, 2010; and Japanese Patent Application No. 2011-040902 filed Feb. 25, 2011, and claims benefit from U.S. Provisional Application No. 61/351,407 filed Jun. 4, 2010, the contents of all of which are incorporated herein by reference.

TECHNICAL FIELD

The present invention relates to a polymerizable composition. More specifically, the present invention relates to a polymerizable composition suitably usable for the formation of a solder resist.

BACKGROUND ART

Conventionally, in the case of forming a permanent pattern such as solder resist, at the time of forming a photosensitive layer on an objective member, a coating film is formed and dried from a photosensitive composition in a liquid form by using a spin-coating method, a screen printing method and a spray printing method, or a method of applying and drying a photosensitive composition on a temporary support to obtain a laminate film having a photosensitive layer and transferring only the photosensitive layer onto a member by means of a vacuum laminator or a roll laminator. As for the method to form a permanent pattern such as solder resist, there is known, for example, a method where a photosensitive layer is formed by the method above on a substrate such as a silicon wafer for formation of a permanent pattern, a silicon wafer having wiring thereon, or a copper-lined laminate board, and the photosensitive layer of the laminate is exposed, then developed to form a pattern and subjected to a curing treatment or the like, thereby forming a permanent pattern.

This permanent pattern formation is also applied to a package substrate interposed between a semiconductor chip and a printed board. As for the package substrate, higher density packaging is recently demanded, and reduction in the wiring pitch, increase in the strength of a solder resist layer, enhancement of the insulating property, thin film formation and the like are proceeding. In turn, resistance to repeated heat/cold shocks (thermal cycle test resistance, TCT resistance) is more keenly demanded. Also, reduction in the via diameter and in view of mounting, a rectangular pattern profile are required.

Furthermore, the photosensitive composition for the formation of a permanent pattern represented by such a solder resist is demanded to ensure that even when a member having a permanent pattern is placed under high-temperature high-humidity conditions, deformation of the permanent pattern or separation of the permanent pattern from the base material does not occur. For example, when such a defect is generated in a solder resist, there arises a problem that a wiring covered with the solder resist develops a dendrite and adjacent wirings are electrically conducted unintentionally. Therefore, it is also important that the solder resist has excellent durability to high temperature and high humidity.

On the other hand, a solid-state imaging device (image sensor) used in cellular phones, digital cameras, digital videos, monitoring cameras and the like is a photoelectric conversion device having an integrated circuit formed using the production technique of a semiconductor device. In recent years, with reduction in size and weight of a cellular phone or a digital camera, the solid-state imaging device is required to be more downsized.

For downsizing the solid-state imaging device, a technique of applying a penetrating electrode or thinning a silicon wafer has been proposed (see, for example, JP-A-2009-194396 (the term "JP-A" as used herein means an "unexamined published Japanese patent application")). Downsizing can be realized by polishing and thereby thinning the silicon wafer, but due to thinning of the silicon wafer, light at a wavelength of 800 nm or more is liable to be transmitted, though the effect of blocking light at 800 nm or less is maintained. A photodiode used in the solid-state imaging device reacts also to light at 800 to 1,200 nm, and transparency to light at 800 nm or more is found to cause a new problem that the pictorial quality is deteriorated.

The solid-state imaging device has a configuration that a color filter and a lens are provided adjacently to one side of a photodiode, an infrared cut filter is present in the vicinity of the color filter or lens to cut light at 800 to 1,200 nm, and a metal wiring, a solder resist and the like are present on the opposite side of the color filter. For example, the space between metal wirings is filled with a solder resist in many cases, but there is a problem that infrared light such as leakage light intruding into the inside of a cellular phone, a digital camera or the like cannot be cut by the solder resist. To cope with this problem, a technique of further providing an infrared-blocking layer on the outer side of the solder resist poor in the light-blocking effect for infrared light and thereby ensuring the infrared-blocking effect has been conventionally employed. However, a height difference due to wiring or the like is generally present on the solder resist and an infrared-blocking layer material can be hardly coated to a uniform thickness on a substrate surface having a height difference, which gives rise to a problem that if a thin portion exits, light is transmitted therethrough.

In order to provide an infrared-blocking layer only in a desired portion, the composition preferably exhibits photosensitivity and has a photolithography performance enabling patterning by exposure. The light-blocking photosensitive composition having a photolithography performance includes a black resist using carbon black employed for the formation of an LCD color filter. The carbon black has a high light-blocking effect in the visible region but exhibits a low light-blocking effect in the infrared region and in the case where such a black resist is applied as a solder resist, if carbon black is added in an amount large enough to ensure the required light-blocking effect in the infrared region, this causes a problem that the light-blocking effect in the visible region becomes excessively high, the exposure light at a shorter wavelength than the visible region, such as high-pressure mercury lamp, KrF and ArF, which is usually used for image formation, is also cut, failing in obtaining sufficient photo-curability, and an excellent pattern cannot be obtained even when passed through a development step using an alkali developer.

Also, at present, an infrared-blocking layer is separately provided after forming a solder resist by a coating method and therefore, in the solder resist formation and the infrared-blocking layer formation, steps such as coating, exposure, development and post-heating must be performed a plurality of times, which leads to a cumbersome process and a rise in the cost. Therefore, improvements are required.

For meeting the requirement, it has been attempted to impart a light-blocking effect to the solder resist itself and, for example, a black solder resist composition containing a black colorant, a colorant other than black, and a polyfunctional epoxy compound have been proposed (see, for example, JP-A-2008-257045). However, this composition is characterized in that the content of the black colorant is kept low by using a colorant other than black in combination, and is practically insufficient in terms of satisfying both light-blocking effect, particularly light-blocking effect in the infrared region, and pattern formability.

SUMMARY OF INVENTION

For the purpose of detecting the position of a semiconductor substrate by a visible light sensor in the process of producing a solid-state imaging device, an alignment mark in a protruded form is often provided at the predetermined position in the surface on the metal wiring and solder resist side (that is, the surface opposite the color filter or lens) of a semiconductor substrate of a solid-state imaging device.

In the case of the above-described configuration where an infrared-blocking layer is further provided on the outer side of the solder resist lacking the light-blocking effect for infrared light, it is considered that even when the infrared-blocking layer is a layer having a light-blocking effect also for visible light, the thickness of this layer need not be so large for the infrared-blocking purpose (because, the infrared-blocking purpose can be achieved with a thinner film than the solder resist layer) and therefore, the detection by a visible light sensor is not caused to face a serious trouble by the covering of the alignment mark with the infrared-blocking layer. However, particularly in the configuration where, as in JP-A-2008-257045, a black colorant is contained in the solder resist composition for imparting a light-blocking effect to the solder resist itself, when the alignment mark is covered by a solder resist layer, maybe due to the thickness of the solder resist layer, a trouble that the alignment mark is not detected by a visible light sensor is liable to more often occur.

Under these circumstances, a polymerizable composition ensuring excellent durability to high temperature/high humidity, high light-blocking effect in the infrared region, high light transparency in the visible region, and capability of forming an excellent pattern by alkali development is demanded at present.

Incidentally, JP-A-2009-205029 discloses a technique of using an inorganic near infrared absorber-containing layer as a near infrared-absorbing layer for an image display device and, for example, a coating solution for near infrared-absorbing layer formation, containing a polymerizable compound, a polymerization initiator and a near infrared absorber, is described in working examples, but the layer obtained from this coating solution is not subjected to pattern formation through exposure and alkali development. Actually, this layer is, even in the unexposed region, insufficient in solubility for an alkali developer and has substantially no alkali developability.

The present invention has been made by taking into consideration these current circumstances, and the task of the present invention is to solve those conventional problems and attain the following object.

That is, an object of the present invention is to provide a polymerizable composition exhibiting high light-blocking effect in the infrared region and high light transparency in the visible region and being capable of forming a pattern with desired profile and excellent durability (for example, durability to high temperature/high humidity, and adherence to substrate) by alkali development.

The present invention has the following configurations, and the above-described object can be attained by these configurations.

(1) A polymerizable composition, comprising:
a polymerization initiator;
a polymerizable compound;
a tungsten compound; and
an alkali-soluble binder.

(2) The polymerizable composition as described in (1) above,
wherein the alkali-soluble binder has an acid group.

(3) The polymerizable composition as described in (1) or (2) above,
wherein the alkali-soluble binder has a crosslinking group.

(4) The polymerizable composition as described in any one of (1) to (3) above,
wherein the alkali-soluble binder is a (meth)acrylic resin or a urethane-based resin.

(5) The polymerizable composition as described in (4) above,
wherein the alkali-soluble binder is a urethane-based resin.

(6) The polymerizable composition as described in (4) above,
wherein the alkali-soluble binder is a (meth)acrylic resin.

(7) The polymerizable composition as described in any one of (1) to (6) above,
wherein the tungsten compound is represented by the following formula (I):

$$M_xW_yO_z \qquad (I)$$

wherein M represents a metal;
W represents tungsten;
O represents oxygen;
$0.001 \leq x/y \leq 1.1$; and
$2.2 \leq z/y \leq 3.0$.

(8) The polymerizable composition as described in (7) above,
wherein M is an alkali metal.

(9) The polymerizable composition as described in any one of (1) to (8) above,
wherein the polymerizable compound is a polyfunctional polymerizable compound having a plurality of polymerizable groups within a molecule.

(10) The polymerizable composition as described in any one of (1) to (9) above,
wherein the polymerization initiator is an acetophenone-based compound.

(11) The polymerizable composition as described in any one of (1) to (10) above, further comprising:
at least two kinds of fillers having different volume average particle diameters of primary particles.

(12) The polymerizable composition as described in any one of (1) to (11) above, further comprising:
a silane coupling agent.

(13) The polymerizable composition as described in any one of (1) to (12) above, which is used for a solder resist.

(14) The polymerizable composition as described in (13) above, which has a solid content concentration of from 30 to 80 mass % and a viscosity at 25° C. of from 10 to 3,000 mPa·s.

The present invention preferably further has the following configurations.

(15) A photosensitive layer, which is formed from the polymerizable composition described in any one of (1) to (14) above.

(16) A permanent pattern, which is formed using the polymerizable composition described in any one of (1) to (14) above.

(17) The permanent pattern as described in (16) above, wherein the permanent pattern is a solder resist layer.

(18) The permanent pattern as described in (16) above, wherein the permanent pattern is an infrared-blocking film.

(19) A wafer-level lens, comprising:

a lens; and the permanent pattern described in (18) above formed in a circumferential edge part of the lens.

(20) A solid-state imaging device, comprising:

the permanent pattern described in any one of (16) to (18) above.

(21) A solid-state imaging device, comprising:

a solid-state imaging device substrate having formed on one surface thereof an imaging device part; and an infrared-blocking film provided on the other surface side of the solid-state imaging device substrate, wherein the infrared-blocking film is the permanent pattern described in (18) above.

(22) A pattern forming method, comprising, in this order:

a step of forming the photosensitive layer described in (15) above;

a step of pattern-exposing the photosensitive layer to cure an exposed area; and a step of removing an unexposed area by alkali development to form a permanent pattern.

DESCRIPTION OF EMBODIMENTS

Figure 1:
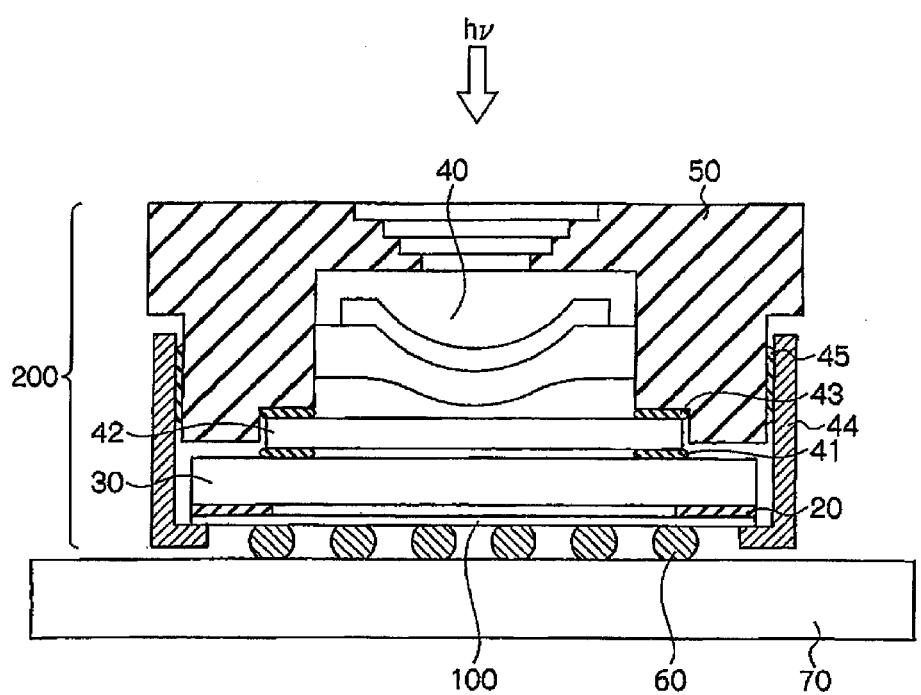
FIG. 1 is a schematic cross-sectional view showing the configuration of a camera module equipped with the solid-state imaging device according to an exemplary embodiment of the present invention.

The polymerizable composition of the present invention is described in detail below.

In the description of the present invention, when a group (atomic group) is denoted without specifying whether substituted or unsubstituted, the group includes both a group having no substituent and a group having a substituent. For example, "an alkyl group" includes not only an alkyl group having no substituent (unsubstituted alkyl group) but also an alkyl group having a substituent (substituted alkyl group). Also, in the description of the present invention, the viscosity value indicates the value at 25° C.

The polymerizable composition of the present invention contains a polymerization initiator, a polymerizable compound, a tungsten compound and an alkali-soluble binder and may contain, if desired, an infrared-shielding material other than a tungsten compound, a dispersant, a sensitizer, a crosslinking agent, a curing accelerator, a filler, an elastomer, a surfactant and other components.

The polymerizable composition of the present invention is, for example, a negative composition and typically a negative resist composition. The configuration of this composition is described below.

The configuration requirements are described below based on representative embodiments of the present invention, but the present invention is not limited to these embodiments. Incidentally, in the description of the present invention, the range expressed as "(numerical value) to (numerical value)" means a range including the numerical values before and after "to" as the lower limit and the upper limit, respectively.

In the description of the present invention, the term "(meth)acrylate" indicates acrylate and methacrylate, the term "(meth)acryl" indicates acryl and methacryl, and the term "(meth)acryloyl" indicates acryloyl and methacryloyl. Also, in the description of the present invention, the "monomeric substance" has the same meaning as "monomer". The "monomeric substance" as used in the present invention is differentiated from an oligomer and a polymer and indicates a compound having a mass average molecular weight of 2,000 or less. In the description of the present invention, the term "polymerizable compound" indicates a compound having a polymerizable group and may be either a monomeric substance or a polymer. The term "polymerizable group" indicates a group participating in polymerization reaction.

[1] Polymerization Initiator

The polymerization initiator for use in the polymerizable composition of the present invention is not particularly limited as long as it has an ability of initiating the polymerization of the polymerizable compound by either one or both of light and heat, and the initiator may be appropriately selected according to the purpose but is preferably a photopolymerizable compound. In the case of initiating the polymerization by light, a compound having photosensitivity to light in the ultraviolet to visible regions is preferred.

In the case of initiating the polymerization by heat, an initiator capable of decomposing at 150 to 250° C. is preferred.

The polymerization initiator which can be used in the present invention is preferably a compound having at least an aromatic group, and examples thereof include an acylphosphine-based compound, an acetophenone-based compound, an α-aminoketone compound, a benzophenone-based compound, a benzoin ether-based compound, a ketal derivative compound, a thioxanthone compound, an oxime compound, a hexaarylbiimidazole compound, a trihalomethyl compound, an azo compound, an organic peroxide, a diazonium compound, an iodonium compound, a sulfonium compound, an azinium compound, an onium salt compound such as metallocene compound, an organic boron salt compound, and a disulfone compound.

In view of sensitivity, an oxime compound, an acetophenone-based compound, an α-amino ketone compound, a trihalomethyl compound, a hexaarylbiimidazole compound, and a thiol compound are preferred.

Examples of the polymerization initiator suitable for the present invention are described below, but the present invention is not limited thereto.

Examples of the acetophenone-based compound include 2,2-diethoxyacetophenone, p-dimethylaminoacetophenone, 2-hydroxy-2-methyl-1-phenyl-propan-1-one, 4'-isopropyl-2-hydroxy-2-methyl-propiophenone, 1-hydroxy-cyclohexyl-phenyl-ketone, 2-benzyl-2-dimethylamino-1-(4-morpholinophenyl)-butanone-1,2-tolyl-2-dimethylamino-1-(4-morpholinophenyl)-butanone-1,2-methyl-1-[4-(methylthio)phenyl]-2-morpholinopropanone-1,2-methyl-1-(4-methylthiophenyl)-2-morpholinopropan-1-one, 2-benzyl-2-dimethylamino-1-(4-morpholinophenyl)-butanone-1,2-(dimethylamino)-2-[(4-methylphenyl)methyl]-1-[4-(4-morpholinyl)phenyl]-1-butanone, and 2-methyl-1-(4-methylthiophenyl)-2-morpholinopropan-1-one.

The trihalomethyl compound is more preferably an s-triazine derivative where at least one mono-, di- or tri-halogen-substituted methyl group is bonded to an s-triazine ring, and specific examples thereof include 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-1-propyloxystyryl)-4,6-bis(trichloromethyl)-s-triazine, 2-(p-tolyl)-4,6-bis(trichloromethyl)-s-triazine, 2-(4-nathoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, and 2-methoxy-4,6-bis(tribromomethyl)-s-triazine.

Examples of the hexaarylbiimidazole compound include various compounds described in JP-B-6-29285 (the term "JP-B" as used herein means an "examined Japanese patent publication"), U.S. Pat. Nos. 3,479,185, 4,311,783 and 4,622,286, specifically, 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, and 2,2'-bis(o-trifluorophenyl)-4,4',5,5'-tetraphenylbiimidazole.

Examples of the oxime compound include compounds described in J. C. S. Perkin II, 1653-1660 (1979), J. C. S. Perkin II, 156-162 (1979), Journal of Photopolymer Science and Technology, 202-232 (1995), JP-A-2000-66385, JP-A-2000-80068 and JP-T-2004-534797 (the term "JP-T" as used herein means a published Japanese translation of a PCT patent application), IRGACURE OXE01 (1,2-octanedione, 1-[4-(phenylthio)-, 2-(O-benzoyloxime)]), IRGACURE OXE02 (ethanone, 1-[9-ethyl-6-(2-methylbenzoyl)-9H-carbazol-3-yl]-, 1-(O-acetyloxime)), both produced by BASF Japan, and 2-(acetyloxyiminomethyl)thioxanthen-9-one.

Furthermore, cyclic oxime compounds described in JP-A-2007-231000 and JP-A-2007-322744 may be also preferably used.

Most preferred are an oxime compound having a specific substituent described in JP-A-2007-269779 and an oxime compound having a thioaryl group described in JP-A-2009-191061.

Specifically, the oxime compound is preferably a compound represented by the following formula (1). Incidentally, the oxime compound may be a compound where the N—O bond of oxime is (E) form, a compound where the bond is (Z) form, or a compound where the bond is a mixture of (E) form and (Z) form.

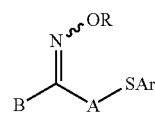

(1)

(wherein each of R and B independently represents a monovalent substituent, A represents a divalent organic group, and Ar represents an aryl group).

The monovalent substituent represented by R is preferably a monovalent nonmetallic atom group. Examples of the monovalent nonmetallic atom group include an alkyl group, an aryl group, an acyl group, an alkoxycarbonyl group, an aryloxycarbonyl group, a heterocyclic group, and an alkylthiocarbonyl group, an arylthiocarbonyl group. These groups may have one or more substituents. The substituent above may be further substituted with another substituent.

Examples of the substituent include a halogen atom, an aryloxy group, an alkoxycarbonyl group, an aryloxycarbonyl group, an acyloxy group, an acyl group, an alkyl group and an aryl group.

The alkyl group which may have a substituent is preferably an alkyl group having a carbon number of 1 to 30, and specific examples thereof include a methyl group, an ethyl group, a propyl group, a butyl group, a hexyl group, an octyl group, a decyl group, a dodecyl group, an octadecyl group, an isopropyl group, an isobutyl group, a sec-butyl group, a tert-butyl group, a 1-ethylpentyl group, a cyclopentyl group, a cyclohexyl group, a trifluoromethyl group, a 2-ethylhexyl group, a phenacyl group, a 1-naphthoylmethyl group, a 2-naphthoylmethyl group, a 4-methylsulfanylphenacyl group, a 4-phenylsulfanylphenacyl group, a 4-dimethylaminophenacyl group, a 4-cyanophenacyl group, a 4-methylphenacyl group, a 2-methylphenacyl group, a 3-fluorophenacyl group, a 3-trifluoromethylphenacyl group, and a 3-nitrophenacyl group.

The aryl group which may have a substituent is preferably an aryl group having a carbon number of 6 to 30, and specific examples thereof include a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, a quaterphenyl group, an o-tolyl group, an m-tolyl group, a p-tolyl group, a xylyl group, an o-cumenyl group, an m-cumenyl group, a p-cumenyl group, a mesityl group, a pentalenyl group, a binaphthalenyl group, a ternaphthalenyl group, a quaternaphthalenyl group, a heptalenyl group, a biphenylenyl group, an indacenyl group, a fluorantenyl group, an acenaphthylenyl group, an aceanthrylenyl group, a phenalenyl group, a fluorenyl group, an anthryl group, a bianthracenyl group, a teranthracenyl group, a quateranthracenyl group, an anthraquinolyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group.

The acyl group which may have a substituent is preferably an acyl group having a carbon number of 2 to 20, and specific examples thereof include an acetyl group, a propanoyl group, a butanoyl group, a trifluoroacetyl group, a pentanoyl group, a benzoyl group, a 1-naphthoyl group, a 2-naphthoyl group, a 4-methylsulfanylbenzoyl group, a 4-phenylsulfanylbenzoyl group, a 4-dimethylaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group, and a 4-methoxybenzoyl group.

The alkoxycarbonyl group which may have a substituent is preferably an alkoxycarbonyl group having a carbon number of 2 to 20, and specific examples thereof include a methoxycarbonyl group, an ethoxycarbonyl group, a propoxycarbonyl group, a butoxycarbonyl group, a hexyloxycarbonyl group, an octyloxycarbonyl group, a decyloxycarbonyl group, an octadecyloxycarbonyl group, and a trifluoromethyloxycarbonyl group.

Specific examples of the aryloxycarbonyl group which may have a substituent include a phenoxycarbonyl group, a 1-naphthyloxycarbonyl group, a 2-naphthyloxycarbonyl group, a 4-methylsulfanylphenyloxycarbonyl group, a 4-phenylsulfanylphenyloxycarbonyl group, a 4-dimethylaminophenyloxycarbonyl group, a 4-diethylaminophenyloxycarbonyl group, a 2-chlorophenyloxycarbonyl group, a 2-methylphenyloxycarbonyl group, a 2-methoxyphenyloxycarbonyl group, a 2-butoxyphenyloxycarbonyl group, a 3-chlorophenyloxycarbonyl group, a 3-trifluoromethylphenyloxycarbonyl group, a 3-cyanophenyloxycarbonyl group, a 3-nitrophenyloxycarbonyl group, a 4-fluorophenyloxycarbonyl group, a 4-cyanophenyloxycarbonyl group, and a 4-methoxyphenyloxycarbonyl group.

The heterocyclic group which may have a substituent is preferably an aromatic or aliphatic heterocyclic ring containing a nitrogen atom, an oxygen atom, a sulfur atom or a phosphorus atom.

Specific examples thereof include a thienyl group, a benzo[b]thienyl group, a naphtho[2,3-b]thienyl group, a thianthrenyl group, a furyl group, a pyranyl group, an isobenzofuranyl group, a chromenyl group, a xanthenyl group, a phenoxathiinyl group, a 2H-pyrrolyl group, a pyrrolyl group, an imidazolyl group, a pyrazolyl group, a pyridyl group, a pyrazinyl group, a pyrimidinyl group, a pyridazinyl group, an indolizinyl group, an isoindolyl group, a 3H-indolyl group, an indolyl group, a 1H-indazolyl group, a purinyl group, a 4H-quinolizinyl group, an isoquinolyl group, a quinolyl group, a phthalazinyl group, a naphthyridinyl group, a quinoxanilyl group, a quinazolinyl group, a cinnolinyl group, a pteridinyl group, a 4aH-carbazolyl group, a carbazolyl group, a β-carbolinyl group, a phenanthridinyl group, an acridinyl group, a perimidinyl group, a phenanthrolinyl group, a phenazinyl group, a phenarsazinyl group, an isothiazolyl group, a phenothiazinyl group, an isoxazolyl group, a furazanyl group, a phenoxazinyl group, an isochromanyl group, a chromanyl group, a pyrrolidinyl group, a pyrrolinyl group, an imidazolidinyl group, an imidazolinyl group, a pyrazolidinyl group, a pyrazolinyl group, a piperidyl group, a piperazinyl group, an indolinyl group, an isoindolinyl group, a quinuclidinyl group, a morpholinyl group, and a thioxanthonyl group.

Specific examples of the alkylthiocarbonyl group which may have a substituent include a methylthiocarbonyl group, a propylthiocarbonyl group, a butylthiocarbonyl group, a hexylthiocarbonyl group, an octylthiocarbonyl group, a decylthiocarbonyl group, an octadecylthiocarbonyl group, and a trifluoromethylthiocarbonyl group.

Specific examples of the arylthiocarbonyl group which may have a substituent include a 1-naphthylthiocarbonyl group, a 2-naphthylthiocarbonyl group, a 4-methylsulfanylphenylthiocarbonyl group, a 4-phenylsulfanylphenylthiocarbonyl group, a 4-dimethylaminophenylthiocarbonyl group, a 4-diethylaminophenylthiocarbonyl group, a 2-chlorophenylthiocarbonyl group, a 2-methylphenylthiocarbonyl group, a 2-methoxyphenylthiocarbonyl group, a 2-butoxyphenylthiocarbonyl group, a 3-chlorophenylthiocarbonyl group, a 3-trifluoromethylphenylthiocarbonyl group, a 3-cyanophenylthiocarbonyl group, a 3-nitrophenylthiocarbonyl group, a 4-fluorophenylthiocarbonyl group, a 4-cyanophenylthiocarbonyl group, and a 4-methoxyphenylthiocarbonyl group.

The monovalent substituent represented by B indicates an aryl group, a heterocyclic group, an arylcarbonyl group, or a heterocyclic carbonyl group. These groups may have one or more substituent. Examples of the substituent include the substituents described above. Also, each of the substituents described above may be further substituted with another substituent.

Above all, the structures shown below are preferred.

In the following structures, Y, X and n have the same meanings as Y, X and n in formula (2) described later, respectively, and preferred examples thereof are also the same.

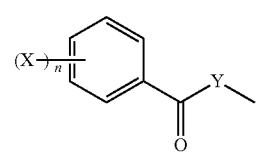

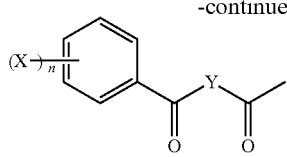

The divalent organic group represented by A includes an alkylene group having a carbon number of 1 to 12, a cyclohexylene group, and an alkynylene group. These groups may have one or more substituents. Examples of the substituent include the substituents described above. Also, each of the substituents described above may be further substituted with another substituent.

Above all, from the standpoint of increasing the sensitivity and suppressing the coloration due to heating or aging, A is preferably an unsubstituted alkylene group, an alkylene group substituted with an alkyl group (e.g., methyl group, ethyl group, tert-butyl group, dodecyl group), an alkylene group substituted with an alkenyl group (e.g., vinyl group, allyl group), or an alkylene group substituted with an aryl group (e.g., phenyl group, p-tolyl group, xylyl group, cumenyl group, naphthyl group, anthryl group, phenanthryl group, styryl group).

The aryl group represented by Ar is preferably an aryl group having a carbon number of 6 to 30 and may have a substituent. Examples of the substituent are the same as those of the substituent introduced into the substituted aryl group that is described above as specific examples of the aryl group which may have a substituent.

Above all, from the standpoint of increasing the sensitivity and suppressing the coloration due to heating or aging, a substituted or unsubstituted phenyl group is preferred.

In formula (1), in view of sensitivity, the structure "SAr" formed by Ar and S adjacent thereto is preferably a structure shown below. Here, Me represents a methyl group, and Et represents an ethyl group.

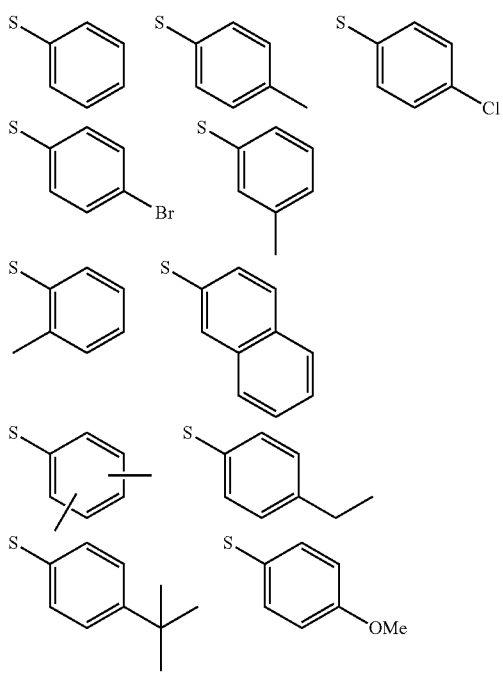

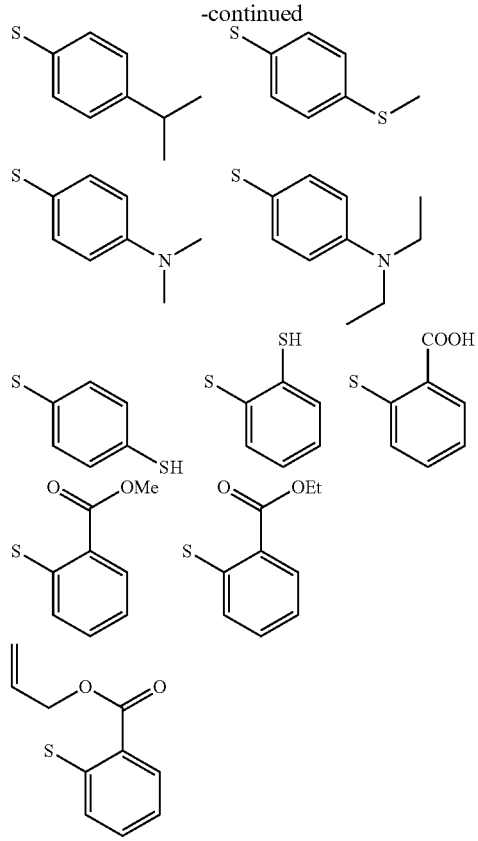

The oxime compound is preferably a compound represented by the following formula (2):

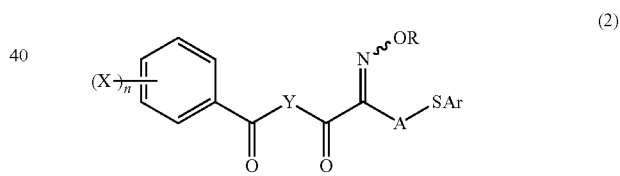

(2)

(In formula (2), each of R and X independently represent a monovalent substituent, each of A and Y independently represent a divalent organic group, Ar represents an aryl group, and n is an integer of 0 to 5).

R, A and Ar in formula (2) have the same meanings as R, A and Ar in formula (1), and preferred examples thereof are also the same.

Examples of the monovalent substituent represented by X include an alkyl group, an aryl group, an alkoxy group, an aryloxy group, an acyloxy group, an acyl group, an alkoxycarbonyl group, an amino group, a heterocyclic group, and a halogen group. These groups may have one or more substituents. Examples of the substituent include the substituents described above. Also, each of the substituents described above may be further substituted with another substituent.

Above all, from the standpoint of enhancing the solvent solubility and absorption efficiency in the long wavelength region, X is preferably an alkyl group.

In formula (2), n represents an integer of 0 to 5 and is preferably an integer of 0 to 2.

The divalent organic group represented by Y includes structures shown below. In the structures shown below, "*" indicates a bonding position to the carbon atom adjacent to Y in formula (2).

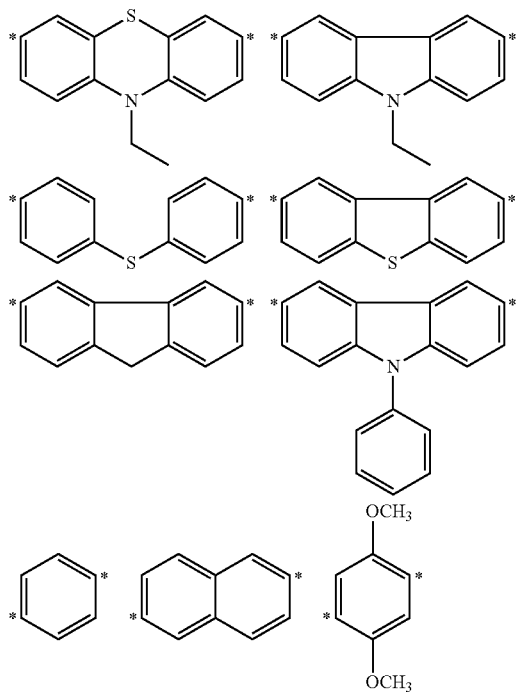

Among these, in view of achieving high sensitivity, structures shown below are preferred.

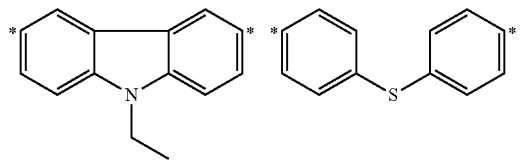

The oxime compound is also preferably a compound represented by the following formula (3):

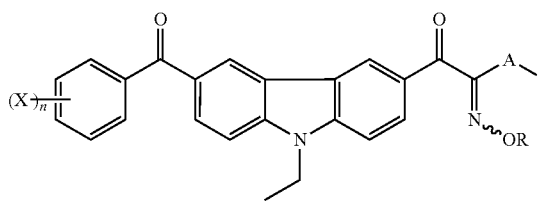

R, X, A, Ar and n in formula (3) have the same meanings as R, X, A, Ar and n in formula (2), respectively, and preferred examples thereof are also the same.

Specific examples (C-4) to (C-13) of the oxime compound which is suitably used are illustrated below, but the present invention is not limited thereto.

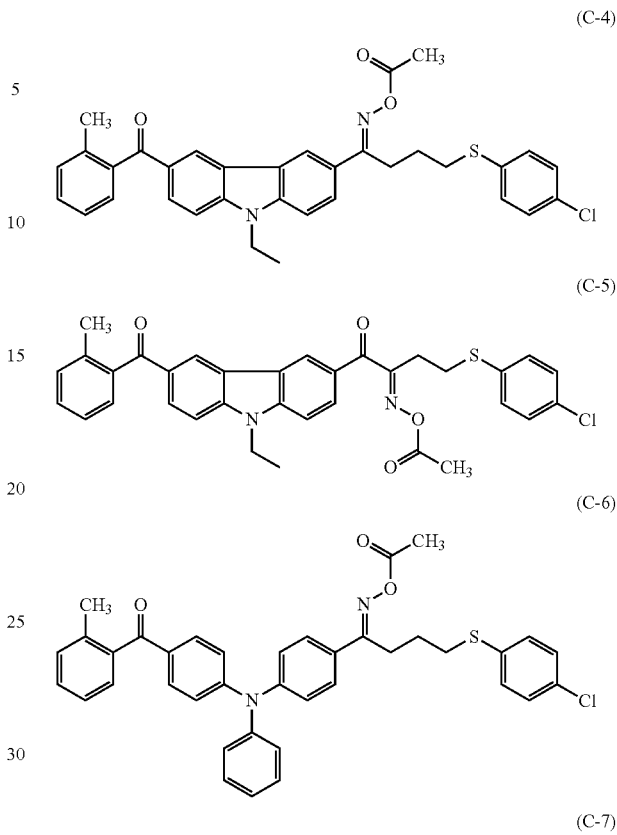

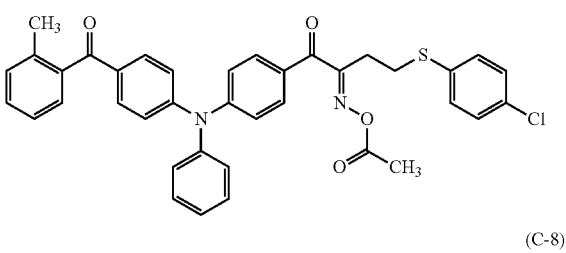

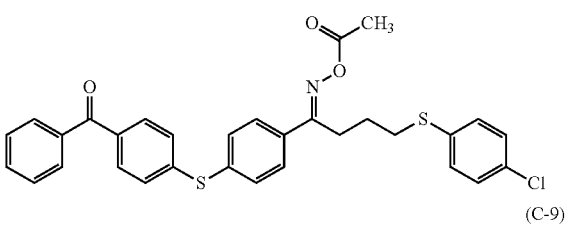

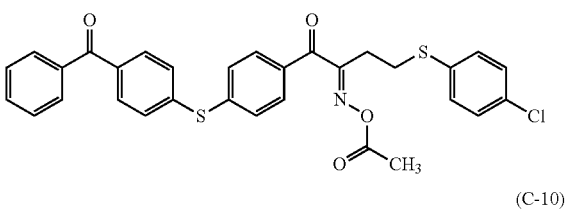

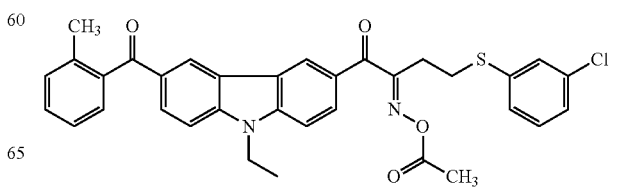

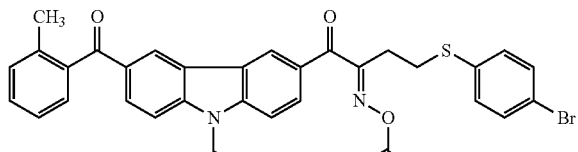

(C-11)

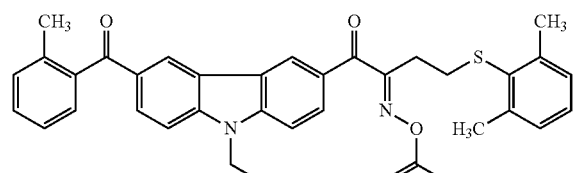

(C-12)

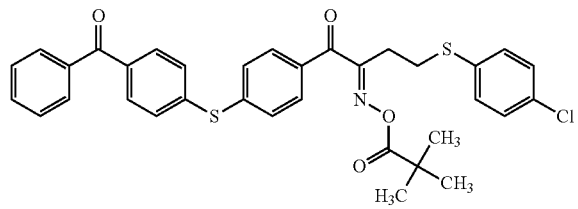

(C-13)

The oxime compound has a maximum absorption wavelength in the wavelength region of 350 to 500 nm. An oxime compound having an absorption wavelength in the wavelength region of 360 to 480 nm is preferred, and an oxime compound having high absorbance in 365 or 455 nm is more preferred.

In view of sensitivity, the molar extinction coefficient at 365 nm or 405 nm of the oxime compound is preferably from 3,000 to 300,000, more preferably from 5,000 to 300,000, still more preferably from 10,000 to 200,000.

The molar extinction coefficient of the compounds can be measured by a known method but is preferably measured, for example, at a concentration of 0.01 g/L by using an ethyl acetate solvent by means of an ultraviolet-visible spectrophotometer (Carry-5 spectrophotometer, manufactured by Varian Inc.).

The photopolymerization initiator is more preferably a compound selected from the group consisting of an oxime compound, an acetophenone-based compound and an acylphosphine compound. More specifically, for example, aminoacetophenone-based initiators described in JP-A-10-291969, acylphosphine oxide-based initiators described in Japanese Patent No. 4,225,898, oxime-based initiators described above, and compounds described in JP-A-2001-233842 as the oxime-based initiator may be also used.

As the acetophenone-based initiator, commercial products IRGACURE-907, IRGACURE-369 and IRGACURE-379 (trade names, all produced by BASF Japan) may be used. Also, as the acylphosphine-based initiator, commercial products IRGACURE-819 and DAROCUR-TPO (trade names, both produced by BASF Japan) may be used.

One kind of a polymerization initiator may be used alone, or two or more kinds of polymerization initiators may be used in combination.

The content of the polymerization initiator is preferably from 0.01 to 30 mass %, more preferably from 0.1 to 20 mass %, still more preferably from 0.1 to 15 mass %, based on the entire solid content by mass of the polymerizable composition of the present invention. (In this specification, mass ratio is equal to weight ratio.)

[2] Polymerizable Compound

The polymerizable composition of the present invention contains a polymerizable compound. The polymerizable compound used here may be any compound as long as it has, within the molecule, a functional group capable of undergoing a reaction by at least one of acid, radical and heat (in the description of the present invention, such a functional group is sometimes referred to as a "polymerizable group"). A polyfunctional polymerizable compound having a plurality of polymerizable groups within the molecule is preferred.

Examples of the polymerizable compound having a polymerizable functional group capable of undergoing a reaction by at least one of acid, radical and heat include an ethylenically unsaturated group-containing compound having an ethylenically unsaturated group such as unsaturated ester group, unsaturated amide group, vinyl ether group and allyl group, a methylol compound, a bismaleimide compound, a benzocyclobutene compound, a bisallylnadiimide compound and a benzoxazine compound.

The polymerizable compound which can be preferably used in the present invention includes general radical polymerizable compounds, and compounds widely known as a compound having an ethylenically unsaturated double bond in this industrial field can be used without any particular limitation.

These compounds have a chemical form such as a monomer, a prepolymer (that is, a dimer, a trimer or an oligomer) or a mixture or copolymer thereof.

Examples of the monomer and the copolymer thereof include an unsaturated carboxylic acid (for example, an acrylic acid, a methacrylic acid, an itaconic acid, a crotonic acid, an isocrotonic acid and a maleic acid), its esters and amides, and copolymers thereof. Among these, unsaturated carboxylic acid esters, esters of unsaturated carboxylic acid with aliphatic polyhydric alcohol compound, and amides of unsaturated carboxylic acid with aliphatic polyvalent amine compound are preferably used.

Above all, an ester of unsaturated carboxylic acid with aliphatic polyhydric alcohol compound can develop high hydrophobicity in the exposed area and is preferred from the standpoint that a pattern having a desired profile is easily formed by alkali development or a pattern having high durability is obtained (this effect is pronounced particularly when higher durability is required of a solder resist as in the case where a metal wiring covered with a solder resist has a high wiring density).

Other suitable examples include an addition reaction product of unsaturated carboxylic acid esters or amides having a nucleophilic substituent such as hydroxyl group, amino group and mercapto group with monofunctional or polyfunctional isocyanates or epoxies, and a dehydration condensation reaction product with monofunctional or polyfunctional carboxylic acid.

Furthermore, an addition reaction product of unsaturated carboxylic acid esters or amides having an electrophilic substituent such as isocyanate group and epoxy group with monofunctional or polyfunctional alcohols, amines or thiols, and a substitution reaction product of unsaturated carboxylic acid esters or amides having a leaving substituent such as halogen group and tosyloxy group with monofunctional or polyfunctional alcohols, amines or thiols are also suitable. Alternatively, compounds in which the unsaturated carboxyl acid above is replaced by an unsaturated phosphonic acid, styrene, vinyl ether or the like, may be also used.

As the unsaturated carboxylic acid ester, a methacrylic acid ester is preferred, and examples thereof include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, bis-[p-(methacryloxyethoxy)phenyl]dimethylmethane, and EO-modified and PO-modified products thereof.

As the unsaturated carboxylic acid ester, an itaconic acid ester is also preferred, and examples thereof include ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate. Examples of the crotonic acid ester include ethylene glycol dicrotonate, tetramethylene glycol dicrotonate, pentaerythritol dicrotonate and sorbitol tetradicrotonate. Examples of the isocrotonic acid ester include ethylene glycol diisocrotonate, pentaerythritol diisocrotonate and sorbitol tetraisocrotonate. Examples of the maleic acid ester include ethylene glycol dimaleate, triethylene glycol dimaleate, pentaerythritol dimaleate and sorbitol tetramaleate.

As for specific examples of the ester monomer of an aliphatic polyhydric alcohol compound with an unsaturated carboxylic acid, examples of the acrylic acid ester include ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, tricyclodecane dimethanol diacrylate, tricyclodecane dimethanol dimethacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, polyester acrylate oligomer, and EO-modified and PO-modified products thereof.

Examples of other esters which are suitably used include aliphatic alcohol esters described in JP-B-51-47334 and JP-A-57-196231, esters having an aromatic structure described in JP-A-59-5240, JP-A-59-5241, and JP-A-2-226149, and esters having an amino group described in JP-A-1-165613. These ester monomers may be also used as a mixture.

Specific examples of the amide monomer of an aliphatic polyvalent amine compound with an unsaturated carboxylic acid include methylenebis-acrylamide, methylenebis-methacrylamide, 1,6-hexamethylenebis-acrylamide, 1,6-hexamethylenebis-methacrylamide, diethylenetriaminetrisacrylamide, xylylenebisacrylamide, and xylylenebismethacrylamide. Other preferred examples of the amide-based monomer include the amides having a cyclohexylene structure described in JP-B-54-21726.

A urethane-based addition-polymerizable compound produced using an addition reaction of an isocyanate with a hydroxyl group is also suitable, and specific examples thereof include a vinyl urethane compound having two or more polymerizable vinyl groups per molecule described in JP-B-48-41708, which is obtained by adding a hydroxyl group-containing vinyl monomer represented by the following formula (E) to a polyisocyanate compound having two or more isocyanate groups per molecule.

$$CH_2=C(R^4)COOCH_2CH(R^5)OH \qquad (E)$$

[wherein each of $R^4$ and $R^5$ independently represents H or $CH_3$].

Also, urethane acrylates described in JP-A-51-37193, JP-B-2-32293 and JP-B-2-16765 and urethane compounds having an ethylene oxide-based structure described in JP-B-58-49860, JP-B-56-17654, JP-B-62-39417 and JP-B-62-39418 are suitable. In addition, use of addition-polymerizable compounds having an amino structure or a sulfide structure in the molecule described in JP-A-63-277653, JP-A-63-260909 and JP-A-1-105238 enables obtaining a polymerizable composition exhibiting a very excellent photosensitization speed.

Other examples include a polyfunctional acrylate or methacrylate such as polyester acrylates described in JP-A-48-64183, JP-B-49-43191 and JP-B-52-30490 and epoxy acrylates obtained by reacting epoxy resin with (meth)acrylic acid. Examples further include specific unsaturated compounds described in JP-B-46-43946, JP-B-1-40337 and JP-B-1-40336 and vinylphosphonic acid-based compounds described in JP-A-2-25493. Depending on the case, a perfluoroalkyl group-containing structure described in JP-A-61-22048 is suitably used. Furthermore, those introduced as a photocurable monomer or oligomer in Journal of The Adhesion Society of Japan, Vol. 20, No. 7, pp. 300-308 (1984) can be also used.

In the present invention, when a radical polymerizable compound is added, in view of curing sensitivity, a polyfunctional polymerizable compound having 2 or more, preferably 3 or more, ethylenically unsaturated bonds is preferably used. Above all, it is preferred to contain 2 or more, more preferably 3 or more, most preferably 4 or more, (meth)acrylic acid ester structures.

Also, in view of curing sensitivity and developability of the unexposed area, an EO-modified product-containing compound is preferably used, and in view of curing sensitivity and strength of the exposed area, a urethane bond-containing compound is preferably used. Furthermore, from the standpoint of developability at the pattern formation, a compound having an acid group is preferably used.

From these viewpoints, preferred examples of the polymerizable compound for use in the present invention include bisphenol A diacrylate. EO-modified bisphenol A diacrylate, trimethylolpropane triacrylate, trimethylolpropane tri(acryloyloxypropyl)ether, trimethylolethane triacrylate, tetraethylene glycol diacrylate, pentaerythritol diacrylate, pentaerythritol triacrylate, pentaerythritol tetraacrylate, dipentaerythritol tetraacrylate, dipentaerythritol pentaacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, EO-modified pentaerythritol tetraacrylate, and EO-modified dipentaerythritol hexaacrylate. As the commercial product, urethane oligomers UAS-10, UAB-140 (both produced by Sanyo Kokusaku Pulp Co., Ltd.), DPHA-40H (produced by Nippon Kayaku Co., Ltd.), UA-306H, UA-306T, UA-306I, AH-600, T-600 and AI-600 (all produced by Kyoeisha Chemical Co., Ltd.) are preferred.

Among these, EO-modified bisphenol A diacrylate, pentaerythritol triacrylate, pentaerythritol tetraacrylate, dipentaerythritol pentaacrylate, dipentaerythritol hexaacrylate, tri(acryloyloxyethyl)isocyanurate, EO-modified pentaerythritol tetraacrylate, EO-modified dipentaerythritol hexaacrylate, and commercial products DPHA-40H (produced by Nippon Kayaku Co., Ltd.), UA-306H, UA-306T, UA-306I, AH-600, T-600, and AI-600 (produced by Kyoeisha Chemical Co., Ltd.) are more preferred.

Acid group-containing ethylenically unsaturated compounds are also suitable, and examples of the commercial product thereof include TO-756 as a carboxyl group-containing trifunctional acrylate and TO-1382 as a carboxyl group-containing pentafunctional acrylate, both produced by Toagosei CO., Ltd.

In addition, examples of the highly heat-resistant polymerizable compound include benzocyclobutene (BCB), bisallylnadiimide (BANI), benzoxazine, melamine, and analogs thereof.

Also, two or more kinds of polymerizable compounds may be used.

The content of the polymerizable compound is preferably from 3 to 80 mass %, more preferably from 5 to 50 mass %, based on the entire solid content by mass of the polymerizable composition of the present invention.

In this connection, the polymerizable compound may be the same as or different from the alkali-soluble binder.

More specifically, when the polymerizable compound is a polymer, the polymerizable compound may be the same as or different from the alkali-soluble binder described in detail later (that is, the polymerizable compound may be composed of the same components as those of the alkali-soluble binder). In this embodiment, the content of the polymerizable compound is preferably from 3 to 80 mass %, more preferably from 5 to 60 mass %, based on the entire solid content by mass of the polymerizable composition of the present invention.

[3] Tungsten Compound

The polymerizable composition of the present invention contains a tungsten compound (a compound containing tungsten).

The tungsten compound is an infrared-shielding material having high absorption for infrared ray (light at a wavelength of approximately from 800 to 1,200 nm) (that is, the light-blocking effect (light-shielding property) for infrared ray is high) and low absorption for visible light. The polymerizable composition of the present invention contains a tungsten compound, so that a pattern having high light-blocking effect in the infrared region and high light transparency in the visible region can be formed.

Also, the tungsten compound exhibits small absorption also for light shorter than the visible region, which is employed in exposure to high-pressure mercury lamp, KrF, ArF or the like used for image formation. Thanks to the combination of such a tungsten compound with a polymerization initiator, a polymerizable compound and an alkali-soluble binder, an excellent pattern is obtained.

The tungsten compound includes, for example, a tungsten oxide-based compound, a tungsten boride-based compound and a tungsten sulfide-based compound and is preferably a tungsten oxide-based compound represented by the following formula (I):

$$M_xW_yO_z \qquad (I)$$

wherein M represents a metal, W represents tungsten, O represents oxygen,
0.001≤x/y≤1.1, and
2.2≤z/y≤3.0.

The metal of M includes an alkali metal, an alkaline earth metal, Mg, Zr, Cr, Mn, Fe, Ru, Co, Rh, Ir, Ni, Pd, Pt, Cu, Ag, Au, Zn, Cd, Al, Ga, In, Tl, Sn, Pb, Ti, Nb, V, Mo, Ta, Re, Be, Hf, Os and Bi and is preferably an alkali metal. The metal of M may be one kind of a metal or two or more kinds of metals.

M is preferably an alkali metal, more preferably Rb or Cs, still more preferably Cs.

When x/y is 0.001 or more, infrared ray can be sufficiently cut, and when it is 1.1 or less, production of an impurity phase in the tungsten compound can be more unfailingly avoided.

When z/y is 2.2 or more, chemical stability as the material can be more enhanced, and when it is 3.0 or less, infrared ray can be sufficiently cut.

Specific examples of the tungsten oxide-based compound represented by formula (I) include $Cs_{0.33}WO_3$, $Rb_{0.33}WO_3$, $K_{0.33}WO_3$ and $Ba_{0.33}WO_3$. The tungsten oxide-based compound is preferably $Cs_{0.33}WO_3$ or $Rb_{0.33}WO_3$, more preferably $Cs_{0.33}WO_3$.

The tungsten compound is preferably a fine particle. The average particle diameter of the tungsten fine particle is preferably 800 nm or less, more preferably 400 nm or less, still more preferably 200 nm or less. When the average particle diameter is in such a range, the tungsten fine particle can hardly cut visible light by light scattering and therefore, light transparency in the visible light region can be more successfully ensured. From the standpoint of avoiding light scattering, the average particle diameter is preferably smaller, but for reasons of easy handleability or the like at the production, the average particle diameter of the tungsten fine particle is usually 1 nm or more.

The content of the tungsten compound is preferably from 3 to 20 mass %, more preferably from 5 to 10 mass %, based on the entire solid content by mass of the polymerizable composition of the present invention.

Also, two or more kinds of tungsten compounds may be used.

The tungsten compound is available as a commercial product, but when the tungsten compound is a tungsten oxide-based compound, the tungsten oxide-based compound can be obtained by a method of heat-treating a tungsten compound in an inert gas atmosphere or a reducing gas atmosphere (see, Japanese Patent No. 4,096,205).

The tungsten oxide-based compound is also available, for example, as a dispersion of tungsten fine particle, such as YMF-02 produced by Sumitomo Metal Mining Co., Ltd.

[4] Alkali-Soluble Binder

The polymerizable composition of the present invention contains an alkali-soluble binder (alkali-soluble resin). Thanks to this binder, when the film obtained from the polymerizable composition is exposed to form a pattern, the unexposed area can be removed with an alkali developer and an excellent pattern can be formed by alkali development.

The alkali-soluble binder is not particularly limited as long as it is soluble in alkali, and the alkali-soluble binder can be appropriately selected according to the purpose. Examples thereof include a (meth)acrylic resin, a urethane-based resin, a polyvinyl alcohol, a polyvinyl butyral, a polyvinyl formal, a polyamide and a polyester, with a (meth)acrylic resin and a urethane-based resin being preferred.

Above all, from the standpoint that the thermal cycle test resistance (TCT) resistance can be more enhanced, the alkali-soluble binder is more preferably a urethane-based resin.

The alkali-soluble binder preferably has an acid group.

The acid group includes, for example, a carboxylic acid group, a sulfonic acid group, a phosphonic acid group, a phosphoric acid group and a sulfonamide group but is preferably a carboxylic acid group in view of availability of raw materials.

The alkali-soluble binder having an acid group is not particularly limited but is preferably a polymer obtained using an acid group-containing polymerizable compound as a monomer component and in view of adjustment of acid value, more preferably a copolymer obtained by copolymerizing a polymerizable compound having an acid group and a polymerizable compound having no acid group.

The polymerizable compound having an acid group is not particularly limited and may be appropriately selected according to the purpose. Examples of the acid group include an acrylic acid, a methacrylic acid, an itaconic acid, a crotonic acid, an isocrotonic acid, a maleic acid and a p-carboxylstyrene. Among these, an acrylic acid, a methacrylic acid and a p-carboxylstyrene are preferred. One of these compounds may be used alone, or two or more thereof may be used in combination.

The polymerizable compound having no acid group is not particularly limited but suitable examples thereof include a (meth)acrylic acid ester (e.g., alkyl ester, aryl ester, aralkyl ester).

The alkyl group in the alkyl ester moiety of the (meth) acrylic acid ester may be linear or branched and is preferably an alkyl group having a carbon number of 1 to 10, more preferably an alkyl group having a carbon number of 1 to 6.

The aryl group in the aryl ester moiety of the (meth)acrylic acid ester is preferably an aryl group having a carbon number of 6 to 14, more preferably an aryl group having a carbon number of 6 to 10.

The aralkyl group in the aralkyl ester moiety of the (meth) acrylic acid ester is preferably an aralkyl group having a carbon number of 7 to 20, more preferably an aralkyl group having a carbon number of 7 to 12.

The molar ratio between the monomer corresponding to the polymerizable compound having an acid group and the monomer corresponding to the polymerizable compound having no acid group is usually from 1:99 to 99:1, preferably from 30:70 to 99:1, more preferably from 50:50 to 99:1.

The content of the acid group in the alkali-soluble binder is not particularly limited but is preferably from 0.5 to 4.0 meq/g, more preferably from 0.5 to 3.0 meq/g. When this content is 0.5 meq/g or more, sufficient alkali developability is obtained and an excellent pattern can be more successfully obtained, and when the content above is 4.0 meq/g or less, the risk of impairing the strength of the permanent pattern can be unfailingly avoided.

The alkali-soluble binder preferably further has a crosslinking group and thanks to this crosslinking group, both curability of the exposed area and alkali developability of the unexposed area can be enhanced in particular. This is also preferred because a pattern with high durability is obtained (this effect is pronounced particularly when higher durability is required of a solder resist as in the case where a metal wiring covered with a solder resist has a high wiring density). Here, the crosslinking group is a group capable of crosslinking the binder polymer in the course of a polymerization reaction occurring in the photosensitive layer when the photosensitive layer obtained from the polymerizable composition is exposed or heated. The crosslinking group is not particularly limited as long as it is a group having such a function, but examples of the functional group capable of undergoing an addition polymerization reaction include an ethylenically unsaturated bond group, an amino group and an epoxy group. The crosslinking group may be also a functional group capable of becoming a radical upon irradiation with light, and examples thereof include a thiol group and a halogen group. Among these, an ethylenically unsaturated bond group is preferred. The ethylenically unsaturated bond group is preferably a styryl group, a (meth)acryloyl group or an allyl and from the standpoint of satisfying both stability of the crosslinking group before exposure and strength of the permanent pattern, more preferably a (meth)acryloyl group.

In the alkali-soluble binder, for example, a free radical (a polymerization initiating radical or a growing radical in the course of polymerization of the polymerizable compound) is added to the crosslinking functional group to cause addition-polymerization between polymers directly or through a polymerization chain of the polymerizable compound, as a result, crosslinking is formed between polymer molecules to effect curing. Alternatively, an atom (for example, a hydrogen atom on a carbon atom adjacent to the functional crosslinking group) in the polymer is abstracted by a free radical to produce a polymer radical, and polymer radicals combine with each other to form crosslinking between polymer molecules, whereby curing is effected.

The content of the crosslinking group in the alkali-soluble binder is not particularly limited but is preferably from 0.5 to 3.0 meq/g, more preferably from 1.0 to 3.0 meq/g, still more preferably from 1.5 to 2.8 meq/g. When the content is 0.5 meq/g or more, a sufficient amount of curing reaction results and high sensitivity is obtained, and when it is 3.0 meq/g or less, the polymerizable composition can have high storage stability.

Here, the content (meq/g) above can be measured, for example, by iodine number titration.

The alkali-soluble binder having a crosslinking group is described in detail in JP-A-2003-262958, and the compounds described therein can be also used in the present invention.

The alkali-soluble binder having a crosslinking group is preferably an alkali-soluble binder having an acid group and a crosslinking group, and representative examples thereof are described below.

(1) A urethane-modified polymerizable double bond-containing acrylic resin, obtained by a reaction of a compound which has at least one (meth)acryloyl group and in which an isocyanate group and an OH group are previously reacted to leave one unreacted isocyanate group, with an acrylic resin having a carboxyl group.

(2) An unsaturated group-containing acrylic resin obtained by reacting an acrylic resin containing a carboxyl group with a compound having both an epoxy group and a polymerizable double bond in the molecule.

(3) A polymerizable double bond-containing acrylic resin obtained by reacting an acrylic resin containing an OH group with a dibasic acid anhydride having a polymerizable double bond.

Among these, the resins of (1) and (2) are preferred.

Also, examples of the alkali-soluble binder having an acid group and a crosslinking group include a polymer compound having an acidic group and an ethylenically unsaturated bond in the side chain and having a bisphenol A-type structure and a bisphenol F-type structure, a novolak resin having an acidic group and an ethylenically unsaturated bond, and a resol resin. These resins can be obtained by the method described in paragraphs [0008] to [0027] of JP-A-11-240930.

As described above, the alkali-soluble binder is preferably a (meth)acrylic resin or a urethane-based resin. The "(meth) acrylic resin" is preferably a copolymer having, as a polymerization component, a (meth)acrylic acid derivative such as (meth)acrylic acid, (meth)acrylic acid ester (e.g., alkyl ester, aryl ester, aralkyl ester), (meth)acrylamide and (meth)acrylamide derivative. The "urethane-based resin" is preferably a polymer produced by a condensation reaction between a compound having two or more isocyanate groups and a compound having two or more hydroxyl groups.

Suitable examples of the (meth)acrylic resin include a copolymer having a repeating unit containing an acid group. Preferred examples of the acid group include those described above. The repeating unit containing an acid group is preferably a repeating unit derived from a (meth)acrylic acid or a repeating unit represented by the following formula (I):

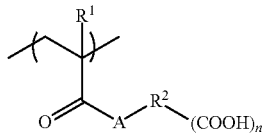

(In formula (I), $R^1$ represents a hydrogen atom or a methyl group, $R^2$ represents a single bond or an (n+1)-valent linking group, A represents an oxygen atom or —$NR^3$—, $R^3$ represents a hydrogen atom or a monovalent hydrocarbon group having a carbon number of 1 to 10, and n represents an integer of 1 to 5.)

In formula (I), the linking group represented by $R^2$ is preferably composed of one or more kinds of atoms selected from the group consisting of a hydrogen atom, a carbon atom, an oxygen atom, a nitrogen atom, a sulfur atom and a halogen atom, and the number of atoms constituting the linking group represented by $R^2$ is preferably from 1 to 80. Specific examples of the linking group include an alkylene group and an arylene group, and the linking group may have a structure where a plurality of such divalent groups are connected by any of an amide bond, an ether bond, a urethane bond, a urea bond and an ester bond. $R^2$ is preferably a single bond, an alkylene group, or a structure where a plurality of alkylene groups are connected by at least any one of an amide bond, an ether bond, a urethane bond, a urea bond and ester bond.

The carbon number of the alkylene group is preferably from 1 to 5, more preferably from 1 to 3.

The carbon number of the arylene group is preferably from 6 to 14, more preferably from 6 to 10.

The alkylene group and arylene group may further have a substituent, and such a substituent includes a monovalent nonmetallic atom group excluding a hydrogen atom. Examples thereof include a halogen atom (—F, —Br, —Cl, —I), a hydroxyl group, a cyano group, an alkoxy group, an aryloxy group, a mercapto group, an alkylthio group, an arylthio group, an alkylcarbonyl group, an arylcarbonyl group, a carboxyl group and its conjugate base group, an alkoxycarbonyl group, an aryloxycarbonyl group, a carbamoyl group, an aryl group, an alkenyl group, and an alkynyl group.

The hydrocarbon group of $R^3$ preferably has a carbon number of 1 to 10, more preferably from 1 to 5, still more preferably from 1 to 3.

$R^3$ is most preferably a hydrogen atom or a methyl group.

n is preferably 1 to 3, more preferably 1 or 2, and most preferably 1.

The ratio (mol %) of the acid group-containing repeating unit occupying in all repeating unit components of the (meth) acrylic resin is, in view of developability, preferably from 10 to 90%, and in consideration of satisfying both developability and strength of the permanent pattern, more preferably from 50 to 85%, still more preferably from 60 to 80%.

As described above, the (meth)acrylic resin preferably further has a crosslinking group, and specific examples and the content of the crosslinking group are the same as those described above.

The (meth)acrylic polymer for use in the present invention may contain, in addition to the polymerization unit having an acid group and the polymerization unit having a crosslinking group, a polymerization unit composed of an alkyl or aralkyl (meth)acrylate, a polymerization unit composed of a (meth) acrylamide or its derivative, a polymerization unit composed of an α-hydroxymethyl acrylate, and a polymerization unit composed of a styrene derivative. The alkyl group in the alkyl(meth)acrylate is preferably an alkyl group having a carbon number of 1 to 5 or an alkyl group having a carbon number of 2 to 8 and having the above-described substituent, more preferably a methyl group. Examples of the alkyl(meth) acrylate include benzyl(meth)acrylate. Examples of the (meth)acrylamide derivative include N-isopropylacrylamide, N-phenylmethacrylamide, N-(4-methoxycarbonylphenyl) methacrylamide, N,N-dimethylacrylamide and morpholinoacrylamide. Examples of the α-hydroxymethyl acrylate include ethyl α-hydroxymethyl acrylate and cyclohexyl α-hydroxymethyl acrylate. Examples of the styrene derivative include styrene and 4-tert-butylstyrene.

The "urethane-based resin" is preferably a urethane-based resin having, as the basic structure, a structural unit represented by a reaction product between at least one diisocyanate compound represented by the following formula (1) and at least one diol compound represented by formula (2).

In formulae (1) and (2), each of X and $L^1$ independently represent a divalent organic residue.

The at least one diol compound represented by formula (2) preferably has an acid group. Thanks to this configuration, an alkali-soluble urethane-based resin having introduced thereinto an acid group can be suitably produced as a reaction product of the diisocyanate compound and the diol compound. According to such a method, an alkali-soluble urethane-based resin can be more easily produced than in the case of substituting and introducing an acid group in the desired side chain after the reaction and production of a urethane-based resin.

Out of at least one compound of the diisocyanate compound represented by formula (1) and the diol compound represented by formula (2), at least one kind of a compound preferably has a crosslinking group. Examples of the crosslinking group include those described above. Thanks to this configuration, a crosslinking group is introduced as a reaction product of the diisocyanate compound and the diol compound, and an alkali-soluble urethane-based resin can be suitably produced. According to such a method, a crosslinking group-containing urethane-based resin can be more easily produced than in the case of substituting and introducing a crosslinking group in the desired side chain after the reaction and production of a urethane-based resin.

(1) Diisocyanate Compound

In formula (1), X is preferably a divalent aliphatic group, an aromatic hydrocarbon group, or a combination thereof, and the carbon number is preferably from 1 to 20, more preferably from 1 to 15. The divalent aliphatic or aromatic hydrocarbon group may further has a substituent incapable of reacting with an isocyanate group.

Specific examples of the diisocyanate compound represented by formula (1) include the followings:

an aromatic diisocyanate compound such as 2,4-tolylene diisocyanate, dimerized 2,4-tolylene diisocyanate, 2,6-tolylene diisocyanate, p-xylylene diisocyanate, m-xylylene diisocyanate, 4,4'-diphenylmethane diisocyanate, 1,5-naphthylene diisocyanate and 3,3'-dimethylbiphenyl-4,4'-diisocyanate; an aliphatic diisocyanate compound such as hexamethylene diisocyanate, trimethylhexamethylene diisocyanate, lysine diisocyanate and dimer acid diisocyanate; an alicyclic diisocyanate compound such as isophorone diisocyanate, 4,4'-methylenebis(cyclohexylisocyanate), methylcyclohexane-2,4(or 2,6)-diisocyanate and 1,3-(isocyanatomethyl)cyclohexane; and a diisocyanate compound which are a reaction product of a diol with a diisocyanate, such as adduct of 1 mol of 1,3-butylene glycol and 2 mol of tolylene diisocyanate.

In the case where the diisocyanate compound represented by formula (1) has a crosslinking group, examples of such a diisocyanate compound include a product obtained by addition-reacting a triisocyanate compound and 1 equivalent of a monofunctional alcohol or monofunctional amine compound having a crosslinking group (for example, an ethylenically unsaturated bond group). Specific examples of the triisocyanate compound and the monofunctional alcohol or monofunctional amine compound having a crosslinking group include, but are not limited to, those described in paragraphs [0034], [0035] and [0037] to [0040] of Japanese Patent No. 4,401,262.

Specific examples of the diisocyanate compound having a crosslinking group include, but are not limited to, those described in paragraphs [0042] to [0049] of Japanese Patent No. 4,401,262.

(2) Diol Compound

Examples of the diol compound represented by formula (2) widely include a polyether diol compound, a polyester diol compound and a polycarbonate diol compound. The polyether diol compound includes compounds represented by the following formulae (3), (4), (5), (6) and (7), and an ethylene oxide-propylene oxide random copolymer having a hydroxyl group in the terminal.

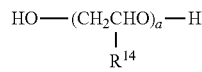  (3)

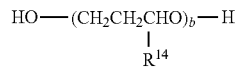  (4)

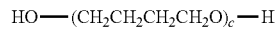  (5)

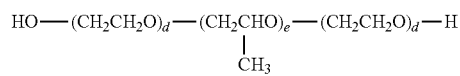  (6)

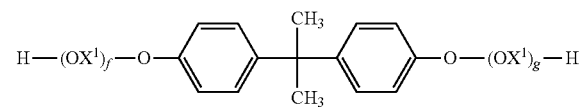  (7)

In formulae (3) to (7), $R^{14}$ represents a hydrogen atom or a methyl group, and $X^1$ represents a group shown below. Each of a, b, c, d, e, f and g represents an integer of 2 or more and is preferably an integer of 2 to 100. Two d's may be the same or different. Also, two $X^1$'s may be the same or different.

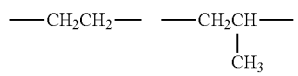

Specific examples of the polyether diol compounds represented by formulae (3) and (4) include the followings: that is, diethylene glycol, triethylene glycol, tetraethylene glycol, pentaethylene glycol, hexaethylene glycol, heptaethylene glycol, octaethylene glycol, di-1,2-propylene glycol, tri-1,2-propylene glycol, tetra-1,2-propylene glycol, hexa-1,2-propylene glycol, di-1,3-propylene glycol, tri-1,3-propylene glycol, tetra-1,3-propylene glycol, di-1,3-butylene glycol, tri-1,3-butylene glycol, hexa-1,3-butylene glycol, polyethylene glycol having a weight average molecular weight of 1,000, polyethylene glycol having a weight average molecular weight of 1,500, polyethylene glycol having a weight average molecular weight of 2,000, polyethylene glycol having a weight average molecular weight of 3,000, polyethylene glycol having a weight average molecular weight of 7,500, polypropylene glycol having a weight average molecular weight of 400, polypropylene glycol having a weight average molecular weight of 700, polypropylene glycol having a weight average molecular weight of 1,000, polypropylene glycol having a weight average molecular weight of 2,000, polypropylene glycol having a weight average molecular weight of 3,000, and polypropylene glycol having a weight average molecular weight of 4,000.

Specific examples of the polyether diol compound represented by formula (5) include the followings: that is, PTMG650, PTMG1000, PTMG2000 and PTMG3000 (trade names), all produced by Sanyo Chemical Industries, Ltd.

Specific examples of the polyether diol compound represented by formula (6) include the followings: that is, NEWPOL PE-61, NEWPOL PE-62, NEWPOL PE-64, NEWPOL PE-68, NEWPOL PE-71, NEWPOL PE-74, NEWPOL PE-75, NEWPOL PE-78, NEWPOL PE-108, NEWPOL PE-128 and NEWPOL PE-61 (trade names), all produced by Sanyo Chemical Ind., Ltd.

Specific examples of the polyether diol compound represented by formula (7) include the followings: that is, NEWPOL BPE-20, NEWPOL BPE-20F, NEWPOL BPE-20NK, NEWPOL BPE-20T, NEWPOL BPE-20G, NEWPOL BPE-40, NEWPOL BPE-60, NEWPOL BPE-100, NEWPOL BPE-180, NEWPOL BPE-2P, NEWPOL BPE-23P, NEWPOL BPE-3P and NEWPOL BPE-5P (trade names), all produced by Sanyo Chemical Ind., Ltd.

Specific examples of the ethylene oxide-propylene oxide random copolymer having a hydroxyl group in the terminal include the followings:

that is, NEWPOL 50HB-100, NEWPOL 50HB-260, NEWPOL 50HB-400, NEWPOL 50HB-660, NEWPOL 50HB-2000 and NEWPOL 50HB-5100 (trade names), all produced by Sanyo Chemical Ind., Ltd.).

The polyester diol compound includes compounds represented by formulae (8) and (9):

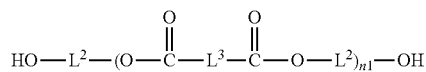  (8)

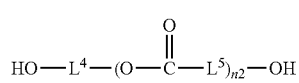  (9)

In formulae (8) and (9), each of $L^2$, $L^3$ and $L^4$ represents a divalent aliphatic or aromatic hydrocarbon group, and $L^5$ represents a divalent aliphatic hydrocarbon group. $L^2$, $L^3$ and $L^5$ may be the same as or different from each other. Preferably, each of $L^2$ to $L^4$ represents an alkylene group, an alkenylene group, an alkynylene group or an arylene group, and $L^5$ preferably represents an alkylene group. In $L^2$ to $L^5$, another bond or functional group incapable of reacting with an isocyanate group, such as ether bond, carbonyl bond, ester bond, cyano group, olefin bond, urethane bond, amide group, ureido group and halogen atom, may be present. Each of n1 and n2 represents an integer of 2 or more, preferably an integer of 2 to 100.

The polycarbonate diol compound includes a compound represented by formula (10):

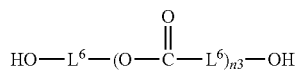

(10)

In formula (10), $L^6$'s may be the same as or different from each other and each represents a divalent aliphatic or aromatic hydrocarbon group. $L^6$ preferably represents an alkylene group, an alkenylene group, an alkynylene group or an arylene group. In $L^6$, another bond or functional group incapable of reacting with an isocyanate group, such as ether bond, carbonyl group, ester bond, cyano group, olefin bond, urethane bond, amide bond, ureido group and halogen atom, may be present. n3 represents an integer of 2 or more, preferably an integer of 2 to 100.

Specific examples of the diol compounds represented by formulae (8), (9) and (10) are illustrated below (Compound Nos. 1 to 18). In specific examples, n represents an integer of 2 or more.

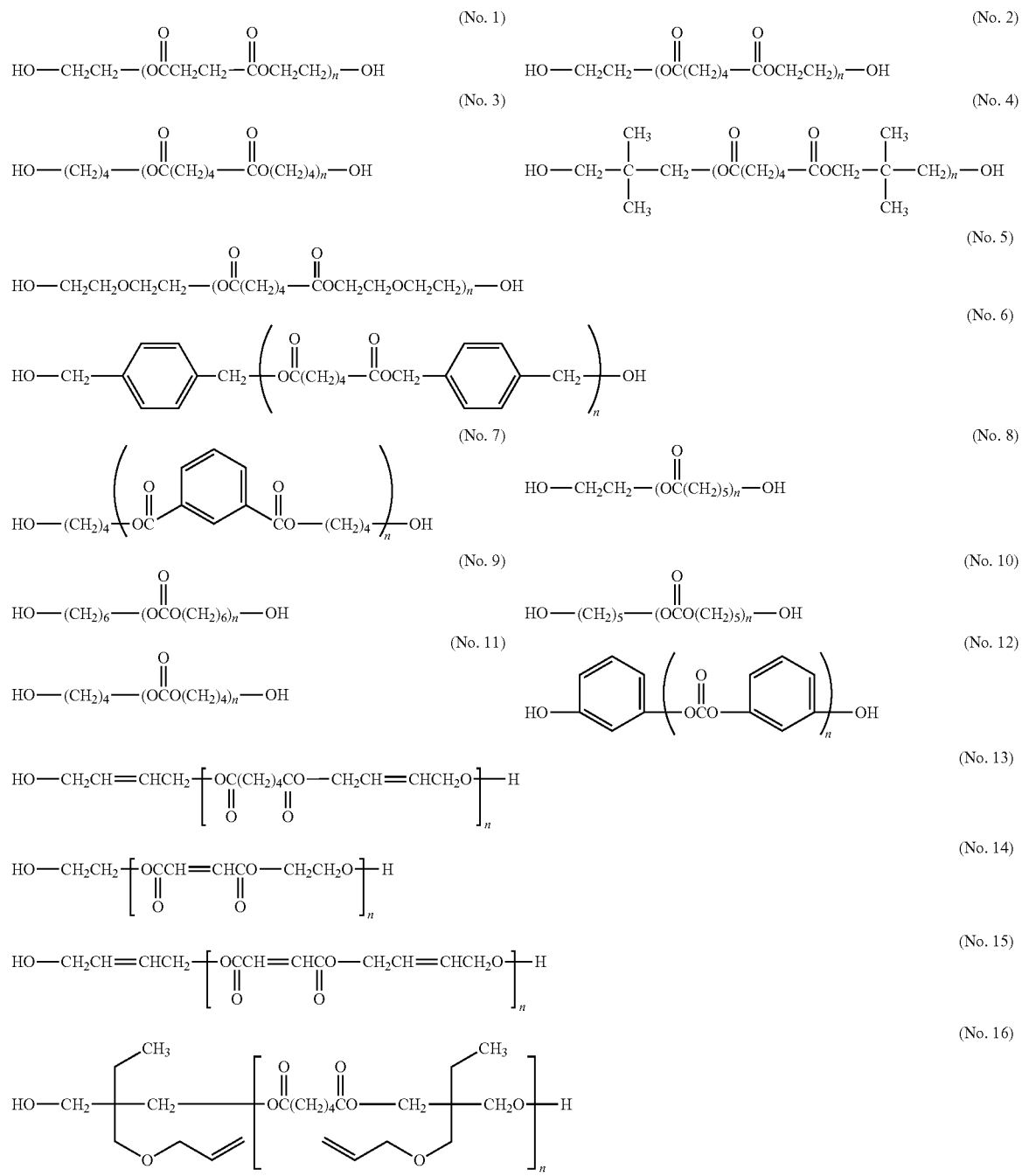

(No. 17)

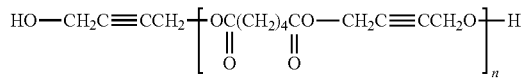

(No. 18)

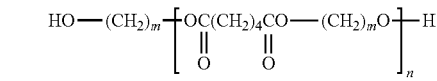

m = 2, 4

For the synthesis of the urethane-based resin, in addition to the diol compound above, a diol compound having a substituent incapable of reacting with an isocyanate group may be also used in combination. Such a diol compound includes, for example, the followings:

$$\text{HO-L}^7\text{-O—CO-L}^8\text{-CO—O-L}^7\text{-OH} \tag{11}$$

$$\text{HO-L}^8\text{-CO—O-L}^7\text{-OH} \tag{12}$$

In formulae (11) and (12), $L^7$ and $L^8$ may be the same as or different from each other and each represents a divalent aliphatic hydrocarbon group, an aromatic hydrocarbon group or a heterocyclic group. In $L^7$ and $L^8$, another bond or functional group incapable of reacting with an isocyanate group, such as carbonyl bond, ester bond, urethane bond, amide bond and ureido group, may be present, if desired. Incidentally, $L^7$ and $L^8$ may form a ring.

The divalent aliphatic hydrocarbon group, aromatic hydrocarbon group and heterocyclic group may have a substituent, and examples of the substituent include an alkyl group, an aralkyl group, an aryl group, an alkoxy group, an aryloxy group, and a halogen atom such as —F, —Cl, —Br and —I.

At least one kind of a diol compound is preferably a diol compound having an acid group, as the above-described diol compound having a substituent incapable of reacting with an isocyanate group. Specific examples of the acid group include those described above, but the acid group is preferably a carboxylic acid group. The diol compound having a carboxylic acid group includes, for example, compounds represented by the following formulae (13) to (15):

 (13)

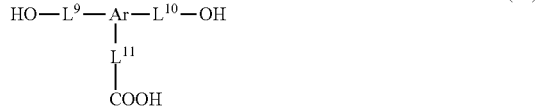 (14)

 (15)

In formulae (13) to (15), $R^{15}$ represents a hydrogen atom, an alkyl group, an aralkyl group, an aryl group, an alkoxy group or an aryloxy group, preferably a hydrogen atom, an alkyl group having a carbon number of 1 to 8, or an aryl group having a carbon number of 6 to 15.

The alkyl group, aralkyl group, aryl group, alkoxy group and aryloxy group may have a substituent, and examples of the substituent include a cyano group, a nitro group, a halogen atom such as —F, —Cl, —Br and —I, —CONH$_2$, —COOR$^{16}$, —OR$^{16}$, —NHCONHR$^{16}$, —NHCOOR$^{16}$, —NHCOR$^{16}$, and —OCONHR$^{16}$ (wherein R$^{16}$ represents an alkyl group having a carbon number of 1 to 10 or an aralkyl group having a carbon number of 7 to 15).

$L^9$, $L^{10}$, and $L^{11}$ may be the same as or different from each other and each represents a single bond or a divalent aliphatic or aromatic hydrocarbon group, preferably an alkylene group having a carbon number of 1 to 20 or an arylene group having a carbon number of 6 to 15, more preferably an alkylene group having a carbon number of 1 to 8.

The divalent aliphatic or aromatic hydrocarbon group may have a substituent, and examples of the substituent include an alkyl group, an aralkyl group, an aryl group, an alkoxy group and a halogen atom. If desired, $L^9$ to $L^{11}$ may have another functional group incapable of reacting with an isocyanate group, for example, a group containing carbonyl, ester, urethane, amide, ureido or ether group. Two or three members out of $R^{15}$, $L^7$, $L^8$ and $L^9$ may form a ring.

Ar represents a trivalent aromatic hydrocarbon group which may have a substituent, and preferably represents an aromatic group having a carbon number of 6 to 15.

Specific examples of the carboxyl group-containing diol compounds represented by formulae (13) to (15) include the followings:

that is, 3,5-dihydroxybenzoic acid, 2,2-bis(hydroxymethyl)propionic acid, 2,2-bis(2-hydroxyethyl)propionic acid, 2,2-bis(3-hydroxypropyl)propionic acid, bis(hydroxymethyl)acetic acid, bis(4-hydroxyphenyl)acetic acid, 2,2-bis(hydroxymethyl)butyric acid, 4,4-bis(4-hydroxyphenyl)pentanoic acid, tartaric acid, N,N-dihydroxyethylglycine, and N,N-bis(2-hydroxyethyl)-3-carboxy-propionamide.

Thanks to the presence of such a carboxyl group, properties such as hydrogen bonding property and alkali solubility can be imparted to the polyurethane resin and this is preferred.

The binder polymer for use in the present invention is preferably a polyurethane resin having a carboxyl group in an amount of 0.5 to 4.0 meq/g, more preferably from 1.0 to 3.0 meq/g.

In the case where the diol compound represented by formula (2) has a crosslinking group, a method using an unsaturated group-containing diol compound as a raw material in the production of a polyurethane resin is also suitable. Such a diol compound may be a commercially available product such as trimethylolpropane monoallyl ether or may be a compound easily produced by the reaction of a halogenated diol compound, a triol compound or an aminodiol compound with an unsaturated group-containing carboxylic acid, acid chloride, isocyanate, alcohol, amine, thiol or alkyl halide compound. Specific examples of the diol compound having a crosslinking group include, but are not limited to, compounds described in paragraphs [0057] to [0066] of Japanese Patent No. 4,401,262.

Compounds illustrated above as Compound Nos. 13 to 17 come under the diol compound represented by formula (8), (9) or (10) and are a diol compound having a crosslinking group.

In particular, the binder polymer for use in the present invention is preferably a polyurethane resin having a crosslinking group (preferably an ethylenically unsaturated bond group) in an amount of 0.5 meq/g or more, more preferably from 1.0 to 3.0 meq/g.

For the synthesis of the urethane-based resin, in addition to these diols, a compound obtained by ring-opening a tetracarboxylic acid dianhydride represented by any of the following formulae (16) to (18) with a diol compound may be also used in combination.

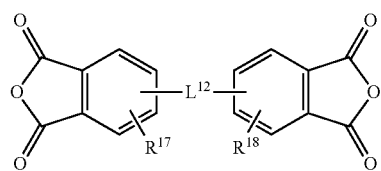

(16)

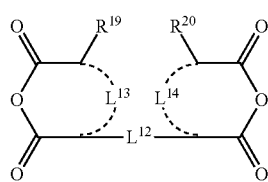

(17)

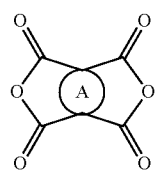

(18)

In the formulae (16) to (18), $L^{12}$ represents a single bond, a divalent aliphatic or aromatic hydrocarbon group which may have a substituent (preferably, for example, an alkyl group, an aralkyl group, an aryl group, an alkoxy group, a halogeno group, an ester group or an amido group), —CO—, —SO—, —SO$_2$—, —O— or —S—, and preferably represents a single bond, a divalent aliphatic hydrocarbon group having a carbon number of 1 to 15, —CO—, —SO$_2$—, —O— or —S—.

The divalent aliphatic or aromatic hydrocarbon group may have a substituent, and examples of the substituent include an alkyl group, an aralkyl group, an aryl group, an alkoxy group, a halogen atom, an ester bond-containing group (e.g., alkylcarbonyloxy group, alkyloxycarbonyl group, arylcarbonyloxy group, aryloxycarbonyl group), and an amido group.

$R^{17}$ and $R^{18}$ may be the same as or different from each other and each represents a hydrogen atom, an alkyl group, an aralkyl group, an aryl group, an alkoxy group or a halogeno group, preferably a hydrogen atom, an alkyl group having a carbon number of 1 to 8, an aryl group having a carbon number of 6 to 15, an alkoxy group having a carbon number of 1 to 8 or a halogeno group.

Two members out of $L^{12}$, $R^{17}$ and $R^{18}$ may combine to form a ring.

$R^{19}$ and $R^{20}$ may be the same as or different from each other and each represents a hydrogen atom, an alkyl group, an aralkyl group, an aryl group or a halogeno group, preferably a hydrogen atom, an alkyl group having a carbon number of 1 to 8 or an aryl group having a carbon number of 6 to 15.

Two members out of $L^{12}$, $R^{19}$ and $R^{20}$ may combine to form a ring.

$L^{13}$ and $L^{14}$ may be the same as or different from each other and each represents a single bond, a double bond or a divalent aliphatic hydrocarbon group, preferably a single bond, a double bond or a methylene group. A represents a mononuclear or polynuclear aromatic ring, preferably an aromatic ring having a carbon number of 6 to 18.

The compounds represented by formulae (16), (17) and (18) specifically include the followings: that is, an aromatic tetracarboxylic dianhydride such as pyromellitic dianhydride, 3,3',4,4'-benzophenonetetracarboxylic dianhydride, 3,3',4,4'-diphenyltetracarboxylic dianhydride, 2,3,6,7-naphthalenetetracarboxylic dianhydride, 1,4,5,8-naphthalenetetracarboxylic dianhydride, 4,4'-sulfonyldiphthalic dianhydride, 2,2-bis(3,4-dicarboxyphenyl)propane dianhydride, bis(3,4-dicarboxyphenyl)ether dianhydride, 4,4'-[3,3'-(alkylphosphoryldiphenylene)-bis(iminocarbonyl)] diphthalic dianhydride, adduct of hydroquinone diacetate and trimellitic anhydride, and adduct of diacetyldiamine and trimellitic anhydride; an alicyclic tetracarboxylic dianhydride such as 5-(2,5-dioxotetrahydrofuryl)-3-methyl-3-cyclohexene-1,2-dicarboxylic anhydride (EPICLON B-4400, produced by Dainippon Ink and Chemicals, Inc.), 1,2,3,4-cyclopentanetetracarboxylic dianhydride, 1,2,4,5-cyclohexanetetracarboxylic dianhydride and tetrahydrofurantetracarboxylic dianhydride; and an aliphatic tetracarboxylic dianhydride such as 1,2,3,4-butanetetracarboxylic dianhydride and 1,2,4,5-pentanetetracarboxylic dianhydride.

Examples of the method for introducing a compound obtained by ring-opening such a tetracarboxylic dianhydride by a diol compound, into the polyurethane resin include the following methods:

a) a method of reacting a diisocyanate compound with an alcohol-terminated compound obtained by ring-opening the tetracarboxylic dianhydride by a diol compound, and b) a method of reacting the tetracarboxylic dianhydride with an alcohol-terminated urethane compound obtained by reacting a diisocyanate compound under diol compound-excess conditions.

Specific examples of the diol compound used for the ring-opening reaction include the followings:

that is, ethylene glycol, diethylene glycol, triethylene glycol, tetraethylene glycol, propylene glycol, dipropylene glycol, polyethylene glycol, polypropylene glycol, neopentyl glycol, 1,3-butylene glycol, 1,6-hexanediol, 2-butene-1,4-diol, 2,2,4-trimethyl-1,3-pentanediol, 1,4-bis-β-hydroxyethoxycyclohexane, cyclohexanedimethanol, tricyclodecanedimethanol, hydrogenated bisphenol A, hydrogenated bisphenol F, an ethylene oxide adduct of bisphenol A, a propylene oxide adduct of bisphenol A, an ethylene oxide adduct of bisphenol F, a propylene oxide adduct of bisphenol F, an ethylene oxide adduct of hydrogenated bisphenol A, a propylene oxide adduct of hydrogenated bisphenol A, hydroquinone dihydroxyethyl ether, p-xylylene glycol, dihydroxyethylsulfone, bis(2-hydroxyethyl)-2,4-tolylene dicarbamate, 2,4-tolylene-bis(2-hydroxyethylcarbamide), bis(2-hydroxyethyl)-m-xylylene dicarbamate, and bis(2-hydroxyethyl) isophthalate.

The urethane-based resin described above is synthesized by adding the diisocyanate compound and the diol compound together with a known catalyst having an activity according to the reactivity of respective compounds, in an aprotic solvent and heating the solution. The molar ratio ($M_a$:$M_b$) between the diisocyanate compound and the diol compound used for the synthesis is preferably from 1:1 to 1.2:1. It is preferred that a reaction product having desired physical properties such as molecular weight and viscosity is treated with alcohols or amines and finally synthesized in the form of containing no residual isocyanate group.

A urethane-based resin having a crosslinking group (for example, an unsaturated group) in the terminal or main chain of the polymer is also suitably used. By having a crosslinking group in the terminal or main chain of the polymer, the crosslinking reactivity between the polymerizable compound or between urethane-based resins is enhanced, and the strength of the permanent pattern is increased. The unsaturated group used here preferably has a carbon-carbon double bond because a crosslinking reaction readily occurs.

The method for introducing a crosslinking group into the polymer terminal include the following method. That is, the introduction may be attained by using crosslinking group-containing alcohols, amines or the like in the step of treating the residual isocyanate group in the polymer terminal with alcohols, amines or the like in the above-described process for the synthesis of a polyurethane resin. Specific examples of these compounds include the compounds described above as the crosslinking group-containing monofunctional alcohol or monofunctional amine compound.

The crosslinking group is easy to control its introduction amount and from the standpoint that the introduction amount can be increased or the crosslinking reaction efficiency is enhanced, the crosslinking group is more preferably introduced into the polymer side chain than into the polymer terminal.

The method for introducing a crosslinking group into the main chain includes a method where a diol compound having an unsaturated group in the main chain direction is used for the synthesis of the polyurethane resin. Specific examples of the diol compound having an unsaturated group in the main chain direction include the following compounds: that is, cis-2-butene-1,4-diol, trans-2-butene-1,4-diol and polybutadiene diol.

As the alkali-soluble binder other than the (meth)acrylic resin and urethane-based resin, acetal-modified polyvinyl alcohol-based binder polymers having an acid group described, for example, in European Patent Nos. 993,966 and 1,204,000 and JP-A-2001-318463 are preferred because of excellence balance between film strength and developability. In addition, polyvinylpyrrolidone, polyethylene oxide and the like are useful as the water-soluble linear organic polymer. Furthermore, for increasing the strength of the cured film, alcohol-soluble nylon, a polyether of 2,2-bis-(4-hydroxyphenyl)-propane and epichlorohydrin, and the like are also useful.

Among these, a [benzyl(meth)acrylate/(meth)acrylic acid/other addition-polymerizable vinyl monomers, if desired] copolymer and an [allyl(meth)acrylate/(meth)acrylic acid/other addition-polymerizable vinyl monomers, if desired] copolymer are particularly preferred in view of excellent balance among film strength, sensitivity and developability.

The weight average molecular weight of the binder polymer which can be used in polymerizable composition of the present invention is preferably 3,000 or more, more preferably from 5,000 to 300,000, and most preferably from 10,000 to 30,000, and the number average molecular weight is preferably 1,000 or more, more preferably from 2,000 to 250,000. The polydispersity (weight average molecular weight/number average molecular weight) is preferably 1 or more, more preferably from 1.1 to 10.

The alkali-soluble binder polymer may be any of a random polymer, a block polymer, a graft polymer and the like.

The alkali-soluble binder can be synthesized by a conventionally known method. Examples of the solvent used at the synthesis include tetrahydrofuran, ethylene dichloride, cyclohexanone, propylene glycol monomethyl ether, propylene glycol monomethyl ether acetate and butyl acetate. One of these solvents is used alone, or a mixture of two or more thereof is used.

One kind of an alkali-soluble binder may be used alone, or two or more kinds of alkali-soluble binders may be used in combination.

The content of the alkali-soluble binder is preferably from 5 to 80 mass %, more preferably from 30 to 60 mass %, based on the entire solid content by mass of the polymerizable composition of the present invention. When the content is in this range, the exposure sensitivity is good, the processing time can be short, and good TCT resistance is obtained.

[5] Infrared-Shielding Material Other than Tungsten Compound

The polymerizable composition of the present invention may contain an infrared-shielding material other than the tungsten compound (hereinafter, sometimes referred to as "another infrared-shielding material") within the range not impairing the effects of the present invention. The another infrared-shielding material is preferably a compound having absorption in the range of 800 to 1,200 nm and exhibiting good transparency to light used for exposure. From such a standpoint, the another infrared-shielding material is preferably selected from an infrared absorbing dye and an infrared absorbing inorganic pigment.

Examples of the infrared absorbing dye include a cyanine dye, a phthalocyanine dye, a naphthalocyanine dye, an immonium dye, an aminium dye, a quinolium dye, a pyrylium dye, and a metal complex dye such as Ni complex dye.

The dye usable as the infrared-shielding material is also available as a commercial product, and preferred examples thereof include the following commercially available dyes:

S0345, S0389, S0450, S0253, S0322, S0585, S0402, S0337, S0391, S0094, S0325, S0260, S0229, S0447, S0378, S0306 and 50484, all produced by FEW Chemicals;

ADS795WS, ADS805WS, ADS819WS, ADS820WS, ADS823WS, ADS830WS, ADS850WS, ADS845MC, ADS870MC, ADS880MC, ADS890MC, ADS920MC, ADS990MC, ADS805PI, ADSW805PP, ADS81000, ADS813MT, ADS815EI, ADS816EI, ADS818HT, ADS819MT, ADS819MT, ADS821NH, ADS822MT, ADS838MT, ADS840MT, ADS905AM, ADS956BP, ADS1040P, ADS1040T, ADS1045P, ADS1050P, ADS1065A, ADS1065P, ADS1100T and ADS1120F, all by American Dye Source, Inc.;

YKR-4010, YKR-3030, YKR-3070, MIR-327, MIR-371, SIR-159, PA-1005, MIR-369, MIR-379, SIR-128, PA-1006, YKR-2080, MIR-370, YKR-3040, YKR-3081, SIR-130, MIR-362, YKR-3080, SIR-132 and PA-1001, all produced by Yamamoto Chemical Industry Co., Ltd.; and NK-123, NK-124, NK-1144, NK-2204, NK-2268, NK-3027, NKX-113, NKX-1199, NK-2674, NK-3508, NKX-114, NK-2545, NK-3555, NK-3509 and NK-3519, all produced by Hayashibara Biochemical Labs, Inc.

Among these dyes, in view of heat resistance, a phthalocyanine dye and a metal complex dye are preferred.

One of these dyes may be used alone, or for the purpose of bringing out good light-blocking effect at 800 to 1,200 nm, two or more dyes selected from these dyes according to the purpose may be mixed and used.

Examples of the infrared absorbing inorganic pigment usable as the another infrared-blocking material include zinc flower, lead white, lithopone, titanium oxide, chromium oxide, iron oxide, precipitating barium sulfate, barite powder, red lead, iron oxide red, lead yellow, zinc yellow (zinc yellow class 1, zinc yellow class 2), ultramarine blue, Prussia blue (iron/potassium ferrocyanide), zircon grey, praseodymium yellow, chrome-titanium yellow, chrome green, peacock, Victoria green, dark blue (irrelevant to Prussia blue), vanadium-zirconium blue, chrome-tin pink, manganese pink, and salmon pink. Furthermore, examples of the black pigment which can be used include a metal oxide, a metal nitride, or a mixture thereof, containing one metal element or two or more metal elements selected from the group consisting of Co, Cr, Cu, Mn, Ru, Fe, Ni, Sn, Ti and Ag.

The black pigment is preferably titanium black which is a black pigment containing titanium nitride, because of its good shielding property in the infrared region at a wavelength of 800 to 1,200 nm.

The titanium black can be obtained by a known method. Also, as the commercially available product, titanium black produced by, for example, Ishihara Sangyo Kaisha, Ltd., Ako Kasei Co., Ltd., JEMCO Inc., Mitsubishi Materials Corp., and Mitsubishi Materials Electronic Chemicals Co., Ltd. may be used.

The titanium black indicates a black particle having titanium atom and is preferably low-order titanium oxide or titanium oxynitride or the like. As the titanium black particle, a particle whose surface is modified for the purposes of, for example, enhancing the dispersibility or inhibiting aggregation may be used, if desired.

The surface modification method includes a method of covering the surface with one or more oxides selected from silicon oxide, titanium oxide, germanium oxide, aluminum oxide, magnesium oxide and zirconium oxide. Also, the surface may be treated with a water-repellent substance such as those described in paragraphs [0010] to [0027] of JP-A-2007-302836.

Examples of the method for producing titanium black include, but are not limited to, a method of heating and reducing a mixture of titanium dioxide and metal titanium in a reductive atmosphere (see, JP-A-49-5432), a method of reducing ultrafine titanium dioxide obtained by high-temperature hydrolysis of titanium tetrachloride, in a reductive atmosphere containing hydrogen (see, JP-A-57-205322), a method of reducing titanium dioxide or titanium hydroxide at high temperature in the presence of ammonia (see, JP-A-60-65069 and JP-A-61-201610), and a method of attaching a vanadium compound to titanium dioxide or titanium hydroxide and reducing it at high temperature in the presence of ammonia (see, JP-A-61-201610).

The particle diameter of the titanium black particle is not particularly limited but in view of dispersibility and colorability, is preferably from 3 to 2,000 nm, more preferably from 10 to 500 nm.

The specific surface area of titanium black is not particularly limited but in order to obtain a predetermined water-repellent performance after the surface treatment of titanium black with a water repelling agent, the value measured by the BET method is usually on the order of 5 to 150 $m^2/g$, preferably on the order of 20 to 100 $m^2/g$.

The particle diameter of the inorganic pigment used as the another infrared-shielding material is, in terms of the average particle diameter, preferably from 3 nm to 0.01 mm, and in view of dispersibility, light-blocking effect and precipitation with aging, the average particle diameter is preferably from 10 nm to 1 µm.

The polymerizable composition may or may not contain the another infrared-shielding material, but in the case of containing the another infrared-shielding material, the content thereof is preferably from 5 to 75 mass %, more preferably from 10 to 40 mass %, based on the mass of the tungsten compound.

[6] Dispersant

In the present invention, particularly when the tungsten compound is a tungsten fine particle, the fine particles may be dispersed using a known dispersant for the purpose of enhancing dispersibility and dispersion stability of the tungsten compound in the polymerizable composition.

The dispersant which can be used in the present invention includes a polymer dispersant (for example, polyamidoamine and salts thereof, polycarboxylic acid and salts thereof, a high-molecular-weight unsaturated acid ester, a modified polyurethane, a modified polyester, a modified poly(meth) acrylate, a (meth)acrylic copolymer, and a naphthalene-sulfonic acid-formalin condensate), and a surfactant such as polyoxyethylene alkyl phosphate ester, polyoxyethylene alkylamine and alkanolamine.

The polymer dispersants can be further classified into a linear polymer, a terminal-modified polymer, a graft polymer, and a block polymer according to their structure.

Examples of the terminal-modified polymer having an anchor moiety to the surface include polymers having a phosphoric acid group at the terminal described in JP-A-3-112992 and JP-T-2003-533455, polymers having a sulfonic acid group at the terminal described in JP-A-2002-273191, polymers having an organic dye partial structure or a heterocyclic ring described in JP-A-9-77994, and polymers produced by modifying an oligomer or polymer having a hydroxyl group or an amino group at one terminal, with an acid anhydride described in JP-A-2008-29901. A polymer in which two or more anchor moieties (e.g., acid group, basic group, organic dye partial structure, heterocyclic ring) to the infrared-shielding material surface are introduced into the polymer terminal, described in JP-A-2007-277514, is excellent in the dispersion stability and is also preferred.

Examples of the graft polymer having an anchor moiety to the surface include reaction products of a poly(lower alkylene imine) and a polyester described in JP-A-54-37082, JP-T-8-507960 and JP-A-2009-258668, reaction products of a polyallylamine and a polyester described in JP-A-9-169821, amphoteric dispersant resins having a basic group and an acidic group described in JP-A-2009-203462, copolymers of a macromonomer and a nitrogen atom-containing monomer described in JP-A-10-339949 and JP-A-2004-37986, graft polymers having an organic dye partial structure or a heterocyclic ring described in JP-A-2003-238837, JP-A-2008-9426 and JP-A-2008-81732, and copolymers of a macromonomer and an acid group-containing monomer described in JP-A-2010-106268.

As for the macromonomer used when producing a graft polymer having an anchor moiety to the surface by radical polymerization, a known macromonomer may be used, and examples thereof include MACROMONOMER AA-6 (a polymethyl methacrylate with the terminal group being a methacryloyl group), AS-6 (a polystyrene with the terminal group being a methacryloyl group), AN-6S (a copolymer of an acrylonitrile and a styrene with the terminal group being a methacryloyl group) and AB-6 (a polybutyl acrylate with the terminal group being a methacryloyl group), all produced by Toagosei Ltd.; PLACCEL FM5 (a 5 molar equivalent adduct of ε-caprolactone with 2-hydroxyethyl methacrylate) and FA10L (a 10 molar equivalent adduct of ε-caprolactone with 2-hydroxyethyl acrylate), both produced by Daicel Chemical Industries, Ltd.; and a polyester-based macromonomer described in JP-A-2-272009. Among these, a polyester-based macromonomer is flexible and excellent in solvent affinity and is preferred in view of dispersibility and dispersion stability of the infrared-shielding material in the polymerizable composition as well as developability of the polymerizable composition using the infrared-shielding material, and a polyester-based macromonomer represented by the polyester-based macromonomer described in JP-A-2-272009 is most preferred.

As for the block polymer having an anchor moiety to the surface, block polymers described, for example, in JP-A-2003-49110 and JP-A-2009-52010 are preferred.

The dispersant which can be used may be appropriately selected, for example, from known dispersants and surfactants.

Specific examples thereof include "Disperbyk-101 (polyamidoamine phosphate), 107 (carboxylic acid ester), 110 (copolymer containing acid group), 130 (polyamide), 161, 162, 163, 164, 165, 166, 170 (high-molecular-weight copolymer)", and "BYK-P104, P105 (high-molecular-weight unsaturated polycarboxylic acid)", all produced by Byk-Chemie; "EFKA 4047, 4050-4010-4165 (polyurethane-based), EFKA 4330-4340 (block copolymer), 4400-4402 (modified polyacrylate), 5010 (polyester amide), 5765 (high-molecular-weight polycarboxylate), 6220 (fatty acid polyester), and 6745 (phthalocyanine derivative)", all produced by EFKA; "Ajispur PB821, PB822, PB880, and PB881" produced by Ajinomoto Fine Techno Co., Inc.; "Flowlen TG-710 (urethane oligomer)" and "Polyflow No. 50E, and No. 300 (acrylic copolymer)", all produced by Kyoeisha Chemical Co., Ltd.; "Disperon KS-860, 873SN, 874, #2150 (aliphatic polyvalent carboxylic acid), #7004 (polyetherester), DA-703-50, DA-705, and DA-725" produced by Kusumoto Chemicals Ltd.; "Demol RN, N (naphthalenesulfonic acid-formalin polycondensate), MS, C, SN-B (aromatic sulfonic acid-formalin polycondensate)", "Homogenol L-18 (high-molecular-weight polycarboxylic acid)", "Emulgen 920, 930, 935, 985 (polyoxyethylene nonylphenyl ether)", and "Acetamine 86 (stearylamine acetate), all produced by Kao Corporation; "Solsperse 5000 (phthalocyanine derivative), 13240 (polyester amine), 3000, 17000, 27000 (polymer having a functional moiety in the end part), 24000, 28000, 32000, 38500 (graft polymer)", all produce by Lubrizol Japan Ltd.; "Nikkol T106 (polyoxyethylene sorbitan monooleate), MYS-IEX (polyoxyethylene monostearate)", both produced by Nikko Chemicals Co., Ltd.; Hinoact T-8000E, produced by Kawaken Fine Chemicals Co., Ltd.; Organosiloxane Polymer KP341, produced by Shin-Etsu Chemical Co., Ltd.; "W001, cationic surfactant", a nonionic surfactant such as polyoxyethylene lauryl ether, polyoxyethylene stearyl ether, polyoxyethylene oleyl ether, polyoxyethylene octyl phenyl ether, polyoxyethylene nonylphenyl ether, polyethylene glycol dilaurate, polyethylene glycol distearate and sorbitan fatty acid esters, and an anionic surfactant such as "W004, W005 and W017", all produced by Yusho Co., Ltd.); "EFKA-46, EFKA-47, EFKA-47EA, EFKA Polymer 100, EFKA Polymer 400, EFKA Polymer 401 and EFKA Polymer 450", all produced by Morishita & Co., Ltd.; a polymer dispersant such as "Disperse Aid 6, Disperse Aid 8, Disperse Aid 15 and Disperse Aid 9100", all produced by San Nopco Ltd.; "Adeka Pluronic L31, F38, L42, L44, L61, L64, F68, L72, P95, F77, P84, F87, P94, L101, P103, F108, L121 and P-123" all produced by ADEKA Corporation; and "IONET (trade name) S-20", produced by Sanyo Chemical Industries, Co., Ltd.

One of these dispersants may be used alone, or two or more thereof may be used in combination. As for the dispersant of the present invention, the terminal-modified polymer, graft polymer or block polymer having an anchor moiety to the surface of the infrared-shielding material may be also used in combination with an alkali-soluble resin. Examples of the alkali-soluble resin include a (meth)acrylic acid copolymer, an itaconic acid copolymer, a crotonic acid copolymer, a maleic acid copolymer, a partially esterified maleic acid copolymer, an acidic cellulose derivative having a carboxylic acid in the side chain, and a resin obtained by modifying a hydroxyl group-containing polymer with an acid anhydride, and among these, a (meth)acrylic acid copolymer is preferred. Also, N-position substituted maleimide monomer copolymers described in JP-A-10-300922, ether dimer copolymers described in JP-A-2004-300204, and polymerizable group-containing alkali-soluble resins described in JP-A-7-319161 are preferred.

In view of dispersibility, developability and depositability, the following resins described in JP-A-2010-106268 are preferred. In particular, a polymer dispersant having a polyester chain in the side chain is preferred in view of dispersibility, and a resin having an acid group and a polyester chain is preferred in view of dispersibility and resolution of a pattern formed by photolithography. As for the acid group in the dispersant, in view of adsorptivity, an acid group having a pKa of 6 or less is preferred, and a carboxylic acid, a sulfonic acid and a phosphoric acid are more preferred.

Dispersant resins described in JP-A-2010-106268, which are preferably used in the present invention, are described below.

The dispersant is preferably a graft copolymer having a graft chain selected from a polyester structure, a polyether structure and a polyacrylate structure, in which the number of atoms excluding hydrogen atom is from 40 to 10,000, and the graft copolymer preferably contains at least a structural unit represented by any of the following formulae (1) to (5), more preferably contains at least a structural unit represented by any of the following formulae (1A), (2A), (3), (4) and (5).

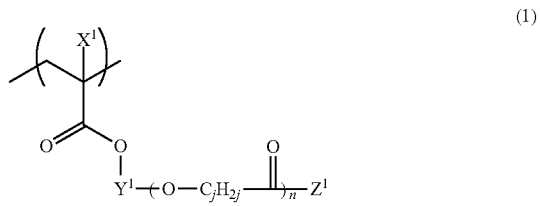

(1)

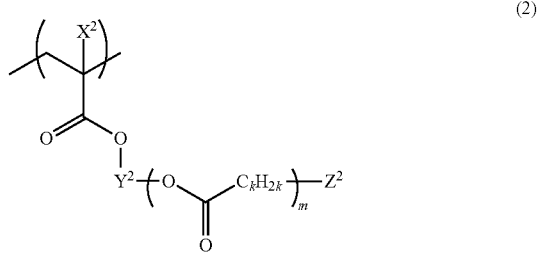

(2)

(3)

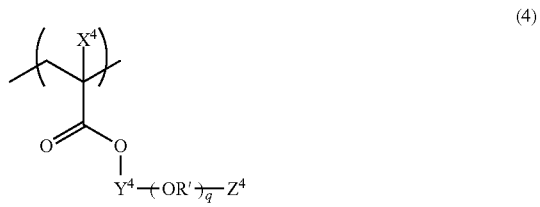

(4)

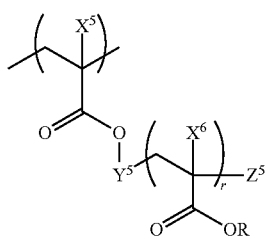
(5)

In formulae (1) to (5), each of $X^1$, $X^2$, $X^3$, $X^4$, $X^5$ and $X^6$ independently represents a hydrogen atom or a monovalent organic group and, in view of restriction on the synthesis, is preferably a hydrogen atom or an alkyl group having a carbon number of 1 to 12, more preferably a hydrogen atom or a methyl group, still more preferably a methyl group.

In formulae (3) and (4), R' represents a branched or linear alkylene group (preferably having a carbon number of 1 to 10, more preferably 2 or 3) and in formula (3), is preferably a group represented by —CH$_2$—CH(CH$_3$)— and in formula (4), preferably a group represented by —CH(CH$_3$)—CH$_2$—.

In formulae (1) to (5), each of $Y^1$, $Y^2$, $Y^3$, $Y^4$ and $Y^5$ independently represents a divalent linking group and is not particularly limited in its structure. Specific examples thereof include linking groups of the following formulae (Y-1) to (Y-20). In the structures below, A and B indicate, respectively, bonds to the left terminal group and the right terminal group in formulae (1) to (5). Among the structures shown below, in view of easy synthesis, (Y-2) and (Y-13) are preferred.

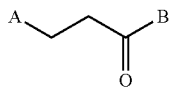 (Y-1)

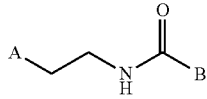 (Y-2)

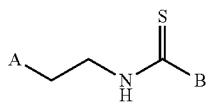 (Y-3)

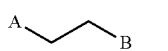 (Y-4)

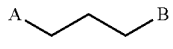 (Y-5)

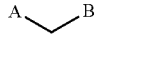 (Y-6)

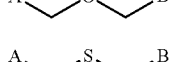 (Y-7)

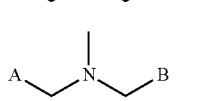 (Y-8)

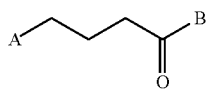 (Y-9)

 (Y-10)

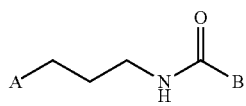 (Y-11)

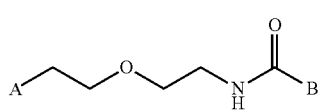 (Y-12)

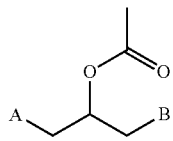 (Y-13)

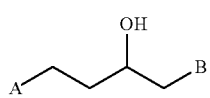 (Y-14)

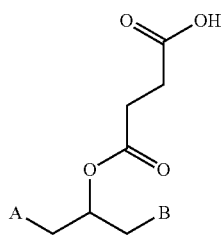 (Y-15)

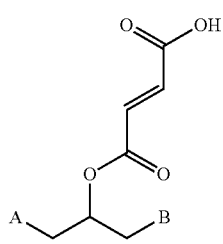 (Y-16)

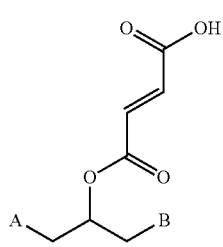 (Y-17)

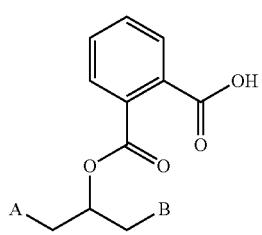 (Y-18)

(Y-19)

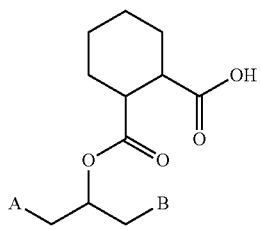

(Y-20)

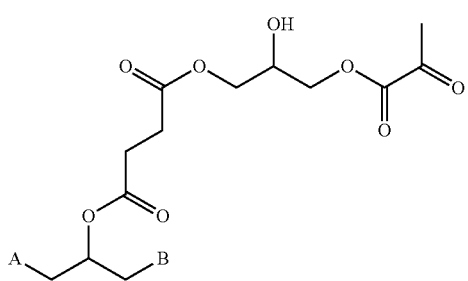

In formulae (1) to (5), each of $Z^1$, $Z^2$, $Z^3$, $Z^4$ and $Z^5$ independently represents a hydrogen atom or a monovalent substituent, and the structure of the substituent is not particularly limited. Specific examples thereof include an alkyl group, a hydroxyl group, an alkoxy group, an aryloxy group, a heteroaryloxy group, an alkylthioether group, an arylthioether group, a heteroarylthioether group and an amino group. Among these, from the standpoint of enhancing the dispersibility, those having a steric repulsion effect are preferred, and an alkyl group having a carbon number of 5 to 24 is preferred. Above all, a branched alkyl group having a carbon number of 5 to 24 or a cyclic alkyl group having a carbon number of 5 to 24 is preferred.

In formulae (1) to (5), each of n, m, p, q and r represents an integer of 1 to 500.

In formulae (1) and (2), each of j and k independently represents an integer of 2 to 8. In view of dispersion stability and developability, each of j and k in formulae (1) and (2) is preferably an integer of 4 to 6, and most preferably 5.

In formula (5), R represents a hydrogen atom or a monovalent organic group and is not particularly limited in its structure but is preferably a hydrogen atom, an alkyl group, an aryl group or a heteroaryl group, more preferably a hydrogen atom or an alkyl group. When R is an alkyl group, the alkyl group is preferably a linear alkyl group having a carbon number of 1 to 20, a branched alkyl group having a carbon number of 3 to 20, or a cyclic alkyl group having a carbon number of 5 to 20, more preferably a linear alkyl group having a carbon number of 1 to 20, still more preferably a linear alkyl group having a carbon number of 1 to 6.

As for R in formula (5), two or more R's differing in the structure may be mixed and used in the specific resin.

In view of dispersion stability and developability, the structural unit represented by formula (1) is preferably a structural unit represented by the following formula (IA).

Also, in view of dispersion stability and developability, the structural unit represented by formula (2) is preferably a structural unit represented by the following formula (2A).

(1A)

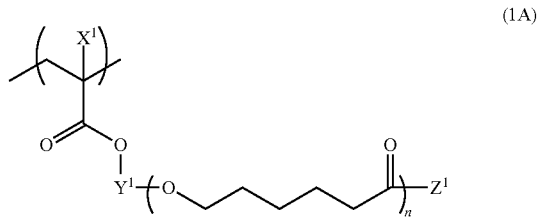

(2A)

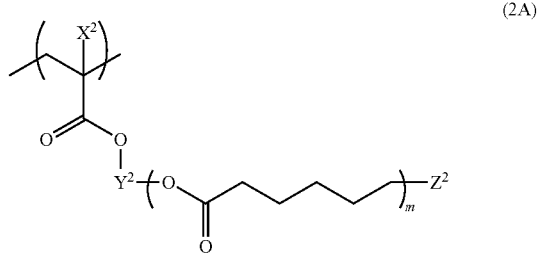

In formula (IA), $X^1$, $Y^1$, $Z^1$ and n have the same meanings as $X^1$, $Y^1$, $Z^1$ and n in formula (1), and preferred ranges are also the same.

In formula (2A), $X^2$, $Y^2$, $Z^2$ and m have the same meanings as $X^2$, $Y^2$, $Z^2$ and m in formula (2), and preferred ranges are also the same.

Specific examples thereof include compounds illustrated below. In the following compounds, the numerical value put down with each structural unit (the numerical value put down with the repeating unit of the main chain) indicates the content [% by mass, shown as (wt %)] of the structural unit. The numerical value put down with the repeating unit of the side chain indicates the number of repetitions of the repeating unit.

(Compound 1)

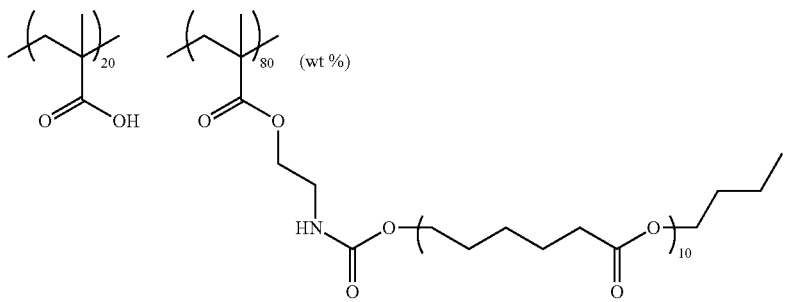

(Compound 2)
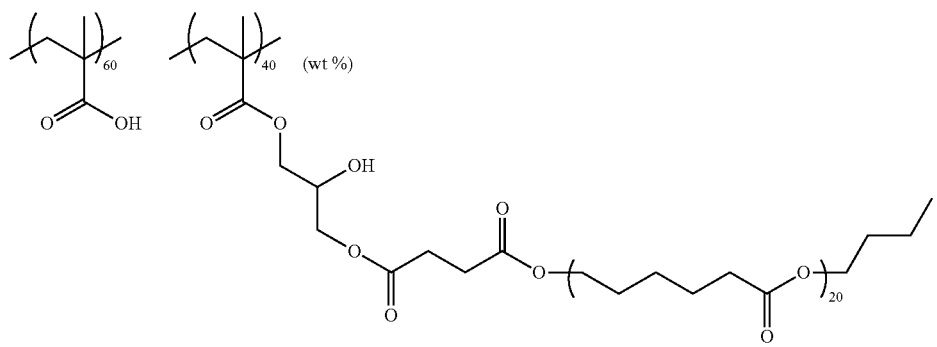
(Compound 3)
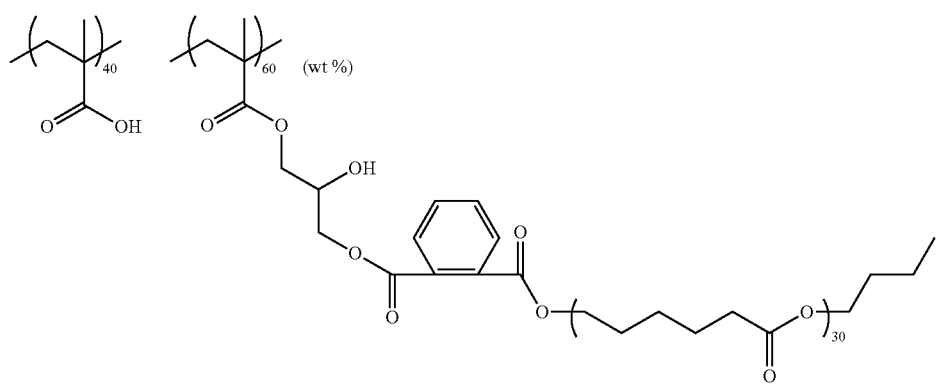
(Compound 4)
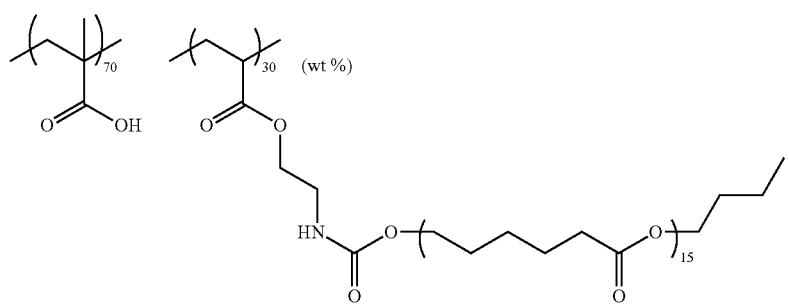
(Compound 5)
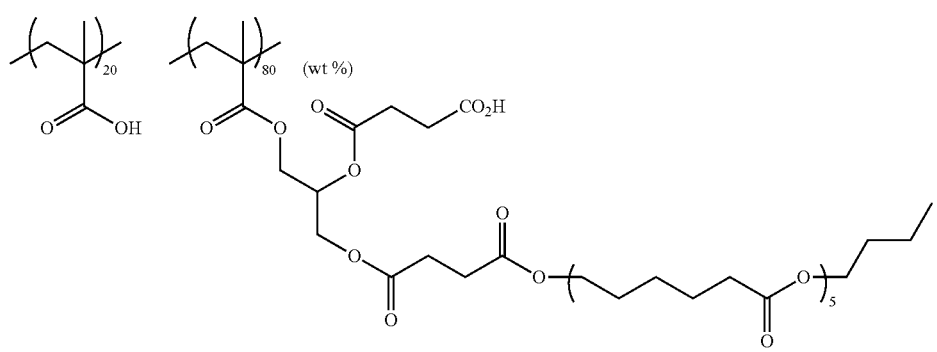

-continued
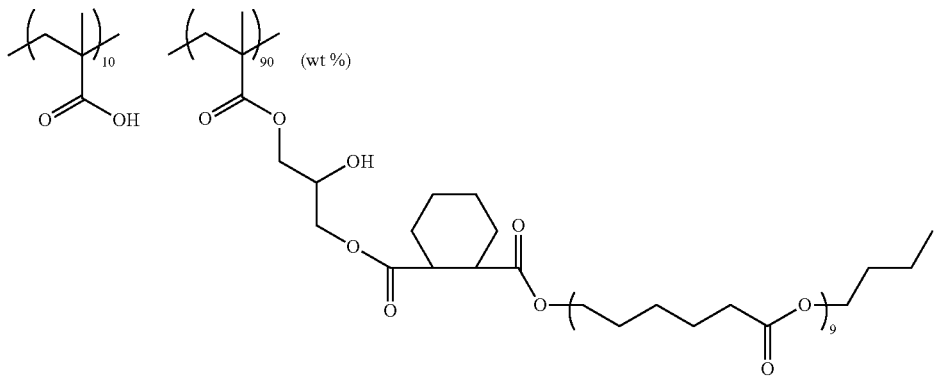
(Compound 6)
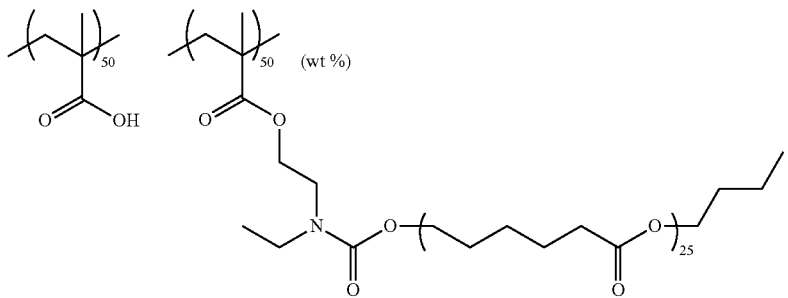
(Compound 7)
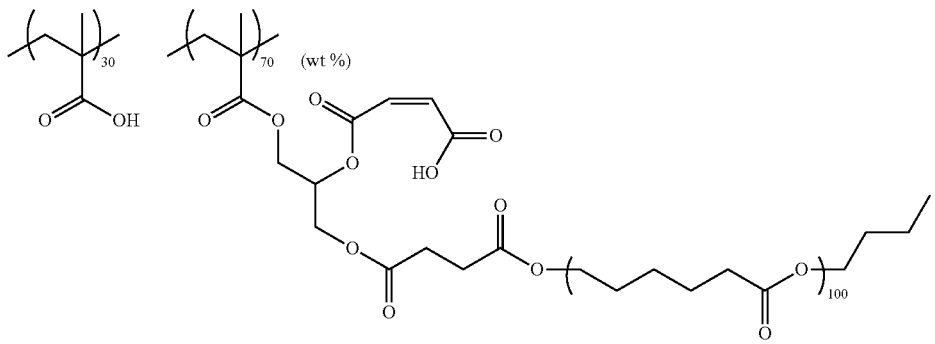
(Compound 8)
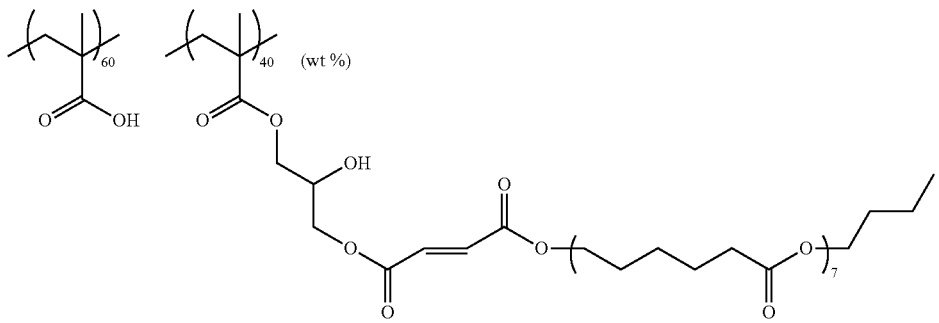
(Compound 9)

-continued
(Compound 10)
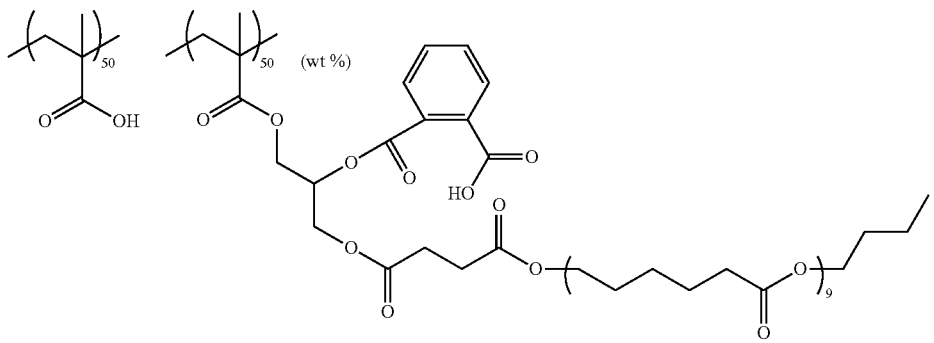
(Compound 11)
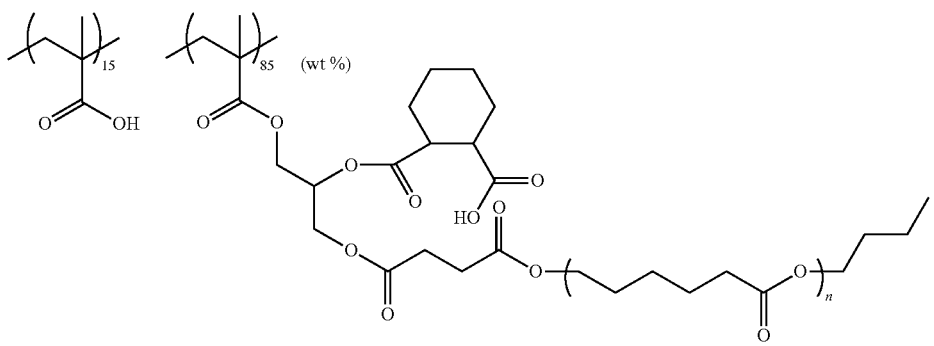
(n = 5~20)
(Compound 12)
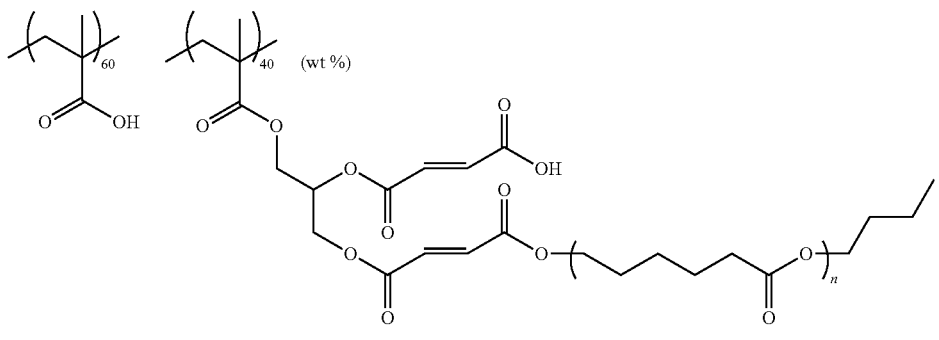
(n = 5~20)
(Compound 13)
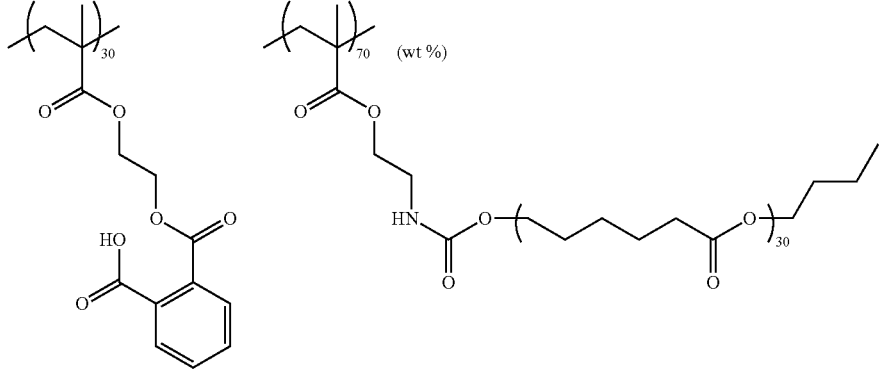

-continued
(Compound 14)
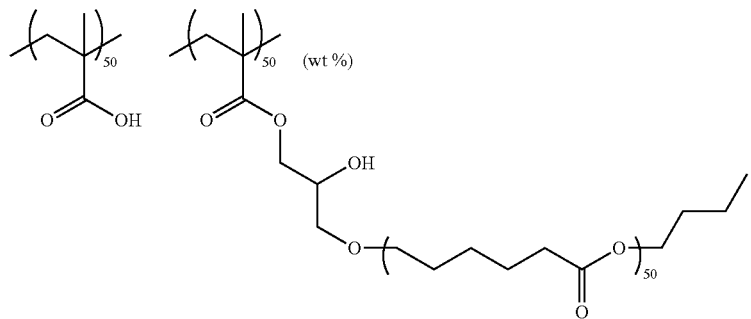
(Compound 15)
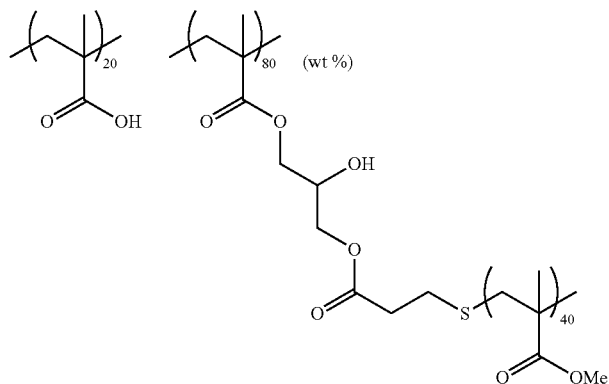
(Compound 16)
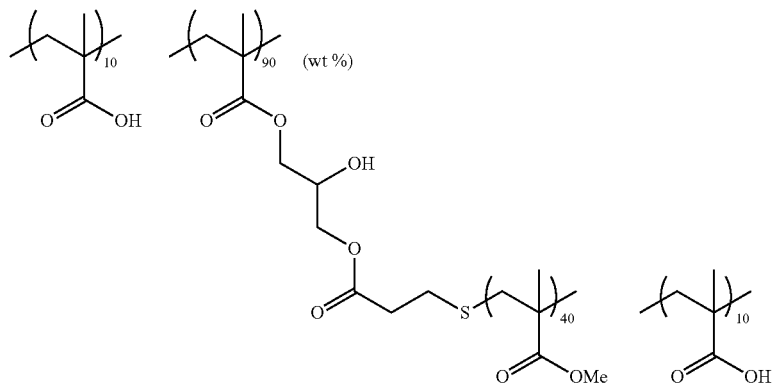

(Compound 20)
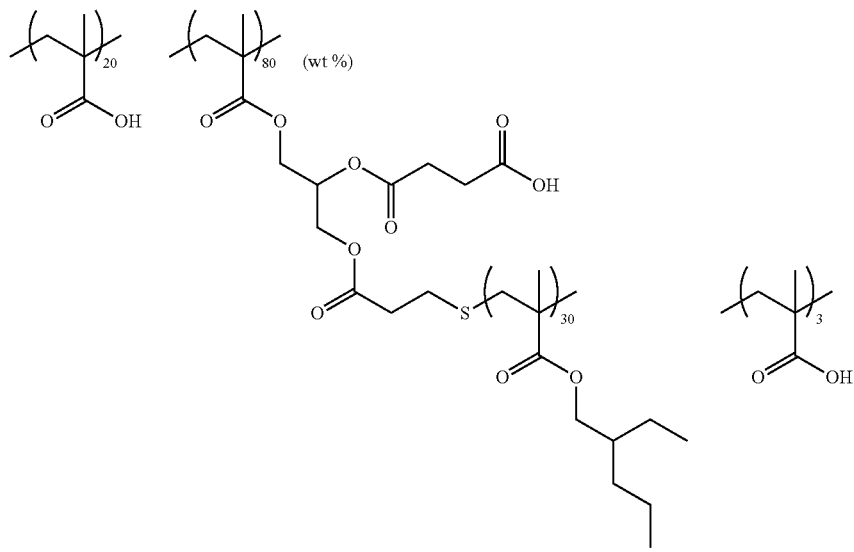
(Compound 21)
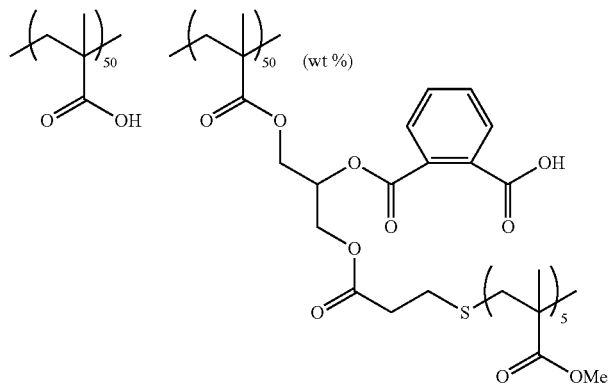
(Compound 22)
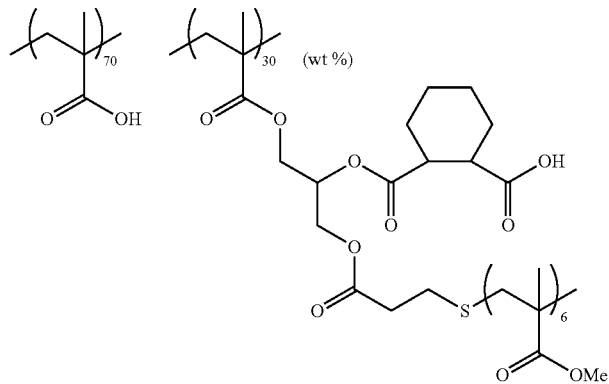

-continued
(Compound 23)
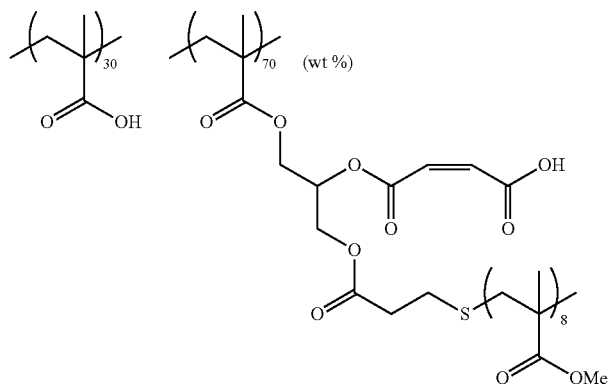
(Compound 24)
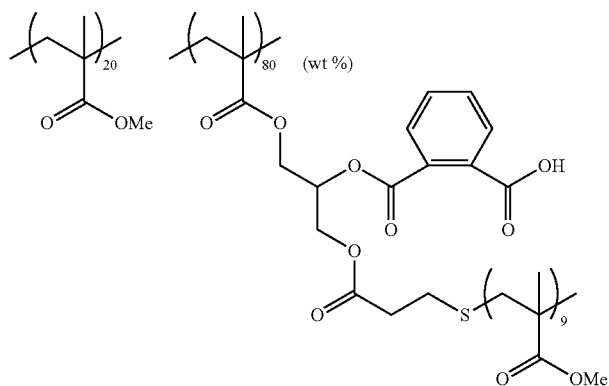
(Compound 25)
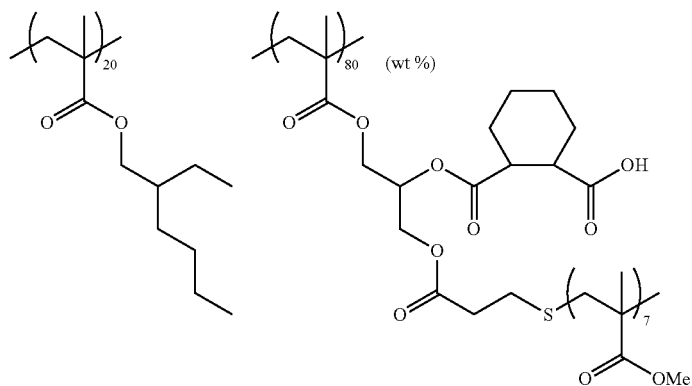
(Compound 26)
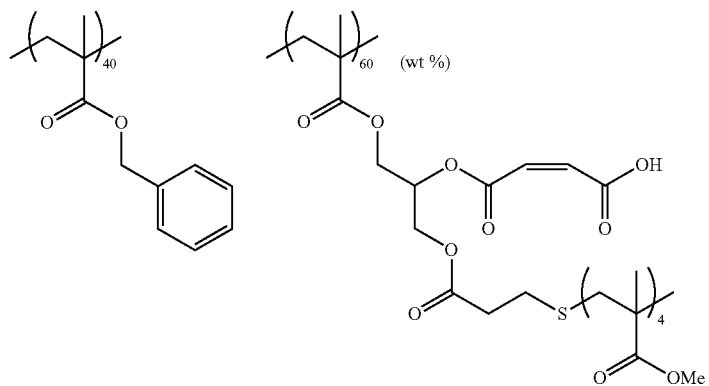

(Compound 27)
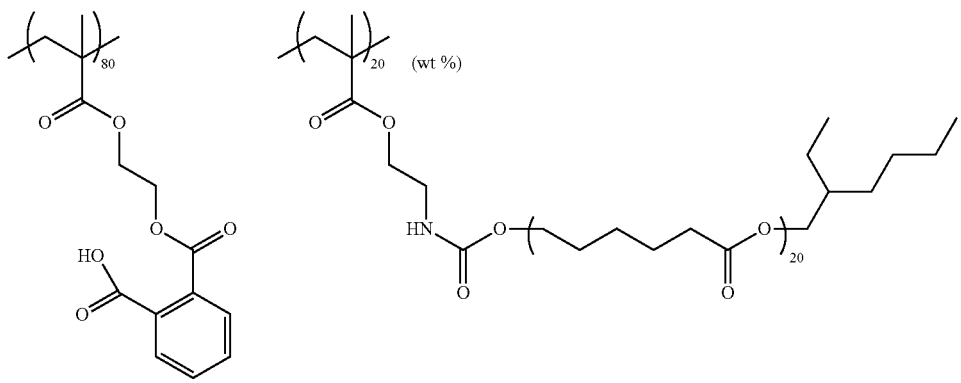
(Compound 28)
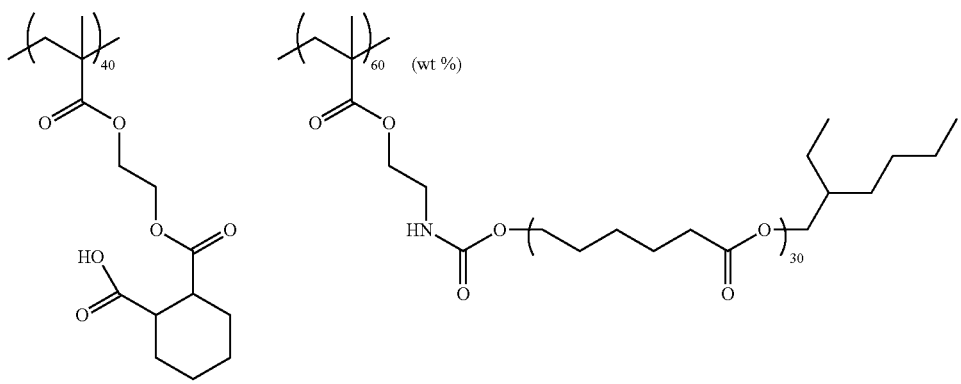
(Compound 29)
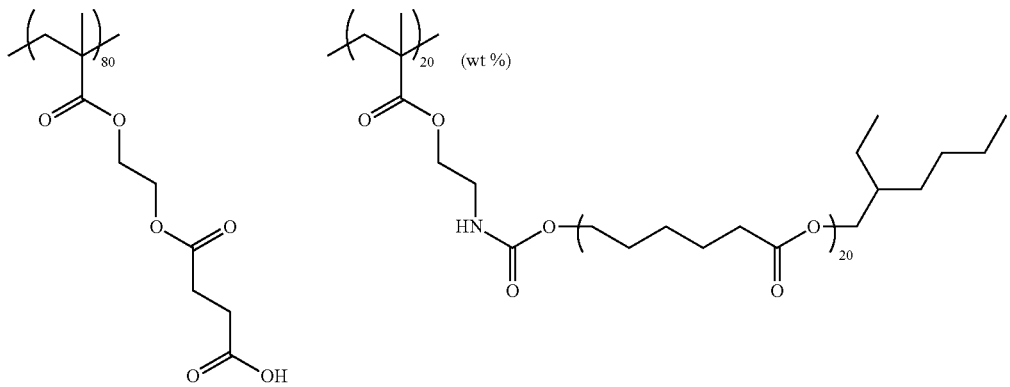
(Compound 30)
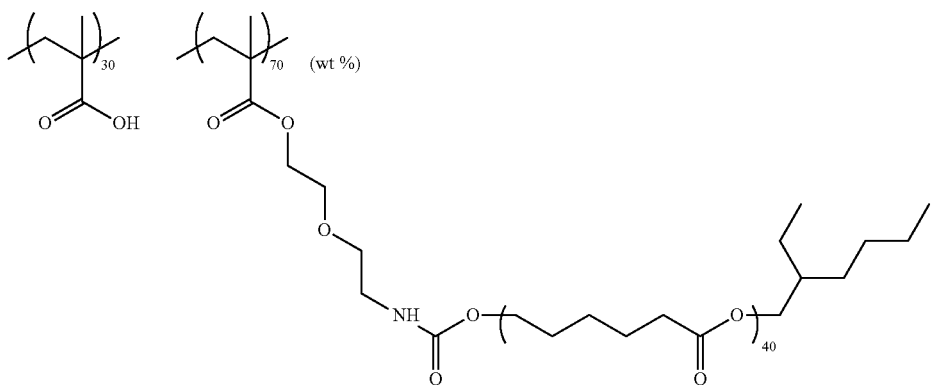

(Compound 31)
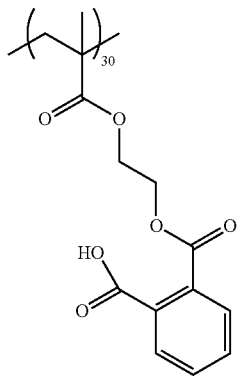 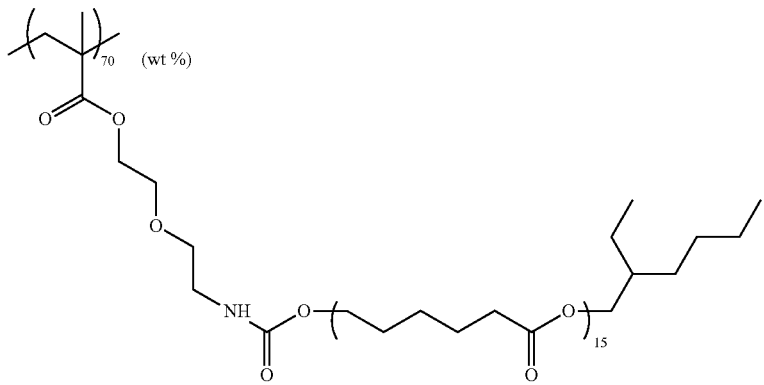
(Compound 32)
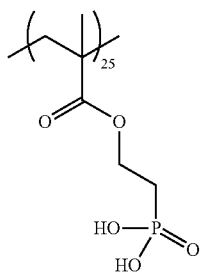 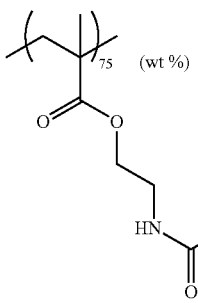
(Compound 33)
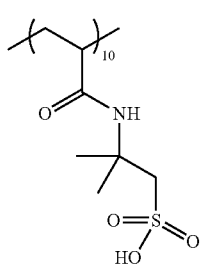 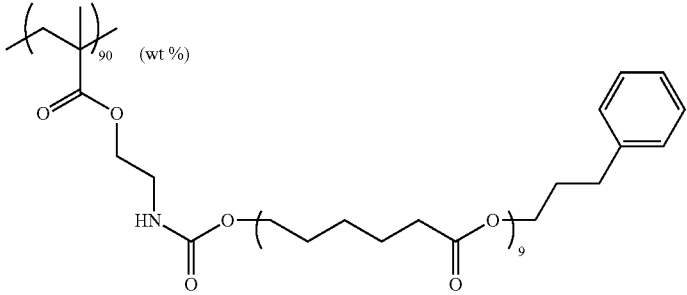
(Compound 34)
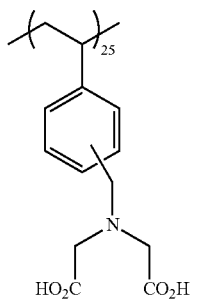 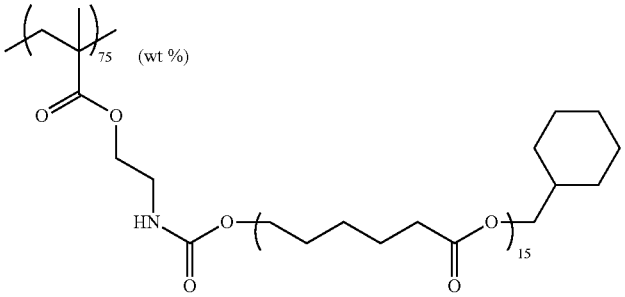
(Compound 35)
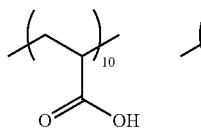 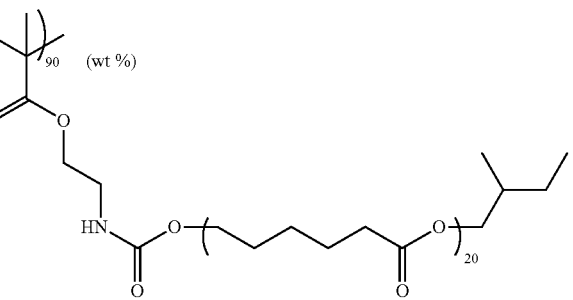

(Compound 36)
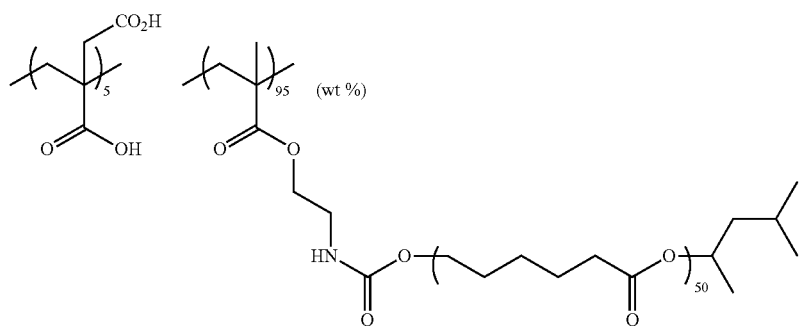
(Compound 37)
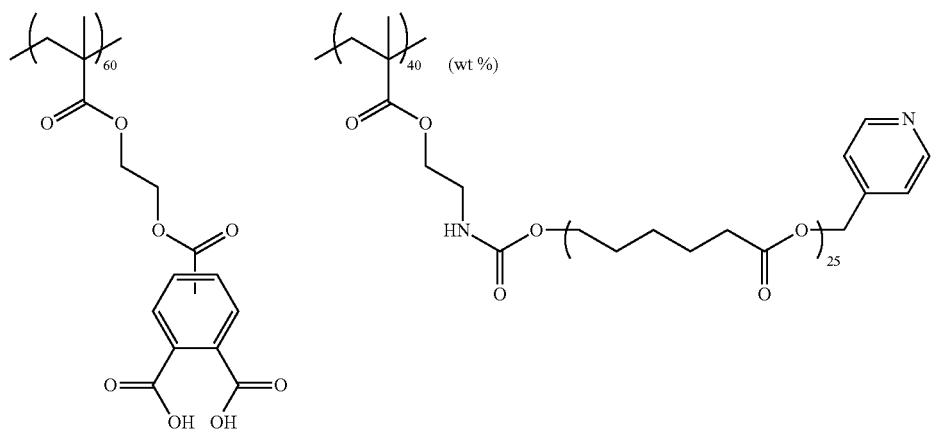
(Compound 38)
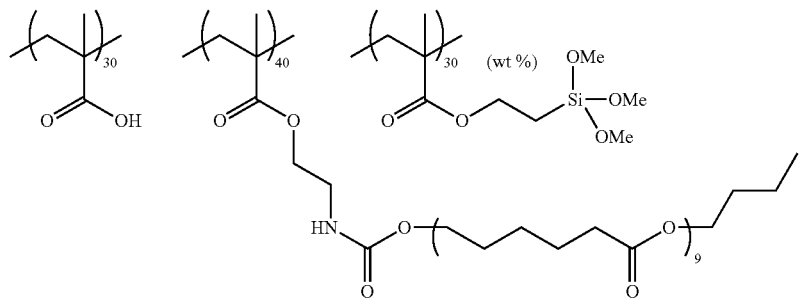
(Compound 39)
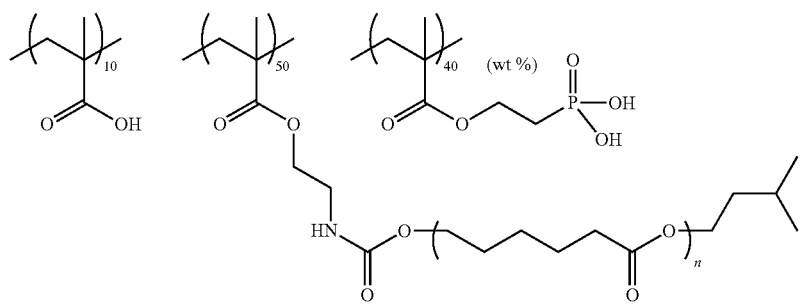
(n = 5~20)

-continued
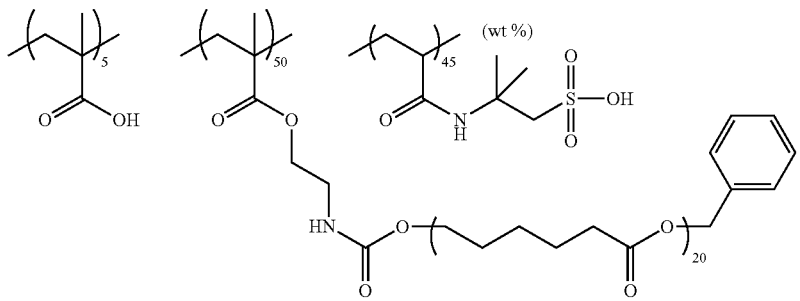
(Compound 40)
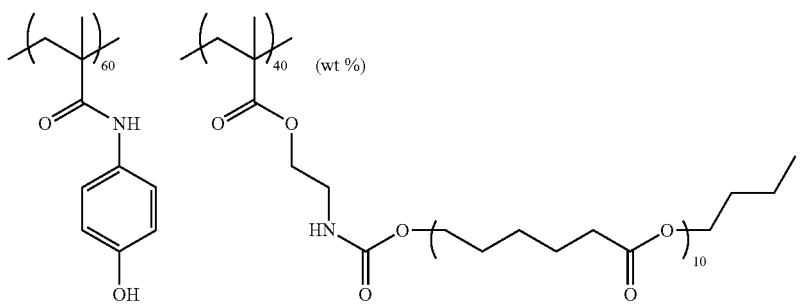
(Compound 41)
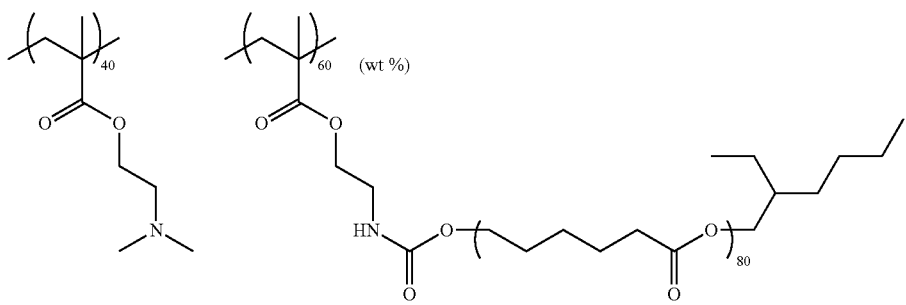
(Compound 42)
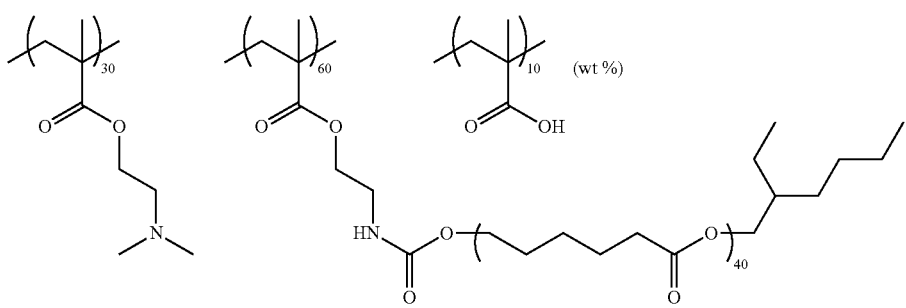
(Compound 43)
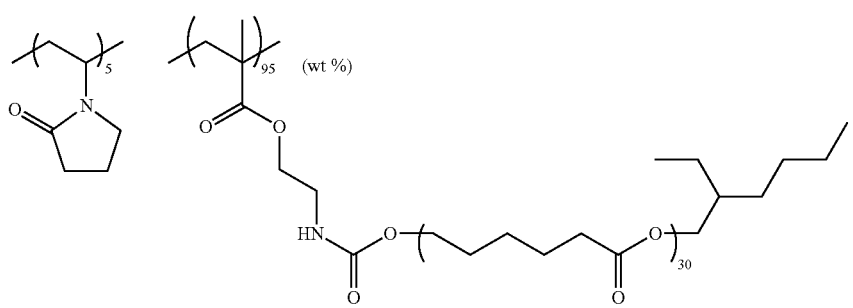
(Compound 44)

(Compound 45)
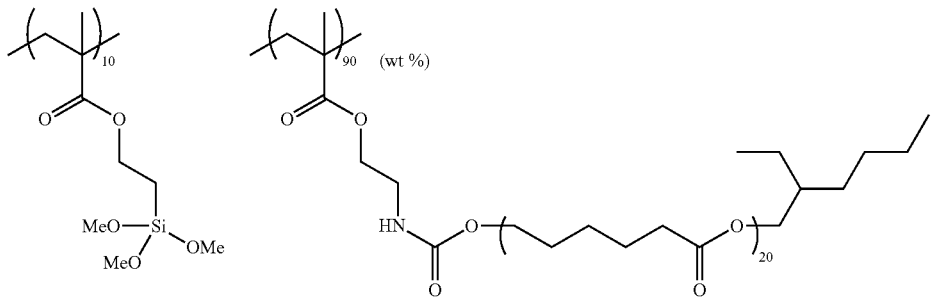
(Compound 46)
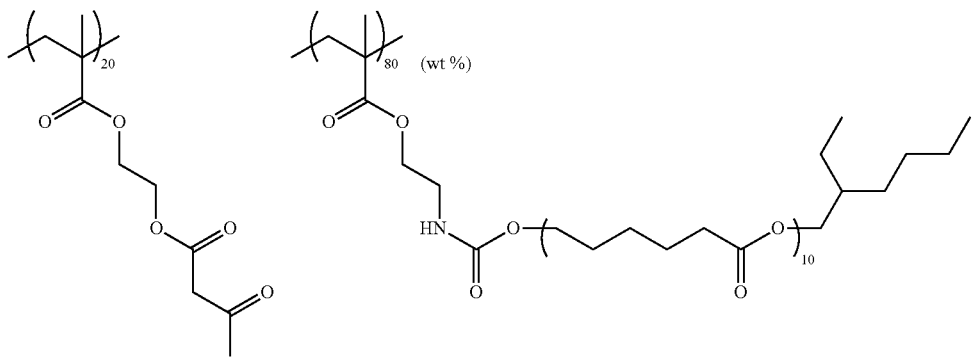
(Compound 47)
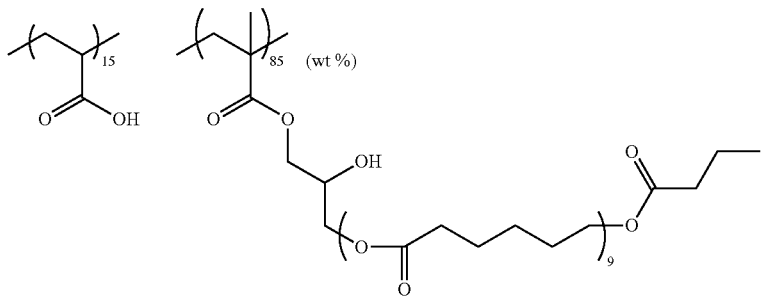
(Compound 48)
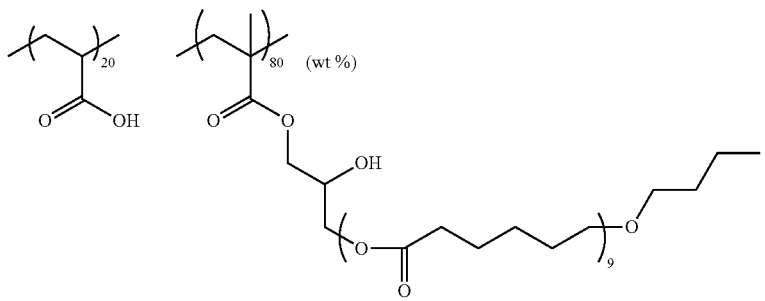

-continued
(Compound 49)
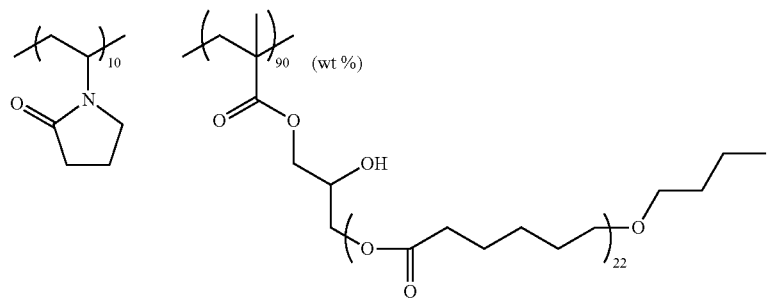
(Compound 50)
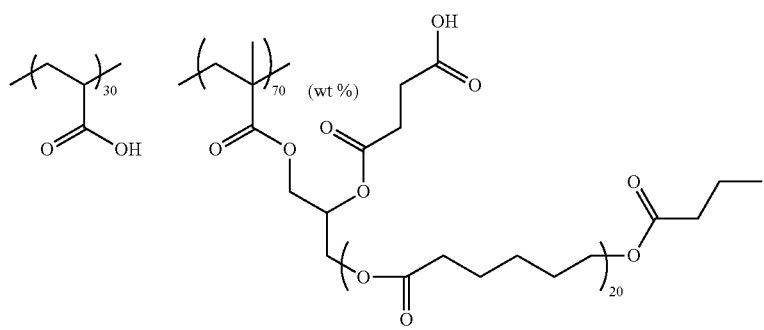
(Compound 51)
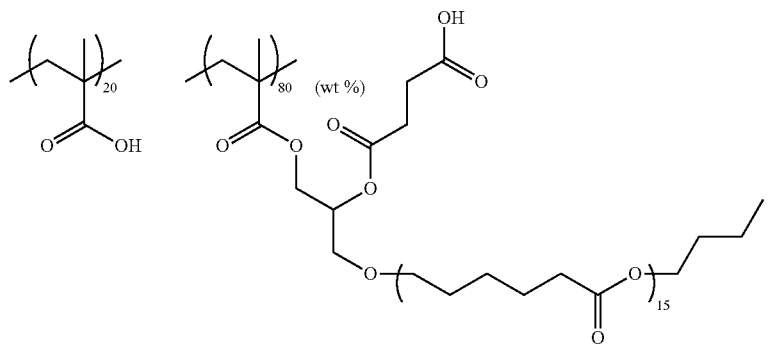
(Compound 52)
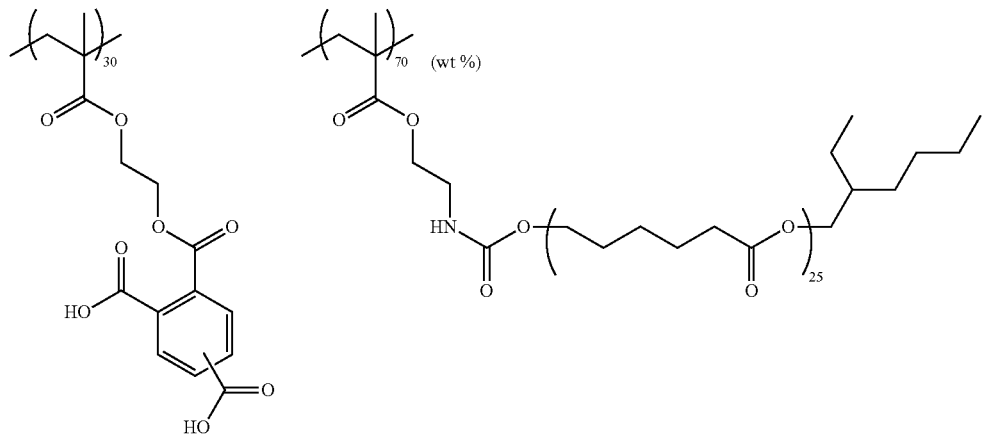

(Compound 53)
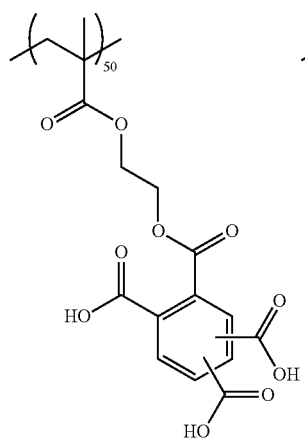 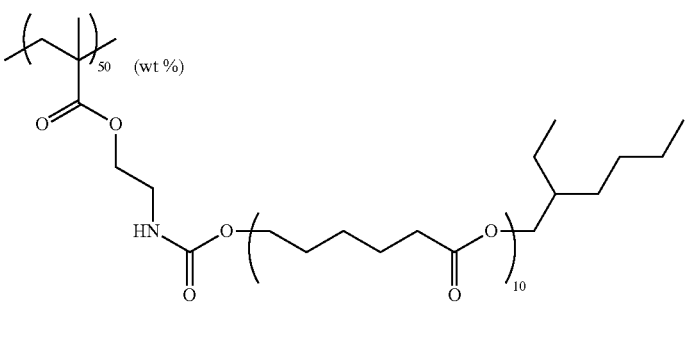
(Compound 54)
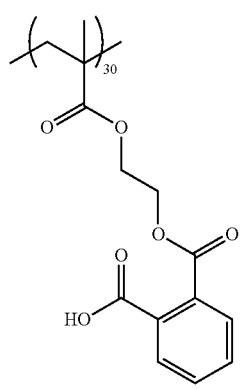 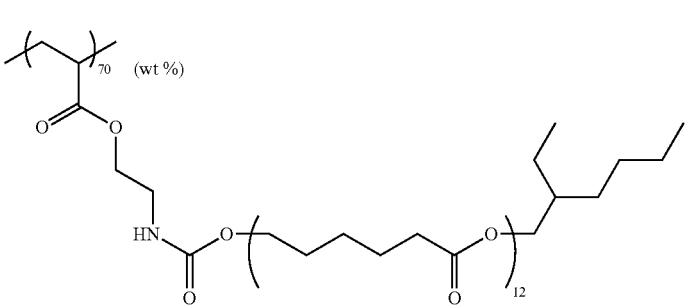
(Compound 55)
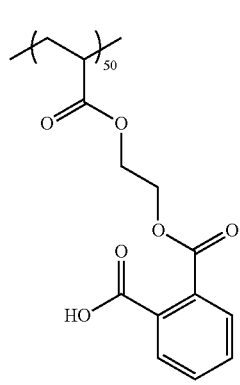 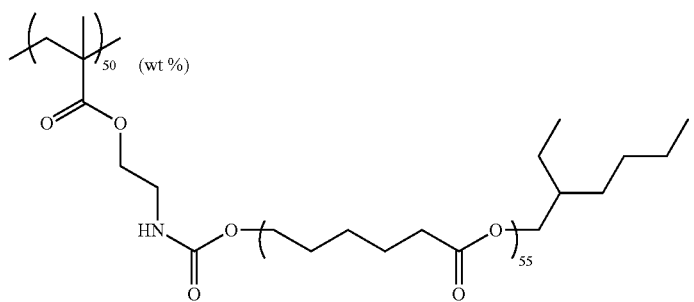
(Compound 56)
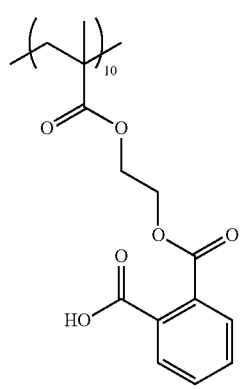 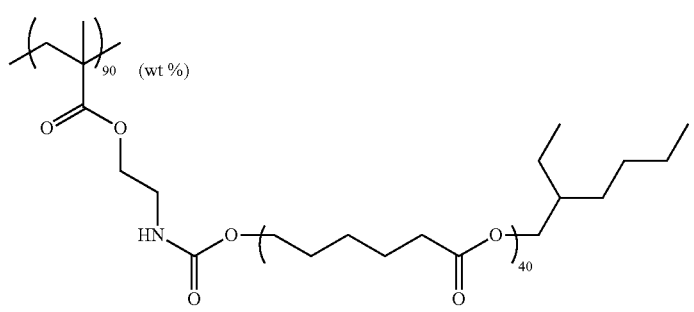

(Compound 57)
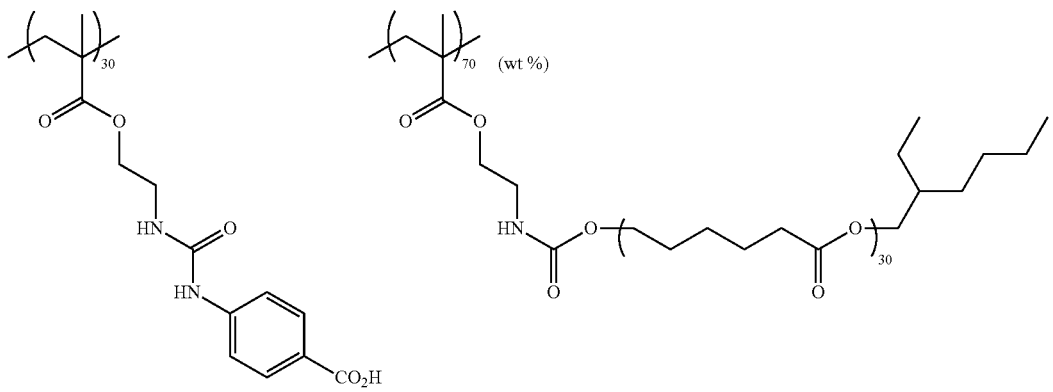
(Compound 58)
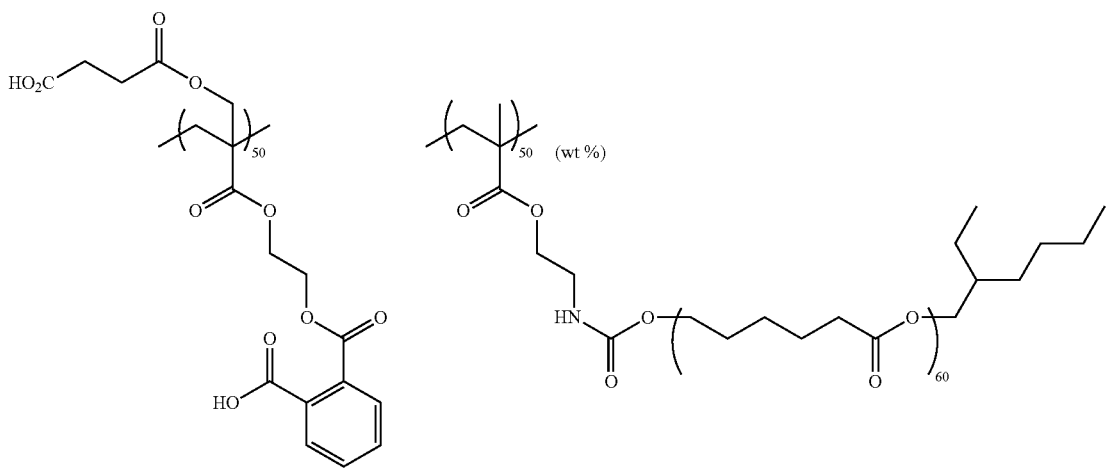
(Compound 59)
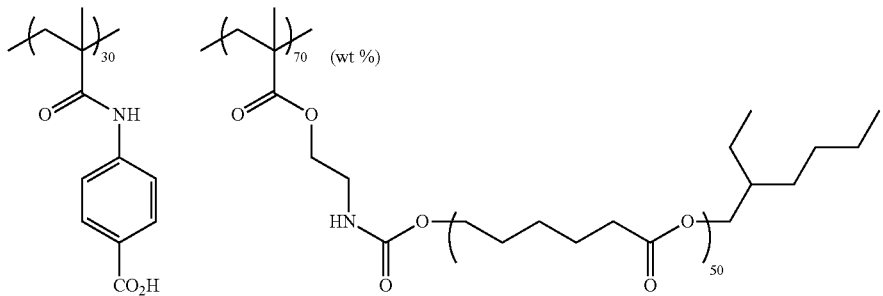
(Compound 60)
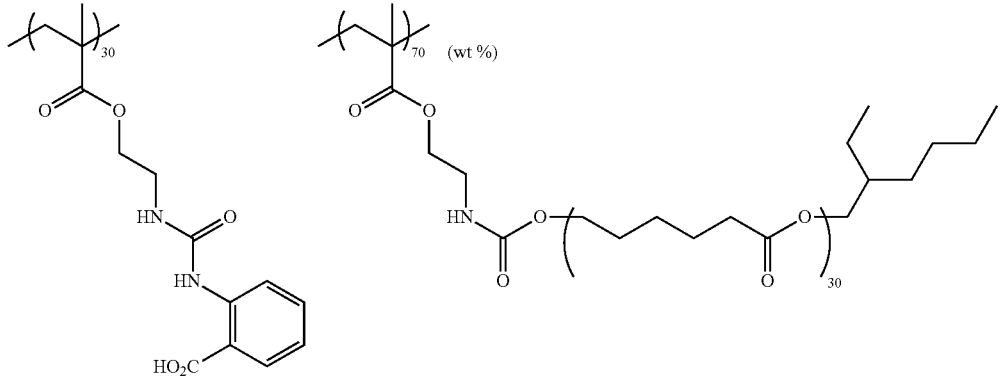

(Compound 61)
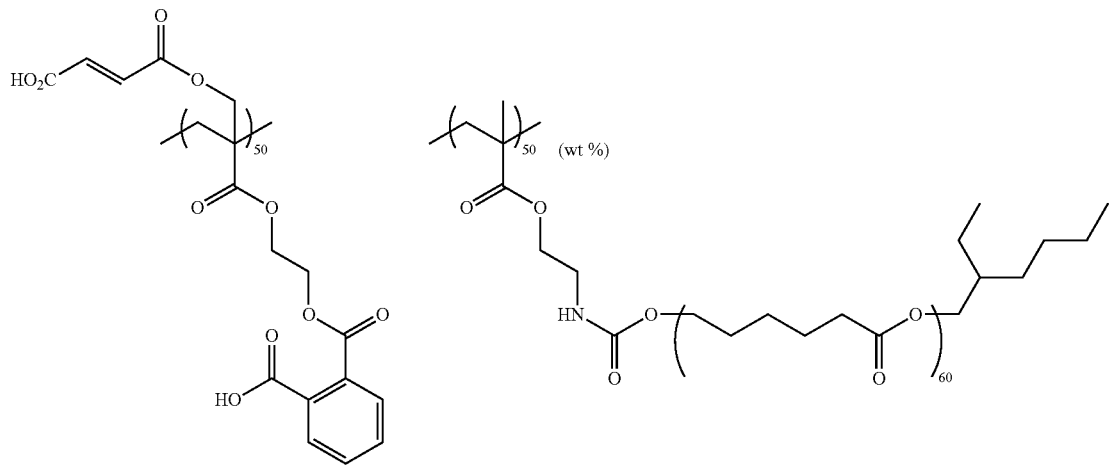
(Compound 62)
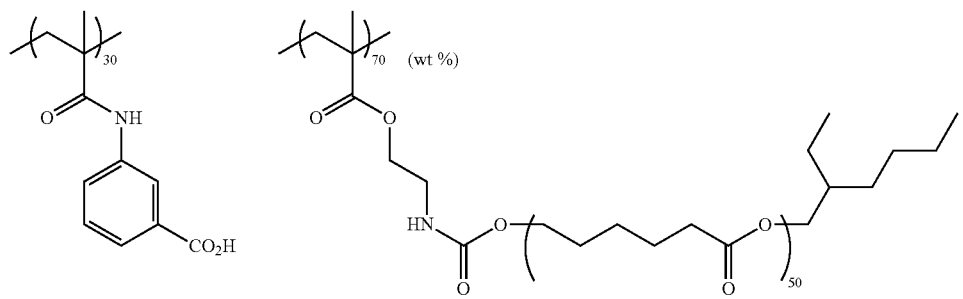
(Compound 63)
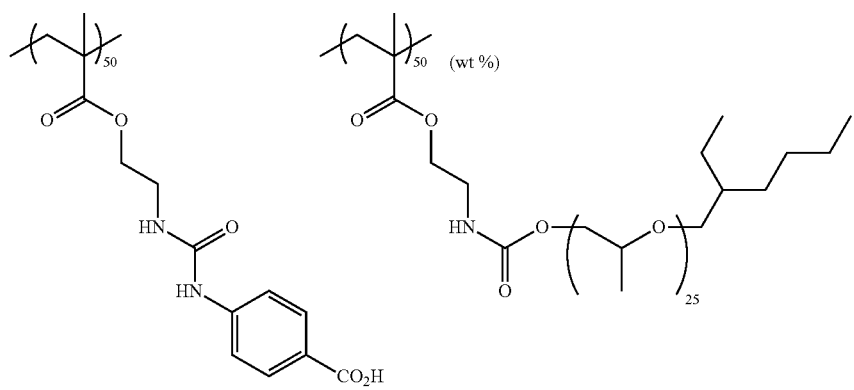
(Compound 64)
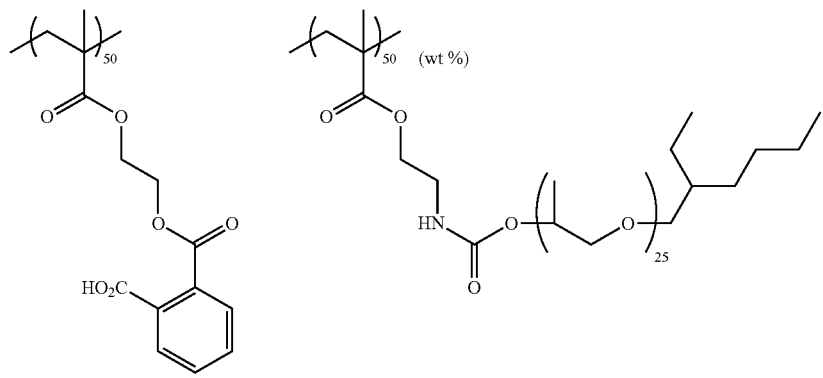

(Compound 65)
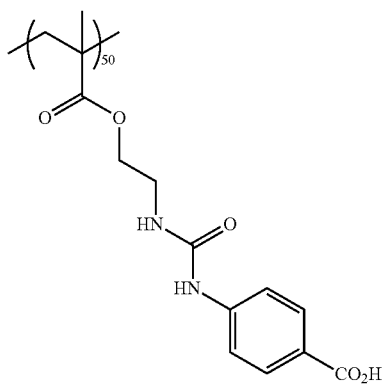 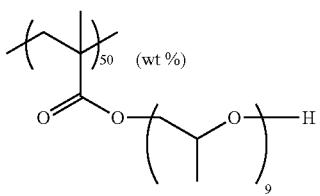
(Compound 66)
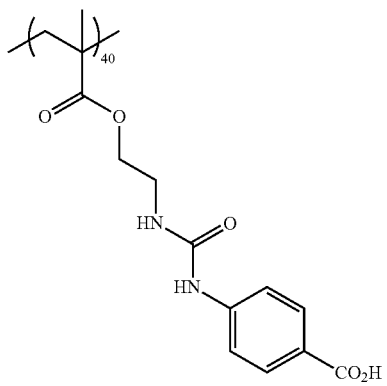 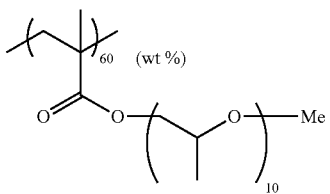
(Compound 67)
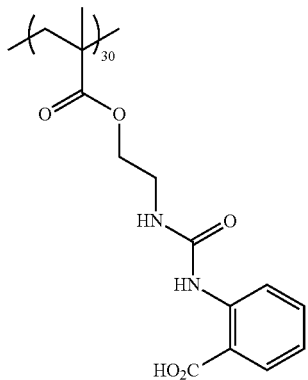 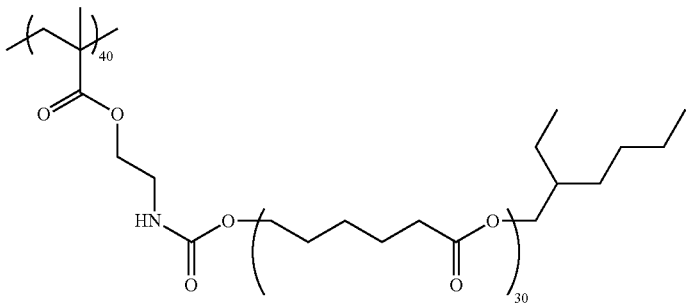
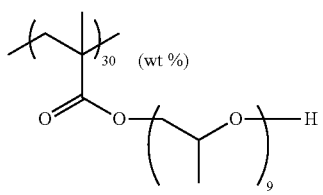

(Compound 68)
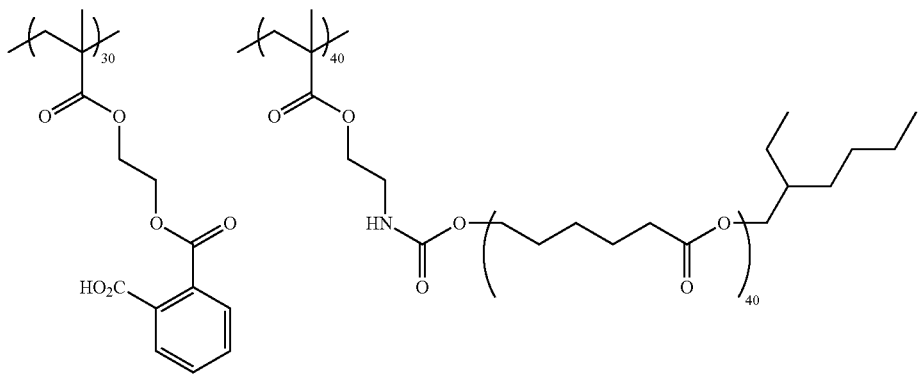
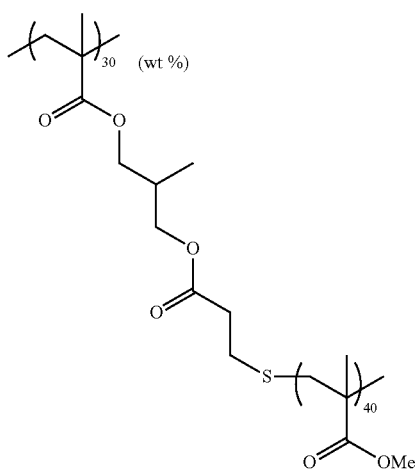
(Compound 69)
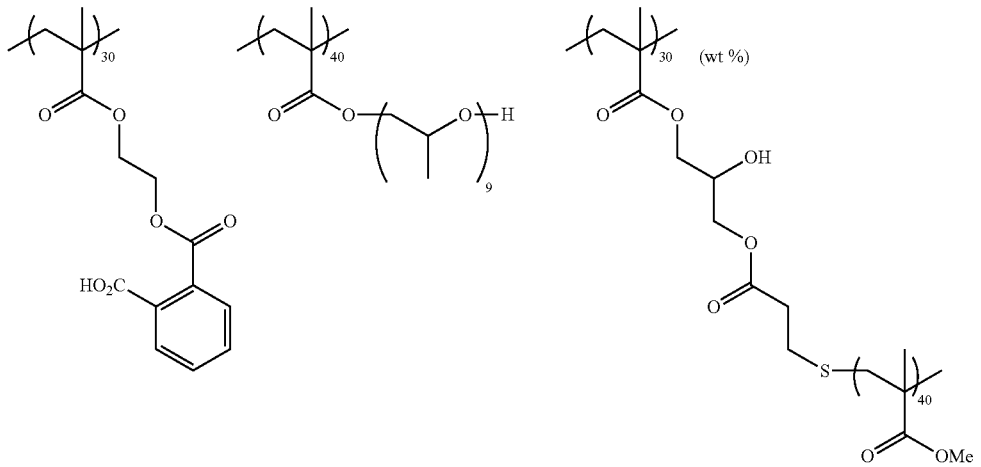

(Compound 70)

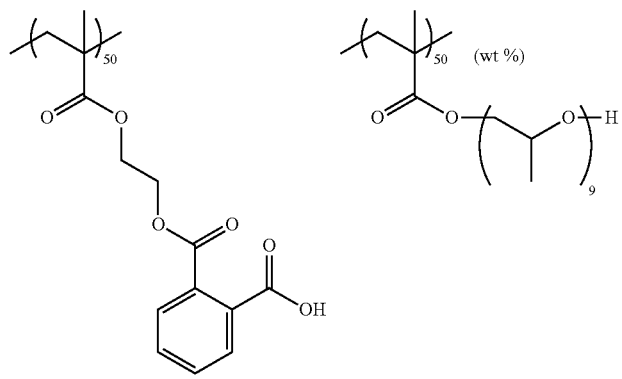

(Compound 71)

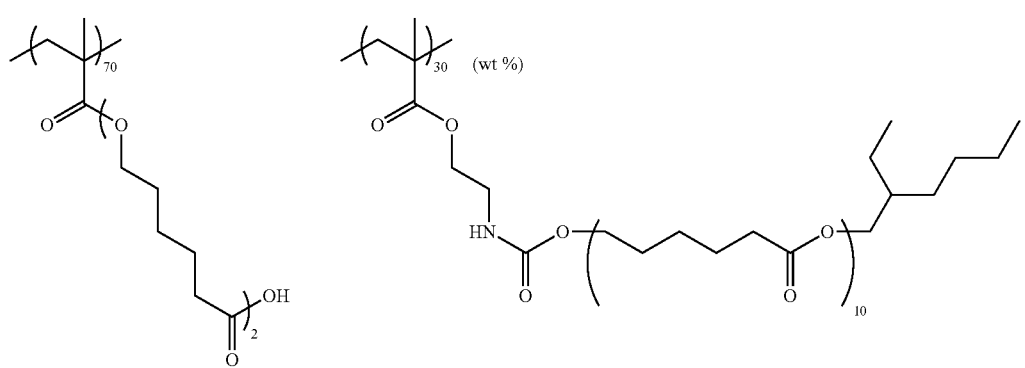

(Compound 72)

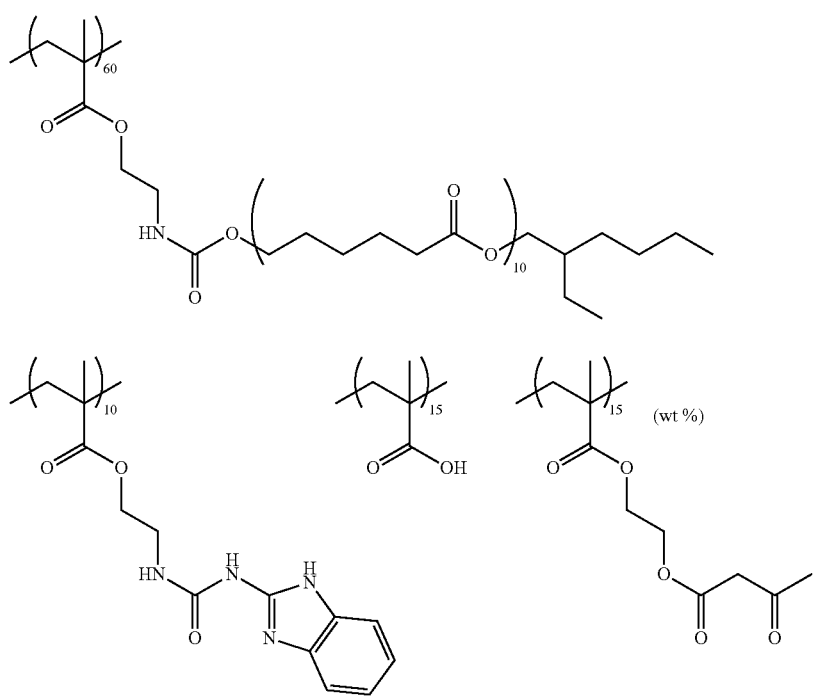

In the case of using a dispersant, from the standpoint of enhancing the dispersibility, it is preferred to prepare a dispersion composition by using the tungsten compound (and the above-described another infrared-shielding material, if desired), the dispersant and an appropriate solvent and then blend the dispersion composition with the polymerizable composition.

The polymerizable composition may or may not contain a dispersant, but in the case of containing a dispersant, its content in the dispersion composition is preferably from 1 to 90 mass %, more preferably from 3 to 70 mass %, based on the entire solid content by mass of the tungsten compound in the dispersion composition or in the case of using another infrared-shielding material and using an infrared absorbing inorganic pigment as the another infrared-shielding material, based on the sum of the entire solid content by mass of the tungsten compound and the entire solid content by mass of the infrared absorbing inorganic pigment.

[7] Sensitizer

The polymerizable composition of the present invention may contain a sensitizer for the purpose of enhancing the radical generating efficiency of the polymerization initiator and making the photosensitive wavelength longer. The sensitizer which can be used in the present invention is preferably a compound capable of sensitizing the photopolymerization initiator described above by an electron transfer mechanism or an energy transfer mechanism. The sensitizer which can be used in the present invention includes compounds belonging to the compound groups enumerated below and having an absorption wavelength in the wavelength region of 300 to 450 nm.

Preferred examples of the sensitizer include compounds belonging to the following compound groups and having an absorption wavelength in the wavelength region of 330 to 450 nm.

For example, preferred compounds include polynuclear aromatics (e.g., phenanthrene, anthracene, pyrene, perylene, triphenylene, 9,10-dialkoxyanthracene), xanthenes (e.g., fluorescein, eosin, erythrosine, Rhodamine B, rose Bengal), thioxanthones (2,4-diethylthioxanthone, isopropylthioxanthone, diethylthioxanthone, chlorothioxanthone), cyanines (e.g., thiacarbocyanine, oxacarbocyanine), merocyanines (e.g., merocyanine, carbomerocyanine), phthalocyanines, thiazines (e.g., thionine, methylene blue, toluidine blue), acridines (e.g., acridine orange, chloroflavin, acriflavin), anthraquinones (e.g., anthraquinone), squaryliums (e.g., squarylium), acridine orange, coumarins (e.g., 7-diethylamino-4-methylcoumarin), ketocoumarin, phenothiazines, phenazines, styrylbenzenes, azo compounds, diphenylmethane, triphenylmethane, distyrylbenzenes, carbazoles, porphyrin, Spiro compounds, quinacridones, indigo, styryl, pyrylium compounds, pyrromethene compounds, pyrazolotriazole compounds, benzothiazole compounds, barbituric acid derivatives, thiobarbituric acid derivatives, acetophenone, benzophenone, thioxanthone, aromatic ketone compounds such as Michler's ketone, and heterocyclic compounds such as N-aryl oxazolidinone.

Other examples include compounds described in European Patent No. 568,993, U.S. Pat. Nos. 4,508,811 and 5,227,227, JP-A-2001-125255 and JP-A-11-271969.

The polymerizable composition may or may not contain a sensitizer, but in the case of containing a sensitizer, the content thereof is preferably from 0.01 to 10 mass %, more preferably from 0.1 to 2 mass %, based on the entire solid content by mass of the polymerizable composition of the present invention.

[8] Crosslinking Agent

The polymerizable composition of the present invention may further contain a crosslinking agent for the purpose of increasing the strength of the permanent pattern.

As for the crosslinking agent, a compound having a crosslinking group is preferred, and a compound having two or more crosslinking groups is more preferred. Specific preferred examples of the crosslinking group include an oxetane group, a cyanate group and those groups described for the crosslinking group which the alkali-soluble binder may have. Among these, an epoxy group, an oxetane group and a cyanate group are preferred. That is, the crosslinking agent is preferably an epoxy compound, an oxetane compound or a cyanate compound.

Examples of the epoxy compound which can be suitably used as a crosslinking agent in the present invention include an epoxy compound containing at least two oxirane groups per molecule, and an epoxy compound having an alkyl group at the β-position and containing at least two epoxy groups per molecule.

Examples of the epoxy compound having at least two oxirane groups per molecule include, but are not limited to, a bixylenol or biphenol-type epoxy compound (such as "YX4000 produced by Japan Epoxy Resins Co., Ltd.") or a mixture thereof, a heterocyclic epoxy compound having an isocyanurate structure or the like (such as "TEPIC produced by Nissan Chemical Industries, Ltd." and "Araldite PT810 produced by BASF Japan"), a bisphenol A-type epoxy compound, a novolak-type epoxy compound, a bisphenol F-type epoxy compound, a hydrogenated bisphenol A-type epoxy compound, a bisphenol S-type epoxy compound, a phenol novolak-type epoxy compound, a cresol novolak-type epoxy compound, a halogenated epoxy compound (such as low brominated epoxy compound, high halogenated epoxy compound and brominated phenol novolak-type epoxy compound), an allyl group-containing bisphenol A-type epoxy compound, a trisphenolmethane-type epoxy compound, a diphenyldimethanol-type epoxy compound, a phenol-biphenylene-type epoxy compound, a dicyclopentadiene-type epoxy compound (such as "HP-7200 and HP-7200H produced by Dainippon Ink and Chemicals, Inc."), a glycidylamine-type epoxy compound (such as diaminodiphenylmethane-type epoxy compound, glycidylaniline and triglycidylaminophenol), a glycidylester-type epoxy compound (such as diglycidyl phthalate, diglycidyl adipate, diglycidyl hexahydrophthalate and diglycidyl dimerate), a hydantoin-type epoxy compound, an alicyclic epoxy compound (such as 3,4-epoxycyclohexylmethyl-3',4'-epoxycyclohexane carboxylate, bis(3,4-epoxycyclohexylmethyl)adipate, dicyclopentadiene diepoxide, and "GT-300, GT-400 and ZEHPE3150 produced by Daniel Chemical Industries, Ltd."), an imide alicyclic epoxy compound, a trihydroxyphenylmethane-type epoxy compound, a bisphenol A novolak-type epoxy compound, a tetraphenylolethane-type epoxy compound, a glycidyl phthalate compound, a tetraglycidyl xylenoylethane compound, a naphthalene group-containing epoxy compound (such as naphthol aralkyl-type epoxy compound, naphthol novolak-type epoxy compound, tetrafunctional naphthalene-type epoxy compound and, as commercially available products, "ESN-190 and ESN-360 produced by Nippon Steel Chemical Co., Ltd." and "HP-4032, EXA-4750 and EXA-4700 produced by Dainippon Ink and Chemicals, Inc."), a reaction product of epichlorohydrin and a polyphenol compound which is obtained by addition reaction between a phenol compound and a diolefin compound such as divinylbenzene and dicyclopentadiene, a 4-vinylcyclohexene-1-oxide compound subjected to ring-opening polymerization and then epoxidization with peracetic acid or the like, an epoxy compound having a linear phosphorus-containing structure, an epoxy compound having a cyclic phosphorus-containing structure, an α-methylstilbene-type liquid crystal epoxy compound, a dibenzoyloxybenzene-type liquid crystal epoxy compound, an azophenyl-type liquid crystal epoxy compound, an azomethine phenyl-type liquid crystal epoxy compound, a binaphthyl-type liquid crystal epoxy compound, an azine-type epoxy compound, a glycidyl methacrylate copolymer-based epoxy compound (such as "CP-50S and CP-50M produced by NOF Corporation"), a copolymerized epoxy compound of cyclohexylmaleimide and glycidyl methacrylate, a bis(glycidyloxyphenyl)fluorine-type epoxy compound, and a bis(glycidyloxyphenyl)adamantane-type epoxy compound. One of these epoxy resins may be used alone, or two or more thereof may be used in combination.

Other than the epoxy compound containing at least two oxirane groups per molecule, an epoxy compound having an alkyl group at the β-position and containing at least two epoxy groups per molecule may be used. A compound containing an epoxy group substituted with an alkyl group at the β-position (more specifically, a β-alkyl-substituted glycidyl group or the like) is particularly preferred.

In the epoxy compound having an alkyl group at the β-position and containing at least an epoxy group, all of two or more epoxy groups contained per molecule may be a β-alkyl-substituted glycidyl group, or at least one epoxy group may be a β-alkyl-substituted glycidyl group.

Examples of the oxetane compound include an oxetane resin having at least two oxetanyl groups per molecule.

Specific examples thereof include polyfunctional oxetanes such as bis[(3-methyl-3-oxetanylmethoxy)methyl]ether, bis[(3-ethyl-3-oxetanylmethoxy)methyl]ether, 1,4-bis[(3-methyl-3-oxetanylmethoxy)methyl]benzene, 1,4-bis[(3-ethyl-3-oxetanylmethoxy)methyl]benzene, (3-methyl-3-oxetanyl)methyl acrylate, (3-ethyl-3-oxetanyl)methyl acrylate, (3-methyl-3-oxetanyl)methyl methacrylate, (3-ethyl-3-oxetanyl)methyl methacrylate, and oligomers or copolymers thereof; and ether compounds of a compound having an oxetane group and a hydroxyl group-containing compound such as novolak resin, poly(p-hydroxystyrene), cardo-type bisphenols, calixarenes, calixresorcinarenes and silsesquioxane. Other examples include a copolymer of an oxetane ring-containing unsaturated monomer and an alkyl(meth)acrylate.

Examples of the bismaleimide compound include 4,4'-diphenylmethanebismaleimide, bis-(3-ethyl-5-methyl-4-maleimidophenyl)methane and 2,2'-bis-[4-(4-maleimidophenoxy)phenyl]propane.

Examples of the cyanate compound include a bis A-type cyanate compound, a bis type cyanate compound, a cresol novolak-type cyanate compound and a phenol novolak-type cyanate compound.

As the crosslinking agent, melamine or a melamine derivative can be used.

Examples of the melamine derivative include methylolmelamine and an alkylated methylolmelamine (a compound obtained by etherifying a methylol group with methyl, ethyl, butyl or the like).

One kind of a crosslinking agent may be used alone, or two or more kinds of crosslinking agents may be used in combination. The crosslinking agent is preferably melamine or an alkylated methylolmelamine, more preferably a hexamethylated methylolmelamine, because these have good storage stability and are effective in enhancing the surface hardness of the photosensitive layer or the film strength itself of the cured film.

The polymerizable composition may or may not contain a crosslinking agent but in the case of containing a crosslinking agent, the content thereof is preferably from 1 to 40 mass %, more preferably from 3 to 20 mass %, based on the entire solid content by mass of the polymerizable composition of the present invention.

[9] Curing Accelerator

The polymerizable composition of the present invention may further contain a curing accelerator for the purpose of accelerating heat curing of the crosslinking agent such as epoxy compound and oxetane compound above.

Examples of the curing accelerator which can be used include an amine compound (e.g., dicyandiamide, benzyldimethylamine, 4-(dimethylamino)-N,N-dimethylbenzylamine, 4-methoxy-N,N-dimethylbenzylamine, 4-methyl-N,N-dimethylbenzylamine), a quaternary ammonium salt compound (e.g., triethylbenzylammonium chloride), a block isocyanate compound (e.g., dimethylamine), an imidazole derivative-containing bicyclic amidine compound or salt thereof (e.g., imidazole, 2-methylimidazole, 2-ethylimidazole, 2-ethyl-4-methylimidazole, 2-phenylimidazole, 4-phenylimidazole, 1-cyanoethyl-2-phenylimidazole, 1-(2-cyanoethyl)-2-ethyl-4-methylimidazole), a phosphorus compound (e.g., triphenylphosphine), a guanamine compound (e.g., melamine, guanamine, acetoguanamine, benzoguanamine), and an S-triazine derivative (e.g., 2,4-diamino-6-methacryloyloxyethyl-S-triazine, 2-vinyl-2,4-diamino-5-triazine, 2-vinyl-4,6-diamino-5-triazine•isocyanuric acid adduct, 2,4-diamino-6-methacryloyloxyethyl-5-triazine•isocyanuric acid adduct). One of these compounds may be used alone, or two or more thereof may be used in combination.

The curing accelerator is preferably melamine or dicyandiamide.

One kind of a curing accelerator may be used alone, or two or more kinds of curing accelerators may be used in combination.

The polymerizable composition may or may not contain a curing accelerator, but in the case of containing a curing accelerator, the content thereof is usually from 0.01 to 15 mass % based on the entire solid content of the polymerizable composition.

[10] Filler

The polymerizable composition of the present invention may further contain a filler. The filler which can be used in the present invention includes a spherical silica surface-treated with a silane coupling agent.

When the polymerizable composition of the present invention contains a filler, this is preferred because a pattern with high durability is obtained (this effect is pronounced particularly when higher durability is required of a solder resist as in the case where a metal wiring covered with a solder resist has a high wiring density).

By virtue of using a spherical silica surface-treated with a silane coupling agent, the polymerizable composition is enhanced in the thermal cycle test resistance and storage stability and, for example, even after passing through a sever atmosphere such as thermal cycle test, the same good profile as that immediately after pattern formation can be maintained.

The "spherical" in the spherical filler is sufficient if the particle is not in a needle, column or amorphous shape but is rounded, and the particle need not be necessarily "perfectly spherical", but a typical "spherical" shape is a "perfectly spherical" shape.

Whether the filler is spherical can be confirmed by the observation through a scanning electron microscope (SEM).

The volume average particle diameter of the primary particle of the filler is not particularly limited and may be appropriately selected according to the purpose but is preferably from 0.05 to 3 μm, more preferably from 0.1 to 1 μm. When the average particle diameter of the primary particle of the filler is in the range above, reduction in the processability due to development of thixotropy is suppressed and the maximum particle diameter is kept from increasing, which is advantageous in that defect generation due to attachment of an extraneous material to the cured film formed or non-uniformity of the coating film is prevented.

The volume average particle diameter of the primary particle of the filler can be measured by a dynamic light scattering particle diameter distribution analyzer.

The filler can be dispersed by using the above-described dispersant or binder. As described above, in view of curability, an alkali-soluble binder polymer having a crosslinking group in the side chain is particularly preferred.

It is preferred that the polymerizable composition of the present invention further contains at least two kinds of fillers having different volume average particle diameters of primary particles.

—Surface Treatment—

The surface treatment of the filler is described below. The surface treatment of the filler is not particularly limited and may be appropriately selected according to the purpose, but a treatment of covering silica with a silane coupling agent is preferred.

—Silane Coupling Agent—

The silane coupling agent used for the surface treatment of the filler is not particularly limited and may be appropriately selected according to the purpose, but at least one functional group selected from an alkoxysilyl group, a chlorosilyl group and an acetoxysilyl group (hereinafter, sometimes referred to as a "first functional group") and at least one functional group selected from a (meth)acryloyl group, an amino group and an epoxy group (hereinafter, sometimes referred to as a "second functional group") are preferred. It is more preferred that the second functional group is a (meth)acryloyl group or an amino group. The second functional group is still more preferably a (meth)acryloyl group. When the second functional group is a (meth)acryloyl group, this is advantageous in view of storage stability and TCT resistance.

A silane coupling agent described in JP-B-7-68256 containing, as the first functional group, at least one member selected from an alkoxysilyl group, a chlorosilyl group and an acetoxysilyl group, and, as the second functional group, at least one member selected from an imidazole group, an alkylimidazole group and a vinylimidazole group, can be also preferably used.

The silane coupling agent is not particularly limited, but preferred examples thereof include a γ-aminopropyltriethoxysilane, N-(β-aminoethyl)-γ-aminopropyltrimethoxysilane, N-(β-aminoethyl)-γ-aminopropylmethyldimethoxysilane, γ-glycidoxypropyltrimethoxysilane, γ-glycidoxypropylmethyldimethoxysilane, γ-methacryloxypropyltrimethoxysilane, γ-methacryloxypropylmethyldimethoxysilane, α-[[3-trimethoxysilyl)propoxy]methyl]-imidazole-1-ethanol described in JP-B-7-68256, 2-ethyl-4-methyl-α-[[3-(trimethoxysilyl)propoxy]methyl]-imidazole-1-ethanol, 4-vinyl-α-[[3-(trimethoxysilyl)propoxy]methyl]-imidazole-1-ethanol, 2-ethyl-4-methylimidazopropyltrimethoxysilane, and salts, intramolecular condensates and intermolecular condensates thereof. One kind of such a silane coupling agent may be used alone, or two or more kinds thereof may be used in combination.

The surface treatment of the spherical silica with the silane coupling agent above may be previously performed for only the spherical silica (in this case, hereinafter, the treatment is sometimes referred to as a "pretreatment") or may be formed together with a part or all of other fillers contained in the polymerizable composition.

The method for performing the treatment is not particularly limited, and examples thereof include a dry method, an aqueous solution method, an organic solvent method and a spraying method. The temperature when performing the pretreatment is not particularly limited but is preferably from ordinary temperature to 200° C.

At the pretreatment, it is also preferred to add a catalyst. The catalyst is not particularly limited, but examples thereof include an acid, a base, a metal compound and an organic metal compound.

The amount added of the silane coupling agent when performing the pretreatment is not particularly limited but is preferably from 0.01 to 50 parts by mass, more preferably from 0.05 to 50 parts by mass, per 100 parts by mass of the spherical silica. When the amount added is in this range, a surface treatment sufficient to bring out the effect is attained and at the same time, reduction in the handleability due to aggregation of spherical silica after treatment is suppressed.

The silane coupling agent has an action of enhancing the adherence between the substrate and the photosensitive layer, because the first functional group reacts with an active group on the substrate surface and spherical silica surface as well as in the binder, and the second functional group further reacts with a carboxyl group and an ethylenically unsaturated group in the binder. On the other hand, the silane coupling agent above has high reactivity and therefore, if the silane coupling agent itself is added to the polymerizable composition, due to its diffusing action, mainly the second functional group is reacted or deactivated during storage, giving rise to short shelf life or pot life.

However, when a spherical silica which is pretreated with a silane coupling agent as above is used, the diffusing action is suppressed, greatly improving the problem in the shelf life or pot life, and a one-liquid system can be also established. Furthermore, when the pretreatment is applied to the spherical silica, since the conditions such as stirring condition, temperature condition and use of a catalyst can be freely selected, the rate of reaction between the first functional group of the silane coupling agent and the active group in the spherical silica can be significantly increased as compared with the case of adding the spherical silica without performing the pretreatment. In turn, very good results can be obtained particularly in terms of severe characteristics required, such as electroless gold plating, electroless solder plating and humidity resistance load test. Also, by performing the pretreatment, the amount of the silane coupling agent used can be reduced and the shelf life and pot life can be more improved.

Examples of the spherical silica surface-treated with a silane coupling agent, which can be used in the present invention, include FB and SFP Series of Denki Kagaku Kogyo Kabushiki Kaisha; 1-FX of Tatsumori Ltd.; HSP Series of Toagosei Co., Ltd.; and SP Series of Fuso Chemical Co., Ltd.

The polymerizable composition may or may not contain a filler, but in the case of containing a filler, although the content of the filler is not particularly limited and may be appropriately selected according to the purpose, the content is preferably from 1 to 60 mass % based on the entire solid content by mass of the polymerizable composition. When the amount added is in this range, a sufficient reduction in the linear expansion coefficient is achieved and the cured film formed is prevented from embrittlement and in turn, can sufficiently exert its function as a protective film of wiring when wiring is formed using a permanent pattern.

[11] Elastomer

The polymerizable composition of the present invention may further contain an elastomer.

By virtue of containing an elastomer, when the polymerizable composition is used for a solder resist, the adherence to a conductive layer of a printed wiring board can be more enhanced and at the same time, the cured film can be more increased in the heat resistance, heat shock resistance, flexibility and toughness.

The elastomer which can be used in the present invention is not particularly limited and may be appropriately selected according to the purpose, and examples thereof include a styrene-based elastomer, an olefin-based elastomer, a urethane-based elastomer, a polyester-based elastomer, a polyamide-based elastomer, an acrylic elastomer and a silicone-based elastomer. Such an elastomer is consists of a hard segment component and a soft segment component, where in general, the former contributes to heat resistance and strength and the latter contributes to flexibility and toughness. Among these elastomers, a polyester-based elastomer is advantageous in view of compatibility with other materials.

Examples of the styrene-based elastomer include a styrene-butadiene-styrene block copolymer, a styrene-isoprene-styrene block copolymer, a styrene-ethylene-butylene-styrene block copolymer and a styrene-ethylene-propylene-styrene block copolymer. As the component constituting the styrene-based elastomer, other than styrene, a styrene derivative such as α-methylstyrene, 3-methylstyrene, 4-propylstyrene and 4-cyclohexylstyrene can be used. Specific examples thereof include Tufprene, Solprene T, Asaprene T, Tuftec (all produced by Asahi Chemical Industry Co., Ltd.), Elastomer AR (produced by Aronkasei Co., Ltd.), Kraton G, Kaliflex (both produced by Shell Chemicals Japan Ltd.), JSR-TR, TSR-SIS, DYNARON (all produced by Japan Synthetic Rubber Co., Ltd.), Denka STR (produced by Denki Kagaku Kogyo Kabushiki Kaisha), Quintac (produced by ZEON Corp.), TPE-SB Series (produced by Sumitomo Chemical Co., Ltd.), RABALON (produced by Mitsubishi Chemical Corp.), SEPTON, HYBRAR (both produced by Kuraray Co., Ltd.), Sumiflex (produced Sumitomo Bakelite Co., Ltd.), LEOSTOMER and ACTYMER (both produced by Riken Vinyl Industry Co., Ltd.).

The olefin-based elastomer is a copolymer of an α-olefin having a carbon number of 2 to 20 such as ethylene, propylene, 1-butene, 1-hexene and 4-methyl-pentene, and examples thereof include an ethylene-propylene copolymer (EPR) and an ethylene-propylene-diene copolymer (EPDM). Other examples of the olefin-based elastomer include a copolymer of an α-olefin and a non-conjugated diene having a carbon number of 2 to 20, such as dicyclopentadiene, 1,4-hexadiene, cyclooctadiene, methylene norbornene, ethylidene norbornene, butadiene and isoprene, and an epoxidized polybutadiene. The olefin-based elastomer further includes, for example, a carboxyl-modified NBR obtained by copolymerizing a methacrylic acid with a butadiene-acrylonitrile copolymer. In addition, the olefin-based elastomer includes an ethylene-α-olefin copolymer rubber, an ethylene-α-olefin-non-conjugated diene copolymer rubber, a propylene-α-olefin copolymer rubber, a butene-α-olefin copolymer rubber, and the like.

Specific examples of the olefin-based elastomer include MILASTOMER (produced by Mitsui Petrochemical Industries, Ltd.), EXACT (produced by Exxon Chemical Corp.), ENGAGE (produced by Dow Chemical Co.), hydrogenated styrene-butadiene rubber "DYNABON HSBR" (produced by Japan Synthetic Rubber Co., Ltd.), butadiene-acrylonitrile copolymers "NBR Series" (produced by Japan Synthetic Rubber Co., Ltd.), crosslinking point-containing butadiene-acrylonitrile copolymer "XER Series" modified with carboxyl group at both terminals (produced by Japan Synthetic Rubber Co., Ltd.), and epoxidized polybutadiene "BF-1000" with polybutadiene being partially epoxidized (produced by Nippon Soda Co., Ltd.).

The urethane-based elastomer consists of two structural units, that is, a hard segment composed of a low molecular (short chain) diol and a diisocyanate, and a soft segment composed of a polymer (long chain) diol and a diisocyanate. Examples of the polymer (long chain) diol include polypropylene glycol, polytetramethylene oxide, poly(1,4-butylene adipate), poly(ethylene-1,4-butylene adipate), polycaprolactone, poly(1,6-hexylene carbonate) and poly(1,6-hexylene-neopentylene adipate). The number average molecular weight of the polymer (long chain) diol is preferably from 500 to 10,000. Examples of the low molecular (short chain) diol include ethylene glycol, propylene glycol, 1,4-butanediol and bisphenol A. The number average molecular weight of the short chain diol is preferably from 48 to 500. Specific examples of the urethane-based elastomer include PANDEX T-2185, T-2983N (both produced by Dainippon Ink and Chemicals, Inc.), and Silactone E790.

The polyester-based elastomer is obtained by polycondensing a dicarboxylic acid or a derivative thereof and a diol compound or a derivative thereof. Specific examples of the dicarboxylic acid include an aromatic dicarboxylic acid such as terephthalic acid, isophthalic acid and naphthalenedicarboxylic acid, an aromatic dicarboxylic acid formed by substituting for a hydrogen atom of the aromatic ring of the dicarboxylic acid above with a methyl group, an ethyl group, a phenyl group or the like, an aliphatic dicarboxylic acid having a carbon number of 2 to 20 such as adipic acid, sebacic acid and dodecanedicarboxylic acid, and an alicyclic dicarboxylic acid such as cyclohexanedicarboxylic acid. One of these compounds may be used alone, or two or more thereof may be used. Specific examples of the diol compound include an aliphatic diol and an alicyclic diol, such as ethylene glycol, 1,3-propanediol, 1,4-butanediol, 1,6-hexanediol, 1,10-decanediol and 1,4-cyclohexanediol; bisphenol A; bis-(4-hydroxyphenyl)methane; bis-(4-hydroxy-3-methylphenyl)propane; and resorcin. One of these compounds may be used alone, or two or more thereof may be used. Also, a multi-block copolymer where an aromatic polyester (e.g. polybutylene terephthalate) moiety works as the hard segment component and an aliphatic polyester (e.g. polytetramethylene glycol) moiety works as the soft segment component, may be used. There are polyester elastomers of various grades according to the kind, ratio, molecular weight difference or the like of the hard and soft segments. Specific examples of the polyester-based elastomer include Hytrel (produced by Du Pont-Toray Co., Ltd.), Pelprene (produced by Toyobo Co., Ltd.) and Espel (produced by Hitachi Chemical Co., Ltd.).

The polyamide-based elastomer consists of a hard segment composed of polyamide and a soft segment composed of polyether or polyester and are roughly classified into two types, that is, a polyether block amide type and a polyetherester block amide type. Examples of the polyamide include polyamide 6, polyamide 11 and polyamide 12. Examples of the polyether include polyoxyethylene, polyoxypropylene and polytetramethylene glycol. Specific examples of the polyamide-based elastomer include UBE Polyamide Elastomer (produced by Ube Industries, Ltd.), DAIAMID (produced by Daicel-Huels Ltd.), PEBAX (produced by Toray Industries, Inc.), Grilon ELY (EMS-CHEMIE (Japan) Ltd.), Novamid (produced by Mitsubishi Chemical Corp.), Grilax (produced by Dainippon Ink and Chemicals, Inc.).

The acrylic elastomer is obtained by copolymerizing an acrylic acid ester such as ethyl acrylate, butyl acrylate, methoxyethyl acrylate and ethoxyethyl acrylate, an epoxy group-containing monomer such as glycidyl methacrylate and alkyl glycidyl ether, and/or a vinyl-based monomer such as acrylonitrile and ethylene. Examples of the acrylic elastomer includes an acrylonitrile-butyl acrylate copolymer, an acrylonitrile-butyl acrylate-ethyl acrylate copolymer, and an acrylonitrile-butyl acrylate-glycidyl methacrylate copolymer.

The silicone-based elastomer is mainly composed of an organopolysiloxane and classified into a polydimethylsiloxane type, a polymethylphenylsiloxane type and a polydiphenylsiloxane type. An organopolysiloxane partially modified with a vinyl group, an alkoxy group or the like may be used. Specific examples of the silicone-based elastomer include KE Series (produced by Shin-Etsu Chemical Co., Ltd.), SE Series, CY Series and SH Series (all produced by Dow Corning Toray Silicone Co., Ltd.).

Other than these elastomers, a rubber-modified epoxy resin can be used. The rubber-modified epoxy resin can be obtained by modifying a part or all of epoxy groups of, for example, the above-described bisphenol F-type epoxy resin, bisphenol A-type epoxy resin, salicylaldehyde-type epoxy resin, phenol novolak-type epoxy resin or cresol novolak-type epoxy resin, with both-terminal carboxyl group-modified butadiene-acrylonitrile rubber, terminal amino-modified silicone rubber, or the like.

Among elastomers, in view of shear adherence and heat shock resistance, a both-terminal carboxyl group-modified butadiene-acrylonitrile copolymer, Espel which is a hydroxyl group-containing polyester-based elastomer (Espel 1612 and 1620, produced by Hitachi Chemical Co., Ltd.), and an epoxidized polybutadiene are preferred.

The polymerizable composition of the present invention may or may not contain an elastomer, but in the case of containing an elastomer, the content thereof based on the entire solid content by mass of the polymerizable composition is not particularly limited and may be appropriately selected according to the purpose but is preferably from 0.5 to 30 mass %, more preferably from 1 to 10 mass %, still more preferably from 3 to 8 mass %, based on the solid content. When the content is in the preferred range above, this is advantageous in that the shear adhesion and heat shock resistance can be more enhanced.

[12] Surfactant

In the polymerizable composition of the present invention, from the standpoint of more improving the coatability, various surfactants may be added. As the surfactant, various surfactants such as fluorine-containing surfactant, nonionic surfactant, cationic surfactant, anionic surfactant and silicone-containing surfactant may be used.

In particular, by virtue of containing a fluorine-containing surfactant, the liquid property (particularly fluidity) when the polymerizable composition of the present invention is prepared as a coating solution can be further enhanced and in turn, uniformity of the coating thickness and liquid saving efficiency can be more improved.

That is, in the case where a film is formed using a coating solution to which the polymerizable composition containing a fluorine-containing surfactant is applied, the interfacial tension between the coated surface and the coating solution is reduced, whereby wettability of the coated surface is improved and coatability on the coated surface is enhanced. Therefore, even when a thin film of about several μm is formed using a smaller amount of solution, film formation with reduced thickness unevenness and uniform thickness can be advantageously performed.

The fluorine content in the fluorine-containing surfactant is preferably from 3 to 40 mass %, more preferably from 5 to 30 mass %, still more preferably from 7 to 25 mass %. A fluorine-containing surfactant whose fluorine content is in the range above is effective in view of uniformity of the coating film thickness or liquid saving efficiency and also exhibits good solubility in the polymerizable composition.

Examples of the fluorine-containing surfactant include MEGAFACE F171, MEGAFACE F172, MEGAFACE F173, MEGAFACE F176, MEGAFACE F177, MEGAFACE F141, MEGAFACE F142, MEGAFACE F143, MEGAFACE F144, MEGAFACE R30, MEGAFACE F437, MEGAFACE F475, MEGAFACE F479, MEGAFACE F482, MEGAFACE F554, MEGAFACE F780, MEGAFACE F781 (all produced by DIC Corporation), FLORAD FC430, FLORAD FC431, FLORAD FC171 (all produced by Sumitomo 3M Ltd.), SURFLON S-382, SURFLON SC-101, SURFLON SC-103, SURFLON SC-104, SURFLON SC-105, SURFLON SC-1068, SURFLON SC-381, SURFLON SC-383, SURFLON S-393, SURFLON KH-40 (all produced by Asahi Glass Co., Ltd.), and Solsperse 20000 (produced by Zeneca Co., Ltd.).

Specific examples of the nonionic surfactant include polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and sorbitan fatty acid esters (such as Pluronic L10, L31, L61, L62, 10R5, 17R2 and 25R2, and Tetronic 304, 701, 704, 901, 904 and 150R1, all produced by BASF).

Specific examples of the cationic surfactant include a phthalocyanine derivative (EFKA-745, trade name, produced by Morishita Sangyo K.K.), Organosiloxane Polymer KP341 (produced by Shin-Etsu Chemical Co., Ltd.), (meth)acrylic acid (co)polymers Polyflow No. 75, No. 90 and No. 95 (produced by Kyoei Chemical Co., Ltd.), and W001 (produced by Yusho Co Ltd.).

Specific examples of the anionic surfactant include W004, W005 and W017 (produced by Yusho Co Ltd.).

Examples of the silicone-containing surfactant include "TORAY SILICONE DC3PA", "TORAY SILICONE SH7PA", "TORAY SILICONE DC11PA", "TORAY SILICONE SH21PA", "TORAY SILICONE SH28PA", "TORAY SILICONE SH29PA", "TORAY SILICONE SH30PA" and "TORAY SILICONE SH8400" produced by Dow Corning Toray Silicone Co., Ltd.; "TSF-4440", "TSF-4300", "TSF-4445", "TSF-4460" and "TSF-4452" produced by Momentive Performance Materials Inc.; "KP341", "KF6001" and "KF6002" produced by Shin-Etsu Silicone; and "BYK-323" and "BYK-330" produced by Byk-Chemie.

One of a surfactant may be used alone, or two or more kinds of surfactants may be combined.

The polymerizable composition may or may not contain a surfactant, but in the case of containing a surfactant, the content thereof is preferably from 0.001 to 1 mass %, more preferably from 0.01 to 0.1 mass %, based on the entire solid content by mass of the polymerizable composition of the present invention.

[13] Other Components

In the polymerizable composition of the present invention may contain, in addition to the above-described essential components and preferred additives, other components may be appropriately selected and used according to the purpose as long as the effects of the present invention are not impaired.

Examples of other components which can be used in combination include a heat curing accelerator, a thermal polymerization inhibitor, a plasticizer and a coloring agent (coloring pigment or dye). Furthermore, an adherence accelerator to base material surface, and other auxiliary agents (such as electrically conductive particle, filler, defoaming agent, flame retardant, leveling agent, release accelerator, antioxidant, perfume, surface tension adjustor and chain transfer agent) may be used in combination.

By appropriately incorporating such a component, the properties of the objective solder resist, such as stability, photographic effect and film physical property, can be adjusted.

Details of the thermal polymerization inhibitor are described are described, for example, in paragraphs [0101] to [0102] of JP-A-2008-250074.

Details of the plasticizer are described in paragraphs [0103] and [0104] of JP-A-2008-250074.

Details of the coloring agent are described are described, for example, in paragraphs and [0106] of JP-A-2008-250074 and paragraphs [0038] and [0039] of JP-A-2009-205029.

Details of the adherence accelerator are described are described, for example, in paragraphs [0107] to [0109] of JP-A-2008-250074.

Additives described in these publications all are usable in the polymerizable composition of the present invention.

In the thus-obtained polymerizable composition, the solid content concentration is preferably from 5 to 90 mass %, more preferably from 20 to 80 mass %, and most preferably from 40 to 60 mass %.

The usage of the polymerizable composition of the present invention is not particularly limited, but examples thereof include a solder resist, a light-blocking film for the back surface of a silicon substrate in a solid-stage imaging device, and a light-blocking film for a waver level lens, with a solder resist being preferred.

In the case where the polymerizable composition of the present invention is used for a solder resist, in order to form a coating film having a relatively large thickness, the solid content concentration is preferably from 30 to 80 mass %, more preferably from 35 to 70 mass %, and most preferably from 40 to 60 mass %.

Also, the viscosity of the polymerizable composition of the present invention is preferably from 1 to 3,000 mPa·s, more preferably from 10 to 2,000 mPa·s, and most preferably from 100 to 1,500 mPa·s.

In the case where the polymerizable composition of the present invention is used for a solder resist, in view of thick film formability and uniform coatability, the viscosity is preferably from 10 to 3,000 mPa·s, more preferably from 500 to 1,500 mPa·s, and most preferably from 700 to 1,400 mPa·s.

The present invention also relates to a photosensitive layer formed using the polymerizable composition of the present invention. The photosensitive layer of the present invention is formed of the polymerizable composition of the present invention and therefore, this photosensitive layer exhibits high light-blocking effect in the infrared region and high light transparency in the visible region and can form a pattern having a desired profile and being excellent in the durability (for example, durability to high temperature and high humidity, and adherence to substrate).

The present invention also relates to a permanent pattern formed using the polymerizable composition of the present invention. The permanent pattern of the present invention is obtained by subjecting the photosensitive layer formed of the polymerizable composition of the present invention to exposure and alkali development and thanks to use of the polymerizable composition of the present invention, this pattern exhibits high light-blocking effect in the infrared region and high light transparency in the visible region and has a desired profile as well as excellent durability (for example, durability to high temperature and high humidity, and adherence to substrate)

Furthermore, the present invention also relates to a pattern forming method comprising, in order, a step of forming a photosensitive layer by using the photopolymerizable composition of the present invention, a step of pattern-exposing the photosensitive layer to cure the exposed area, and a step of removing the unexposed area by alkali development to form a permanent pattern.

The method for forming a permanent pattern is described in detail below by referring to a patterned solder resist formed using the polymerizable composition of the present invention. However, the descriptions relating to the kind and amount used of the solvent for preparation of a coating solution, the coating method of the coating solution, the thickness of the photosensitive layer, and the exposure and other steps are not limited to the solder resist. Here, a case of forming a photosensitive layer (polymerizable composition layer) by using the polymerizable composition is described as an example.

—Photosensitive Layer—

For forming a patterned solder resist (solder resist pattern), first, a photosensitive layer is formed using the polymerizable composition of the present invention, the photosensitive layer is not particularly limited as long as it is a layer formed of the above-described polymerizable composition. The film thickness, multilayer structure and the like can be appropriate selected according to the purpose.

The method for forming the photosensitive layer includes a method of dissolving, emulsifying or dispersing the polymerizable composition of the preset invention in water or a solvent to prepare a coating solution, applying the coating solution directly, and drying the coating.

The solvent for the preparation of the coating solution is not particularly limited, and a solvent capable of uniformly dissolving or dispersing each component of the polymerizable composition of the present invention may be appropriately selected according to the purpose. Examples thereof include alcohols such as methanol, ethanol, normal-propanol, isopropanol, normal-butanol, secondary-butanol, and normal-hexanol; ketones such as acetone, methyl ethyl ketone, methyl isobutyl ketone, cyclohexanone, diisobutyl ketone, cyclohexanone and cyclopentanone; esters such as ethyl acetate, butyl acetate, normal-amyl acetate, methyl sulfate, ethyl propionate, dimethyl phthalate, ethyl benzoate, propylene glycol monomethyl ether acetate and methoxypropyl acetate; aromatic hydrocarbons such as toluene, xylene, benzene and ethylbenzene; halogenated hydrocarbons such as carbon tetrachloride, trichloroethylene, chloroform, 1,1,1-trichloroethane, methylene chloride and monochlorobenzene; ethers such as tetrahydrofuran, diethyl ether, ethylene glycol monomethyl ether, ethylene glycol monoethyl ether, 1-methoxy-2-propanol and propylene glycol monomethyl ether; dimethylformamide, dimethylacetoamide, dimethylsulfoxide, and sulfolane. One of these solvents may be used alone, or two or more thereof may be used in combination. Also, a known surfactant may be added.

The method for applying the coating solution on a support is not particularly limited and may be appropriately selected according to the purpose, and examples thereof include a method of applying the coating solution by using a spin coater, a slit spin coater, a roll coater, a die coater or a curtain coater.

The drying conditions of the coating film vary depending on respective components, the kind of solvent, the amount used, and the like, but the drying is usually performed at a temperature of 60 to 150° C. for 30 seconds to 15 minutes.

The thickness of the photosensitive layer is not particularly limited and may be appropriately selected according to the purpose but, for example, is preferably from 1 to 100 more preferably from 2 to 50 µm, still more preferably from 4 to 30 µm.

(Solder Resist Pattern Forming Method)

The method for forming a solder resist permanent pattern by using the polymerizable composition for solder resist of the present invention comprises at least an exposure step and usually further contains a developing step and other steps, where appropriate conditions are selected as needed. Incidentally, the "exposure" as used in the present invention includes not only exposure to light at various wavelengths but also irradiation with radiation such as electron beam and X-ray.

<Exposure Step>

The exposure step is a step of exposing the photosensitive layer formed of the polymerizable composition through a mask, and in this step, only the region irradiated with light is cured.

The exposure is preferably performed by the irradiation with radiation, and as the radiation usable at the exposure, electron beam, KrF, ArF, ultraviolet light such as g-line, K-line and i-line, or visible light is preferably used. In particular, KrF, g-line, h-line and i-line are preferred.

Examples of the exposure system include stepper exposure and exposure to a high-pressure mercury lamp.

The exposure dose is preferably from 5 to 3,000 mJ/cm$^2$, more preferably from 10 to 2,000 mJ/cm$^2$, and most preferably from 50 to 1,000 mJ/cm$^2$.

<Other Steps>

Other steps are not particularly limited and can be appropriately selected according to the purpose. Examples thereof include a substrate surface treating step, a developing step, a curing treatment step and a post-exposure step.

<Developing Step>

Subsequent to the exposure step, an alkali development processing (developing step) is performed to dissolve out the area not irradiated with light in the exposure step, whereby only the photocured area is allowed to remain and a patterned solder resist having light-blocking effect is formed.

As the developer, an organic alkali developer causing no damage on the underlying circuit is preferred. The development temperature is usually from 20 to 40° C., and the development time is from 10 to 180 seconds.

As the alkali used for the developer, for example, an aqueous alkaline solution obtained by diluting an organic alkaline compound such as aqueous ammonia, ethylamine, diethylamine, dimethylethanolamine, tetramethylammonium hydroxide, tetraethylammonium hydroxide, choline, pyrrole, piperidine and 1,8-diazabicyclo-[5,4,0]-7-undecene, with pure water to have a concentration of generally from 0.001 to 10 mass %, preferably from 0.01 to 1 mass %, is used. Incidentally, when a developer composed of such an aqueous alkaline solution is used, washing (rinsing) with pure water is generally performed after the development.

<Curing Treatment Step>

The curing treatment step is a step of, if desired, applying a curing treatment to the photosensitive layer in the formed pattern, after the developing step. By performing this treatment, the mechanical strength of the permanent pattern is enhanced.

The curing treatment step is not particularly limited and may be appropriately selected according to the purpose, and suitable examples thereof include an entire surface exposing treatment and an entire surface heating treatment.

Examples of the method for the entire surface exposing treatment include a method where the entire surface of the laminate having formed therein the patterned photosensitive layer is exposed after the developing step. Thanks to entire surface exposure, curing of polymerization components in the polymerizable composition forming the photosensitive layer is accelerated and curing of the permanent pattern further proceeds, whereby the mechanical strength and durability are improved.

The apparatus for performing the entire surface exposure is not particularly limited and may be appropriately selected according to the purpose, but preferred examples thereof include a UV exposing machine such as ultrahigh-pressure mercury lamp.

Also, the method for the entire surface heating treatment includes a method where the entire surface of the laminate having formed therein the patterned photosensitive layer is heated after the developing step. Thanks to the entire surface heating, the film strength of the pattern is enhanced.

The heating temperature at the entire surface heating is preferably from 120 to 250° C., more preferably from 120 to 250° C. When the heating temperature is 120° C. or more, the film strength is increased by the heat treatment, and when the heating temperature is 250° C. or less, the resin in the polymerizable composition can be prevented from decomposing to weaken and embrittle the film quality.

The heating time in the entire surface heating is preferably from 3 to 180 minutes, more preferably from 5 to 120 minutes.

The apparatus for performing the entire surface heating is not particularly limited and may be appropriately selected from conventional apparatuses according to the purpose, and examples thereof include a dry oven, a hot plate and an IR heater.

The thus-formed patterned resist has excellent infrared-shielding property and therefore, its application range is wide. The polymerizable composition of the present invention is excellent in the light-shielding property in the infrared region and light transparency in the ultraviolet to visible regions, enabling formation of a pattern having an excellent profile, and the formed pattern (cured film) exhibits excellent infrared-shielding property. Therefore, the polymerizable composition is useful in forming a solder resist for a device with a photodiode having sensitivity even to the infrared region, particularly, a solid-state imaging device.

As described above, the polymerizable composition of the present invention is useful in forming not only a solder resist but also a light-blocking film for the back surface of a silicon substrate in a solid-state imaging device or a light-blocking film for a wafer-level lens.

In this way, the present invention also relates to a solid-state imaging device having a permanent pattern formed of the polymerizable composition of the present invention.

The solid-state imaging device according to an embodiment of the present invention is described below by referring to FIGS. 1 and 2, but the present invention is not limited to the following specific example.

Figure 2:
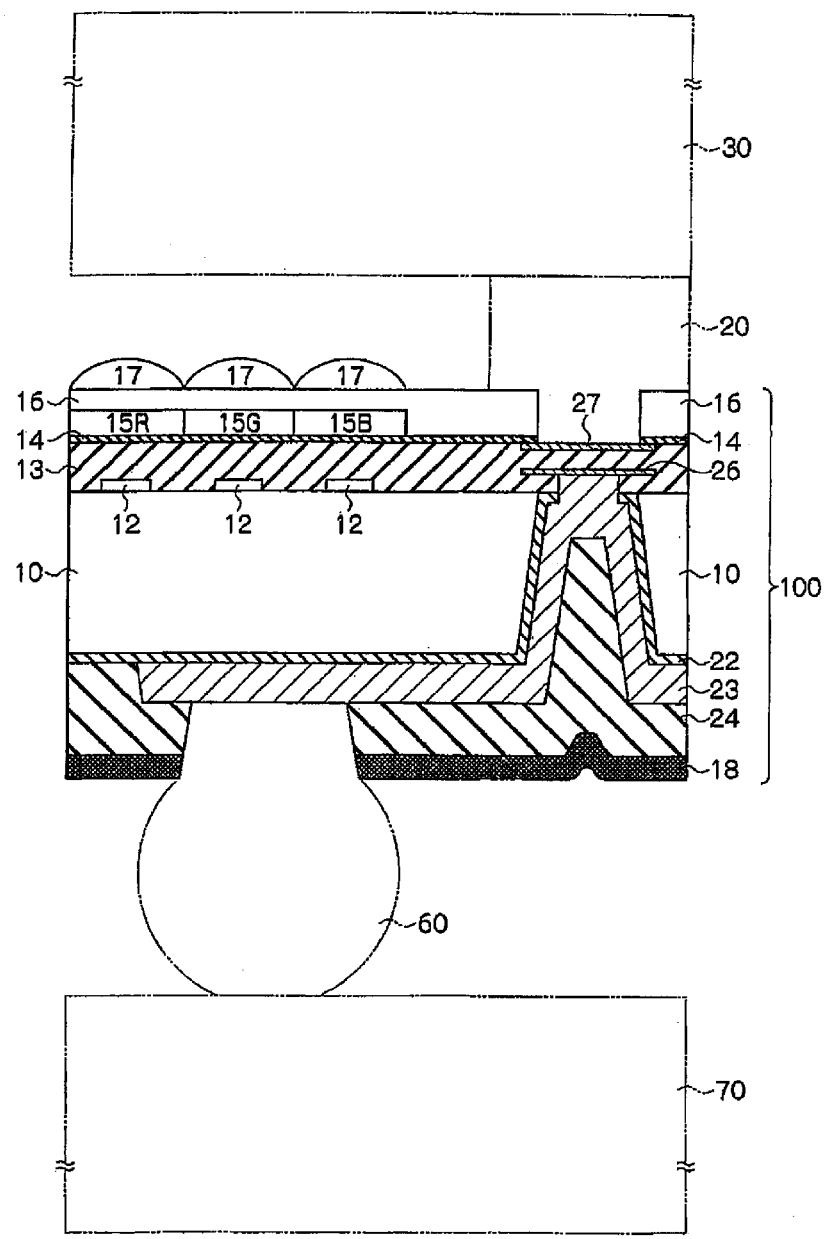
FIG. 2 is a schematic cross-sectional view showing the solid-state imaging device according to an exemplary embodiment of the present invention.

Incidentally, portions common between FIG. 1 and FIG. 2 are indicated by a common reference numeral or sign.

Also, in the description, the "top", "above" and "upper side" indicate a side farther from the silicon substrate 10, and "bottom", "below" and "lower side" indicate a side closer to the silicon substrate 10.

FIG. 1 is a schematic cross-sectional view showing a configuration of a camera module equipped with a solid-state imaging device according to a specific example of the embodiment above.

A camera module 200 shown in FIG. 1 is connected to a circuit substrate 70 as a mounting substrate through a solder ball 60 as a connection member.

More specifically, the camera module 200 is configured to comprise a solid-state imaging device substrate 100 having an image-forming device part on a first major surface of a silicon substrate, a glass substrate 30 (light-transmitting substrate) disposed on the upper side of the first major surface of the solid-state imaging device substrate 100, an infrared cut filter 42 disposed above the glass substrate 30, a lens holder 50 having an imaging lens 40 and being disposed above the glass substrate 30 and the infrared cut filter 42, and a light-blocking and electromagnetic shield 44 disposed to surround the periphery of the solid-state imaging device substrate 100 and the glass substrate 30. Respective members are adhered using adhesives 20, 41, 43 and 45.

In the camera module 200, incident light hν from the outside sequentially passes through the imaging lens 40, the infrared cut filter 42 and the glass substrate 30 and reaches the imaging device part of the solid-state imaging device substrate 100.

Also, the camera module 200 is connected to a circuit board 70 through a solder ball 60 (connection material) on the second major surface side of the solid-state imaging device substrate 100.

FIG. 2 is an enlarged cross-sectional view of the solid-state imaging device substrate 100 in FIG. 1.

The solid-state imaging device substrate 100 is configured to comprise a silicon substrate 10 as a base body, an imaging device 12, an interlayer insulating film 13, a base layer 14, a red color filter 15R, a green color filter 15G, a blue color filter 15B, an overcoat 16, a microlens 17, a light-blocking film 18, an insulating film 22, a metal electrode 23, a solder resist layer 24, an internal electrode 26, and a device surface electrode 27.

The solder resist layer 24 may be omitted.

First, the configuration on the first major surface side of the solid-state imaging device substrate 100 is mainly described below.

As shown in FIG. 2, an imaging device part where a plurality of imaging devices 12 such as CCD and CMOS are two-dimensionally arrayed is provided on the first major surface side of a silicon substrate 10 which is the base body of the solid-state imaging device substrate 100.

An interlayer insulating film 13 is formed on the imaging device 12 in the imaging device part, and a base layer 14 is formed on the interlayer insulating film 13. Furthermore, a red color filter 15R, a green color filter 15G and a blue color filter 15B (hereinafter, these are sometimes collectively referred to as a "color filter 15") corresponding to respective imaging devices 12 are disposed on the base layer 14.

A light-blocking film not shown may be provided in the boundaries of the red color filter 15R, the green color filter 15G and the blue color filter 15B and in the periphery of the imaging device part. This light-blocking film can be produced, for example, using a known black color resist.

An overcoat 16 is formed on the color filter 15, and a microlens 17 corresponding to the imaging device 12 (color filter 15) is formed on the overcoat 16.

In the periphery of the imaging device on the first major surface side, a peripheral circuit (not shown) and an internal electrode 26 are provided, and the internal electrode 26 is electrically connected to the imaging device 12 through the peripheral circuit.

Furthermore, a device surface electrode 27 is formed on the internal electrode 26 through an interlayer insulating film 13. In the interlayer insulating film 13 between the internal electrode 26 and the device surface electrode 27, a contact plug (not shown) for electrically connecting these electrode is formed. The device surface electrode 27 is used for voltage application and signal reading though the contact plug and the internal electrode 26.

A base layer 14 is formed on the device surface electrode 27, and an overcoat 16 is formed on the base layer 14. The base layer 14 and the overcoat 16 formed on the device surface electrode 27 are opened to form a pad opening and expose a part of the device surface electrode 27.

This is the configuration on the first major side of the solid-state imaging device substrate 100.

On the first major side of the solid-state imaging device substrate 100, an adhesive 20 is provided in the periphery of the imaging device part, and the solid-state imaging device substrate 100 and the glass substrate 30 are adhered through the adhesive 20.

The silicon substrate 10 has a through-hole penetrating the silicon substrate 10, and a penetrating electrode defining a part of the metal electrode 23 is provided in the through-hole. The imaging device part and the circuit board 70 are electrically connected by the penetrating electrode.

The configuration on the second major surface side of the solid-state imaging device substrate 100 is mainly described below.

On the second major surface side, an insulating film 22 is formed from the second major surface to the inner wall of the through-hole.

On the insulating film 22, a metal electrode 23 patterned to extend from the region on the second major surface of the silicon substrate 10 to the inside of the through hole is provided. The metal electrode 23 is an electrode for connecting the imaging device part in the solid-state imaging device substrate 100 and the circuit board 70.

The penetrating electrode is the portion formed inside the through hole, out of the metal electrode 23. The penetrating electrode penetrates the silicon substrate 10 and a part of the interlayer insulating film and reaches the lower side of the internal electrode 26 to be electrically connected to the internal electrode 26.

Also, on the second major surface side, a solder resist layer 24 (protective insulating film) covering the second major surface on which the metal electrode 23 is formed, and having an opening to expose a part of the metal electrode 23 is provided.

Furthermore, on the second major surface side, a light-blocking film 18 covering the second major surface on which the solder resist layer 24 is formed, and having an opening to expose a part of the metal electrode 23 is provided.

In this configuration, (1) a light-blocking solder resist layer where the light-blocking layer 18 and the solder resist layer 24 together define a single layer may be formed from the polymerizable composition of the present invention, or (2) the light-blocking film 18 and the solder resist layer 24 are separate layers and the light-blocking film 18 may be formed from the polymerizable composition of the present invention (in this case, the solder resist layer may be formed using a known solder resist composition).

In FIG. 2, the light-blocking film 18 is patterned to cover a part of the metal electrode 23 and expose the remaining portion but may be patterned to expose the entirety of the metal electrode 23 (the same applies to the patterning of the solder resist layer 24).

Also, the solder resist layer 24 may be omitted and a light-blocking film 18 may be formed directly on the second major surface where the metal electrode 23 is formed.

A solder ball 60 as a connection member is provided on the exposed metal electrode 23, and the metal electrode 23 of the solid-state imaging device substrate 100 and a connection electrode not shown of the circuit board 70 are electrically connected through the solder ball 60.

The configuration of the solid-state imaging device substrate 100 is described above, and each part other than the light-blocking film 18 of the solid-state imaging device substrate 100 can be formed by a known method such as method described in paragraphs 0033 to 0068 of JP-A-2009-158863 and method described in paragraphs 0036 to 0065 of JP-A-2009-99591.

The light-blocking film 18 can be formed by the above-described production method for the light-blocking film of the present invention.

The interlayer insulating film 13 is formed as an $SiO_2$ film or an SiN film, for example, by sputtering or CVD (chemical vapor deposition). The color filter 15 is formed, for example, by photolithography using a known color resist.

The overcoat 16 and the base layer 14 are formed, for example, by photolithography using a known resist for formation of an organic interlayer film.

The microlens 17 is formed, for example, by photolithography using a styrene-based resin or the like.

In the case where the solder resist layer 24 and the light-blocking film 18 are combined to form a single-layer light-blocking solder resist layer, the layer is preferably formed using the polymerizable composition of the present invention.

On the other hand, when the solder resist layer 24 is a separate layer from the light-blocking film 18, the solder resist layer 24 is preferably formed, for example, by photolithography using a known solder resist containing a phenolic resin, a polyimide-based resin or an amine-based resin.

The solder ball 60 is formed, for example, as Sn—Pb (eutectic), 95Pb—Sn (high-lead high melting point solder) or Pb-free solder by using Sn—Ag, Sn—Cu, Sn—Ag—Cu or the like. The solder ball 60 is formed, for example, as a sphere having a diameter of 100 to 1,000 μm (preferably a diameter of 150 to 700 μm).

The internal electrode 26 and the device surface electrode 27 are formed, for example, as a metal electrode such as Cu by CMP (chemical mechanical polishing), photolithography or etching.

The metal electrode 23 is formed, for example, as a metal electrode such as Cu, Au, Al, Ni, W, Pt, Mo, Cu compound, W compound or Mo compound by sputtering, photolithography, etching or electrolytic plating. The metal electrode 23 may have a sing-layer configuration or a multilayer configuration consisting of two or more layers.

The film thickness of the metal electrode 23 is, for example, from 0.1 to 20 μm (preferably from 0.1 to 10 μm). The silicon substrate 10 is not particularly limited, but a silicon substrate thinned by grinding the back surface of the substrate may be used. The thickness of the substrate is not limited, but a silicon wafer having a thickness of 20 to 200 μm (preferably from 30 to 150 μm) is used.

The through-hole of the silicon substrate 10 is formed, for example, by photolithography or RIE (reactive ion etching).

In the foregoing pages, the solid-state imaging device substrate 100 as a specific example of the embodiment above is described by referring to FIGS. 1 and 2, but the embodiment above is not limited to the configuration mode of FIGS. 1 and 2, and the configuration of the device substrate is not particularly limited as long as it is a configuration having a metal electrode and a light-blocking film on the back surface side.

An example where the permanent pattern obtained using the polymerizable composition of the present invention is applied to the light-blocking film of a wafer-level lens is described below by referring to the drawings.

Figure 7:
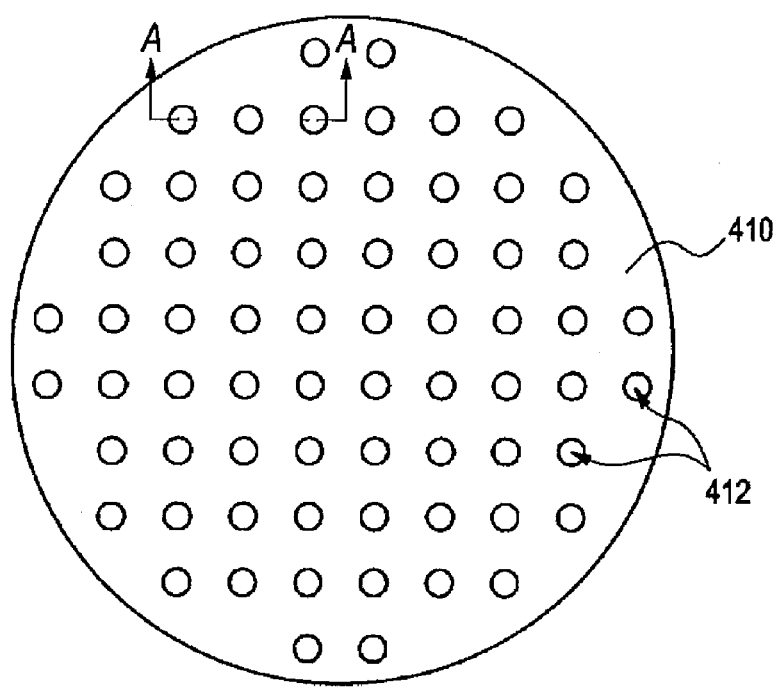
FIG. 7 is a plan view showing one example of the wafer-level lens array.

FIG. 7 is a plan view showing one example of the wafer-level lens array having a plurality of wafer-level lenses.

As shown in FIG. 7, the wafer-level lens array comprises a substrate 410 and lenses 412 arrayed on the substrate 410. In FIG. 7, a plurality of lenses 412 are two-dimensionally arrayed with respect to the substrate 410 but may be one-dimensionally arrayed.

Figure 8:
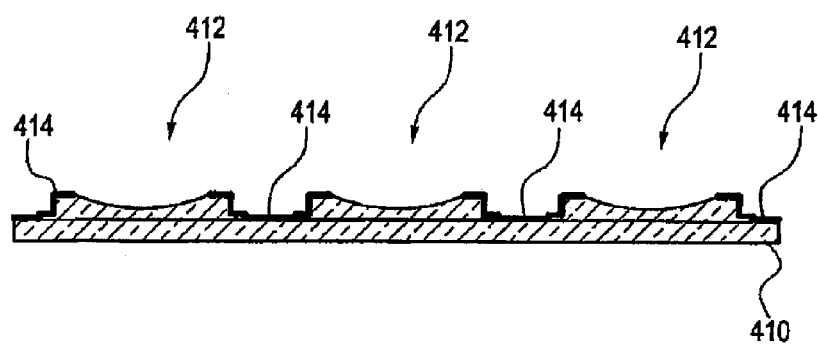
FIG. 8 is a cross-sectional view along the line A-A in FIG. 7.

FIG. 8 is a cross-sectional view along the line A-A in FIG. 7.

As shown in FIG. 8, in the wafer-level lens array, a light-blocking film 414 for preventing light permeation from portions other than the lens 412 is provided between the plurality of lenses 412 arrayed on the substrate 410.

The wafer-level lens is composed of one lens 412 present on the substrate 410 and the light-blocking film 414 provided in the circumferential edge part of the lens. The polymerizable composition of the present invention is used for the formation of the light-blocking film 414.

The configuration of a wafer-level lens array where a plurality of lenses 412 are two-dimensionally arrayed with respect to the substrate 410 as shown in FIG. 7 is described below as an example.

The lens 412 is generally composed of the same material as the substrate 410 and is a lens integrally molded on the substrate 410 or a lens molded as a separate structure and fixed on the substrate. Here, one example is described above, but the wafer-level lens is not limited to this embodiment and may take various embodiments, for example, a multilayer structure or a lens module separated by dicing.

Examples of the material for forming the lens 412 include glass. There are extensive types of glass, and since glass having a high refractive index can be selected, the glass is suitable as a material for a lens intended to have a large power. Also, the glass is excellent in the heat resistance and advantageously can withstand the reflow mounting in an imaging unit or the like.

Other examples of the material for forming the lens 412 include a resin. The resin is excellent in the processability and suitable to simply and inexpensively form a lens face by using a mold or the like.

In this case, an energy-curable resin is preferably used for the formation of the lens 412. The energy-curable resin may be either a resin that is cured by heat, or a resin that is cured by irradiation with an actinic energy ray (for example, irradiation with heat, ultraviolet ray or electron beam).

As for such an energy-curable resin, all of known resins may be used, but in consideration of reflow mounting in an imaging unit, a resin having a relatively high softening point, for example, a softening point of 200° C. or more, is preferred, and a resin having a softening point of 250° C. or more is more preferred.

With respect to the mode and production of a wafer-level lens, the production method of a wafer-level lens array is specifically described as an example by referring to FIGS. 9 to 14.

[Mode and Production (1) of Wafer-Level Lens]
—Formation of Lens—

First, the method for forming a lens 412 on a substrate 410 is described by referring to FIG. 9 and FIGS. 10A to 10C.

Figure 9:
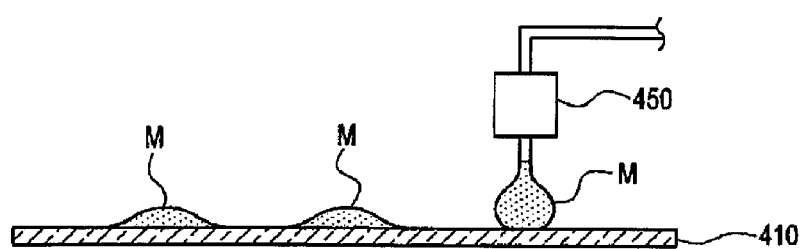
FIG. 9 is a view showing how a molding material working out to a lens is supplied to the substrate.

FIG. 9 is a view showing how a molding material (denoted by M in FIG. 9) as a resin composition for lens formation is supplied to the substrate 410.

Figure 10A:
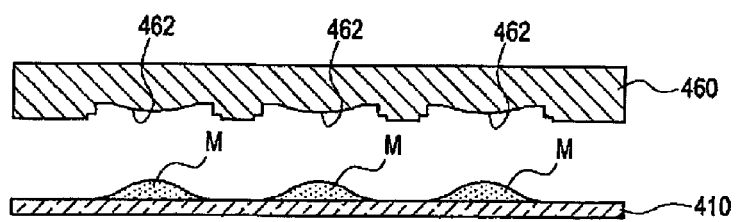
FIGS. 10A to 10C are views showing the procedure of forming a lens on the substrate by a mold.
Figure 10B:
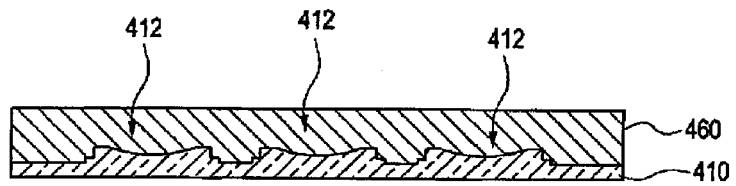
Figure 10C:
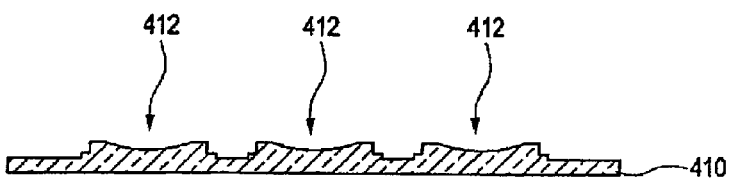

FIGS. 10A to 10C are views showing the procedure of forming a lens 412 on the substrate 410 by a mold 460.

As shown in FIG. 9, a molding material M is dropped on a lens 412-forming site of the substrate 410 by using a dispenser 450. Here, a molding material M in an amount corresponding to one lens 412 is supplied to one site to be supplied with the material.

After supplying the molding material M to the substrate 410, as shown in FIG. 10A, a mold 460 for forming the lens 412 is disposed on the molding material M-supplied side of the substrate 410.

In the mold 460, concaves 462 for transferring the lens 412 shape are provided according to the desired number of lenses 412.

As shown in FIG. 10B, the mold 460 is pressed to the molding material M on the substrate 410 and thereby, the molding material M is deformed to follow the concave 462 shape. In the state of the mold 460 being pressed to the molding material M, in the case where the molding material M is a heat-curable resin or an ultraviolet-curable resin, the mold 460 is externally irradiated with heat or ultraviolet ray to cure the molding material M.

After curing the molding material M, as shown in FIG. 10C, the substrate 410 and the lens 412 are separated from the mold 460.

—Formation of Light-Blocking Film—

The method for forming a light-blocking film 414 in the circumferential edge part of the lens 412 is described below by referring to FIGS. 11A to 11C.

Figure 11A:
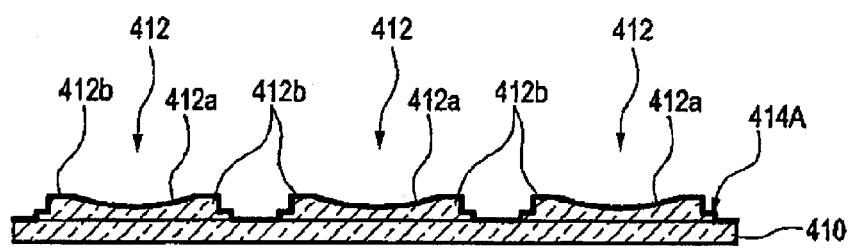
FIGS. 11A to 11C are schematic views showing the process of forming a patterned light-blocking film on the substrate having formed thereon a lens.
Figure 11B:
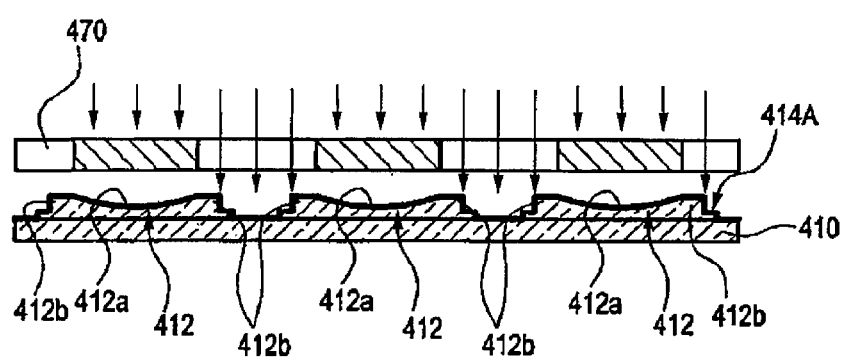
Figure 11C:
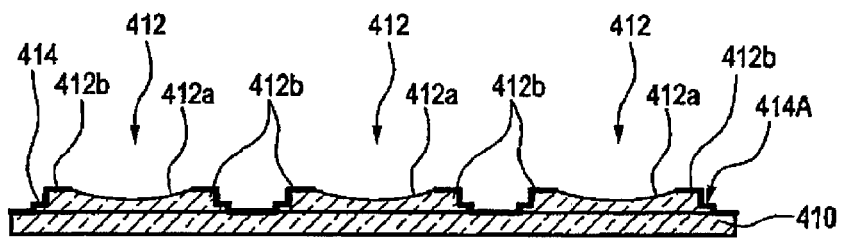

FIGS. 11A to 11C are schematic cross-sectional views showing the process of providing a light-blocking film 414 on the substrate 410 having formed thereon a lens 412.

The method for forming a light-blocking film 414 comprises a light-blocking coated layer-forming step of coating the polymerizable composition of the present invention on a substrate 410 to form a light-blocking coated layer 414A (see, FIG. 11A), an exposure step of pattern-exposing the light-blocking coated layer 414A through a mask 470 (see, FIG. 11B), and a developing step of developing the light-blocking coated layer 414A after exposure to remove the uncured area and form a patterned light-blocking film 414 (see, FIG. 11C).

The formation of the light-blocking film 414 can be arbitrarily performed either before production of the lens 412 or after production of the lens 412. Here, the method for formation after production of the lens 412 is described in detail.

Respective steps in the method for forming a light-blocking film 414 are described below.

<Light-Blocking Coated Layer-Forming Step>

In the light-blocking coated layer-forming step, as shown in FIG. 11A, the polymerizable composition is coated on the substrate 410 to form a light-blocking coated layer 414A with a low light reflectance composed of the polymerizable composition. At this time, the light-blocking coated layer 414A is formed to cover all of the surface of the substrate 410, the lens face 412a of the lens 412 and the lens edge part 412b.

The substrate 410 usable in this step is not particularly limited, and examples thereof include soda glass, non-alkali glass, Pyrex (registered trademark) glass, quartz glass and transparent resin.

In the embodiment where the lens 412 and the substrate 410 are integrally formed, the substrate 410 as used herein indicates a mode including both the lens 412 and the substrate 410.

On the substrate 410, if desired, an undercoat layer may be provided for improving the adherence to a layer formed thereabove, preventing diffusion of a material or flattening the substrate 10 surface.

As the method for coating the polymerizable composition on the substrate 410 and the lens 412, various coating methods such as slit coating, spray coating, inkjet printing, spin coating, cast coating, roll coating and screen printing may be applied.

The film thickness immediately after coating of the polymerizable composition is, in view of thickness uniformity of the coated film and easy drying of the coating solvent, preferably from 0.1 to 10 μm, more preferably from 0.2 to 5 μm, still more preferably from 0.2 to 3 μm.

The drying (prebaking) of the light-blocking coated layer 414A applied on the substrate 410 can be performed at a temperature of 50 to 140° C. for 10 to 300 seconds by using a hot plate, an oven or the like.

The thickness of the coated film after drying of the polymerizable composition (hereinafter, sometimes referred to as a "dry film thickness") may be arbitrarily selected according to the desired performance such as light-blocking effect and is generally from 0.1 μm to less than 50 μm.

<Exposure Step>

In the exposure step, the light-blocking coated layer 414A formed in the light-blocking coated layer-forming step is patternwise exposed. The pattern exposure may be scanning exposure, but as shown in FIG. 11B, an embodiment of performing the exposure through a mask 70 having a predetermined mask pattern is preferred.

At the exposure in this step, the pattern exposure of the light-blocking coated layer 414A is performed by exposure through a predetermined mask pattern, and out of the light-blocking coated layer 414A, only the area irradiated with light is cured. Here, a mask pattern allowing the surface of the lens edge part 412b and the surface of the substrate 410 between lenses 412 to be irradiated with light is used. By use of such a mask pattern, the light-blocking coated layer 414A only in the region excluding the lens face 412a is cured by the irradiation with light, and this cured region forms a light-blocking film 414.

The radiation which can be used for exposure is preferably an ultraviolet ray such as g-line, h-line and i-line. The radiation may be emitted from a light source having a single wavelength, or a light source containing all wavelengths, such as high-pressure mercury lamp, may be used.

<Developing Step>

Subsequently, an alkali development processing (developing sep) is performed, whereby the portion non-irradiated with light in the exposure, that is, the uncured region of the light-blocking coated layer 414A, is dissolved out into an aqueous alkali solution and only the region cured by light irradiation is allowed to remain.

More specifically, the light-blocking coated layer 414A exposed as shown in FIG. 11B is developed, as a result, only the light-blocking coated layer 414A formed on the lens face 412a is removed and a cured light-blocking film 414 is formed in other regions as shown in FIG. 11C.

As for the alkali agent contained in the developer (aqueous alkaline solution) used in the developing step, all of organic or inorganic alkali agents and their combinations can be used. In the light-blocking film formation of the present invention, an organic alkali agent is preferably used from the standpoint that the circuit or the like in the periphery is hardly damaged.

Examples of the alkali agent used in the developer include an organic alkaline compound (organic alkali agent) such as aqueous ammonia, ethylamine, diethylamine, dimethylethanolamine, tetramethylammonium hydroxide, tetraethylammonium hydroxide, choline, pyrrole, piperidine and 1,8-diazabicyclo-[5,4,0]-7-undecene, and an inorganic compound (inorganic alkali agent) such as sodium hydroxide, potassium hydroxide, sodium hydrogencarbonate and potassium hydrogencarbonate. An aqueous alkaline solution obtained by diluting such an alkali agent with pure water to a concentration of 0.001 to 10 mass %, preferably from 0.01 to 1 mass %, is preferably used as the developer.

The development temperature is usually from 20 to 30° C., and the development time is from 20 to 90 seconds.

Incidentally, when a developer composed of such an aqueous alkaline solution is used, washing (rinsing) with pure water is generally performed after the unexposed area of the coated film is removed with the developer. That is, after the development processing, the film is thoroughly washed with pure water to remove excess developer and then subjected to a drying step.

After the above-described light-blocking coated layer-forming step, exposure step and developing step are performed, a curing step of curing the formed light-blocking film (light-blocking pattern) by heating (post-baking) and/or exposure may be provided, if desired.

The post-baking is a heat treatment performed after development so as to complete curing, and a heat curing treatment at 100 to 250° C. is usually performed. The conditions of post-baking, such as temperature and time, can be appropriately set according to the material of the substrate 410 or lens 412. For example, when the substrate 412 is glass, a temperature of 180 to 240° C. in the temperature range above is preferably used.

This post-baking treatment may be performed continuously or batchwise by using a heating device such as hot plate, convection oven (hot air circulating dryer) and high-frequency heating machine so that the light-blocking film 414 formed after development can satisfy the above-described conditions.

In the procedure above, an example where the lens 412 has a concave shape is described, but the shape is not particularly limited and may be a convex or aspheric shape. Also, in the procedure, a wafer-level lens where a plurality of lenses 412 are formed on one surface of the substrate 410 is described as an example, but a configuration where a plurality of lenses 412 are formed on both surfaces of the substrate 410 may be employed and in this case, a patterned light-blocking film 414 is formed in the region excluding the lens face on both surfaces.

[Mode and Production (2) of Wafer-Level Lens]

Figure 12:
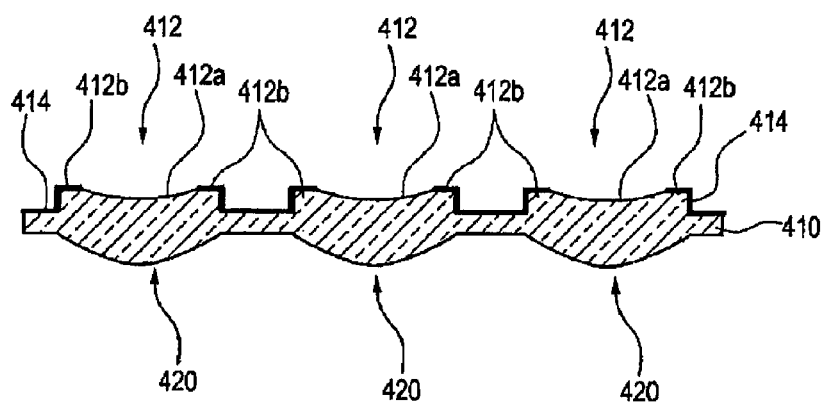
FIG. 12 is a cross-sectional view showing one example of the wafer-level lens array.

FIG. 12 is a view showing another configuration example of the wafer-level lens array.

The wafer-level lens shown in FIG. 12 has a configuration (monolithic type) where a substrate 410 and a lens 412 are simultaneously formed using the same molding material.

At the production of such a wafer-level lens, the same as those described above as the molding material can be used. Also, in this example, a plurality of concave lenses 412 are formed on one surface (in the Figure, the surface on the upper side) of the substrate 410, and a plurality of convex lenses 420 are formed on another surface (in the Figure, the surface on the lower side). Furthermore, a patterned light-blocking film 414 is formed in the region excluding the lens face 412a of the substrate 410, that is, on the surface of the substrate 410 and the surface of the lens edge part 412b. As for the patterning method when forming the light-blocking film 414, the procedure described above can be applied.

[Mode and Production (3) of Wafer-Level Lens]

A still another configuration example of the wafer-level lens array and the procedure for the publication thereof are described below by referring to FIGS. 13A to 13C and FIGS. 14A to 14C.

Figure 13A:
FIGS. 13A to 13C are schematic views showing another exemplary embodiment of the process of forming a light-blocking film.
Figure 13B:
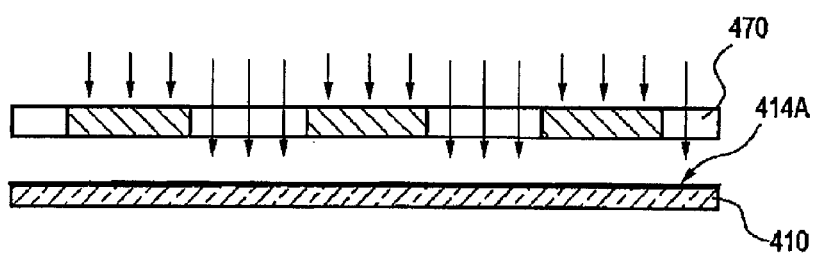
Figure 13C:
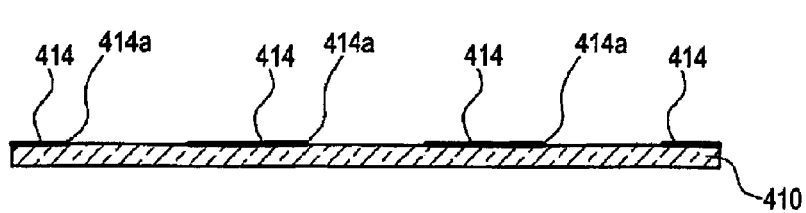

FIGS. 13A to 13C are schematic views showing another process of forming a patterned light-blocking film 414.

Figure 14A:
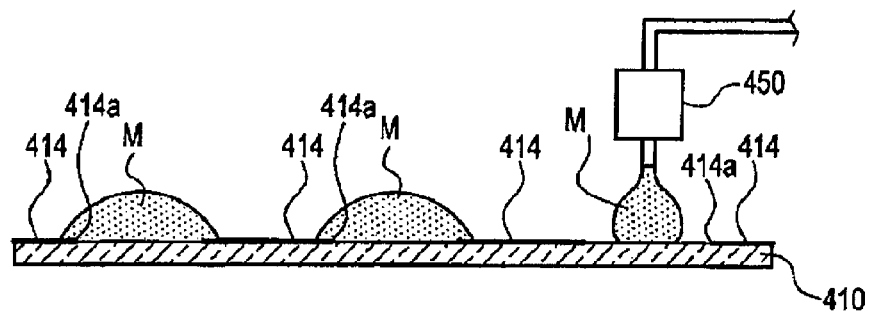
FIGS. 14A to 14C are schematic views showing the process of forming a lens on the substrate having thereon a patterned light-blocking film.
Figure 14B:
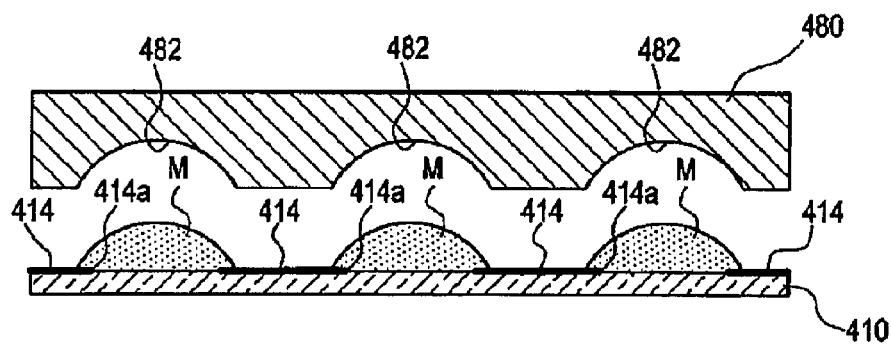
Figure 14C:
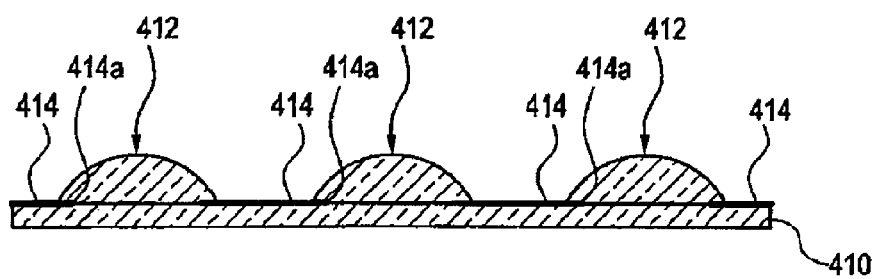

FIGS. 14A to 14C are schematic views showing the process of forming a patterned light-blocking film 414 and then forming a lens 412.

In the example of the wafer-level lens array shown in FIGS. 9 to 12, a patterned light-blocking film 414 is formed on a substrate 410 on which a lens 412 is provided, but in the procedure described below, a patterned light-blocking film 414 is formed on a substrate 410 and then, a lens 412 is formed on the substrate 410.

—Formation of Light-Blocking Film—

First, as shown in FIG. 13A, a light-blocking coated layer-forming step of coating the polymerizable composition on a substrate 410 to form a light-blocking coated layer 414A is performed.

Thereafter, the light-blocking coated layer 414A coated on the substrate 410 is dried using a hot plate, an oven or the like at a temperature of 50 to 140° C. for 10 to 300 seconds. The dry film thickness of the polymerizable composition may be arbitrarily selected according to the desired performance such as light-blocking effect and is generally from 0.1 μm to less than 50 μm.

Next, as shown in FIG. 13B, an exposure step of pattern-wise exposing the light-blocking coated layer 414A formed in the light-blocking coated layer-forming step through a mask 470 is performed. The mask 470 has a predetermined mask pattern.

At the exposure in this step, pattern exposure of the light-blocking coated layer 414A is performed, whereby out of the light-blocking coated layer 414A, only the area irradiated with light is cured. Here, a mask pattern allowing the light-blocking coated layer 414A in the region excluding the site working out to a lens opening 414a of a lens 412 when the lens 412 is formed in the after-step, is used. By this method, the light-blocking coated layer 414A only in the region excluding the site working out to a lens opening 414a of a lens 412 is cured by the irradiation with light. The radiation which can be used for exposure is preferably an ultraviolet ray such as g-line, h-line and i-line, similarly to the procedure described above.

Subsequently, an alkali development processing (developing sep) is performed, whereby the light-blocking coated layer 414A only in the region corresponding to a lens opening 414a of a lens 412, which is the uncured region of the light-blocking coated layer 414A in the pattern exposure above, is dissolved out into an aqueous alkali solution. At this time, as shown in FIG. 13C, the photo-cured light-blocking coated layer 414A in the region excluding the region for a lens opening 414a of a lens 412 remains on the substrate 410 and forms a light-blocking film 414.

As for the alkali agent in the aqueous alkali solution as the developer, the same as those described in the procedure above can be used.

After the development processing, excess developer is cleaned and removed and then, drying is applied.

Also in this embodiment, after the above-described light-blocking coated layer-forming step, exposure step and developing step are performed, a curing step of curing the formed light-blocking film by post-baking and/or exposure may be provided, if desired.

The polymerizable composition layer of the present invention can be easily cleaned and removed by using a known cleaning liquid even when the composition is attached to, for example, the nozzle of the jetting part of a coating apparatus, the piping part of a coating apparatus, or the inside of a coating apparatus. In this case, for performing the cleaning and removal more effectively, a solvent described above as the solvent contained in the polymerizable composition of the present invention is preferably used as the cleaning liquid.

Also, cleaning liquids described, for example, in JP-A-7-128867, JP-A-7-146562, JP-A-8-278637, JP-A-2000-273370, JP-A-2006-85140, JP-A-2006-291191, JP-A-2007-2101, JP-A-2007-2102 and JP-A-2007-281523 can be suitably used as the cleaning liquid for cleaning and removing the polymerizable composition of the present invention.

As the cleaning liquid, an alkylene glycol monoalkyl ether carboxylate or an alkylene glycol monoalkyl ether is preferably used.

One of these solvents usable as the cleaning liquid may be used alone, or two or more thereof may be mixed and used.

In the case of mixing two or more kinds of solvents, a mixed solvent of a solvent having a hydroxyl group and a solvent having no hydroxyl group is preferred. The mass ratio of the solvent having a hydroxyl group to the solvent having no hydroxyl group is from 1/99 to 99/1, preferably from 10/90 to 90/10, more preferably from 20/80 to 80/20. In particular, the mixed solvent is preferably a mixed solvent of propylene glycol monomethyl ether acetate (PGMEA, another name: 1-methoxy-2-acetoxypropane) and propylene glycol monomethyl ether (PGME, another name: 1-methoxy-2-propanol) in a mass ratio of 60/40.

In order to enhance the permeability of the cleaning liquid to the polymerizable composition, the cleaning liquid may contain a surfactant described above as the surfactant which may be contained in the polymerizable composition.

—Formation of Lens—

The step of forming a lens 412 after the formation of the light-blocking film 414 is described below.

As shown in FIG. 14A, a molding material M constituting a lens 412 is dropped on the substrate 410 having formed thereon the patterned light-blocking film 414, by using a dispenser 450. The molding material M is supplied to include a part of the edge part of the light-blocking film 414 adjacent to an opening 414a of a lens 412 so as to thereby cover the region corresponding to the opening.

After supplying the molding material M to the substrate 410, as shown in FIG. 14B, a mold 480 for forming the lens is disposed on the molding material M-supplied side of the substrate 410. In the mold 480, concaves 482 for transferring the lens 412 shape are provided according to the desired number of lenses 412.

The mold 480 is pressed to the molding material M on the substrate 410 and thereby, the molding material M is deformed to follow the concave shape. In the state of the mold 480 being pressed to the molding material M, in the case where the molding material M is a heat-curable resin or an ultraviolet-curable resin, the mold is externally irradiated with heat or ultraviolet ray to cure the molding material M.

After curing the molding material M, as shown in FIG. 14C, the substrate 410 and the lens 412 are separated from the mold 480 to obtain a wafer-level lens having a patterned light-blocking film 414 on a substrate 410.

As described above, not only a configuration where the patterned light-blocking film 414 equipped in the wafer-level lens is provided in the region excluding the lens face 412a of a lens 412 as shown in FIG. 11C but also a configuration where the light-blocking film 414 is provided in the region excluding the lens opening 414a of a lens 412 as shown in FIG. 14C may be employed.

The wafer-level lens can prevent generation of reflected light in the region excluding the lens face 412a or lens opening 414a of a lens 412 while sufficiently blocking light by a light-blocking film 414 with a low light reflectance formed on a pattern of at least one surface of a substrate 410. Therefore, when the wafer-level lens is applied to an imaging module equipped with a solid-state imaging device, troubles such as ghost or flare ascribable to reflected light at the imaging can be prevented from occurring.

Also, since the light-blocking film 414 is provided on a surface of the substrate, another light-blocking member or the like need not be fixed to the wafer-level lens and an increase in the production cost can be reduced.

Incidentally, in the case of a configuration where a structure with an uneven surface is provided in the periphery of a lens, light entering the structure may be reflected or spread to readily generate troubles such as ghost. In this regard, when a configuration where a patterned light-blocking film 414 is provided in the region excluding the lens face 412a of a lens 412 as shown in FIG. 11C is employed, light can be blocked in the region except for the lens face 412a and the optical performance can be improved.

EXAMPLES

The present invention is described below by referring to Examples, but the present invention is not limited to these Examples by any means.

[(1) Example where a Solder Resist is Produced Using the Polymerizable Composition of the Present Invention]

<Preparation of Binder Solution A>

A 1,000 mL-volume three-neck flask was charged with 159 g of 1-methoxy-2-propanol and heated to 85° C. in a nitrogen flow, and thereto, a solution obtained by adding 63.4 g of benzyl methacrylate, 72.3 g of methacrylic acid and 4.15 g of V-601 (produced by Wako Pure Chemical Industries, Ltd.) to 159 g of 1-methoxy-2-propanol was added dropwise over 2 hours. After the completion of dropwise addition, the reaction was further allowed to proceed under heating for 5 hours.

Subsequently, heating was stopped, and a copolymer of benzyl methacrylate/methacrylic acid (30/70 by mol) was obtained.

Thereafter, a 120.0 g portion of the copolymer solution above was transferred to a 300 mL-volume three-neck flask, and 16.6 g of glycidyl methacrylate and 0.16 g of p-methoxyphenol were added thereto and dissolved with stirring. After the dissolution, 3.0 g of triphenylphosphine was added, and an addition reaction was performed under heating at 100° C. When disappearance of glycidyl methacrylate was confirmed by gas chromatography, heating was stopped, and 38 g of 1-methoxy-2-propanol was added to prepare Binder Solution A having an acid group content of 2 meq/g (acid value: 112 mgKOH/g), a crosslinking group content of 2.23 meq/g, a weight average molecular weight of 24,000 (in terms of polystyrene by GPC) and a solid content of 46 mass %.

<Preparation of Binder Solution B>

In a 500 ml-volume three-neck round-bottom flask equipped with a condenser and a stirrer, a diisocyanate compound shown below and two kinds of diol compounds shown below were dissolved in 100 ml of N,N-dimethylacetamide in a molar ratio shown below (total molar amount of the diisocyanate compound and two kinds of diol compounds: 0.152 mol). Thereto, 0.1 g of dibutyltin dilaurate was added, and the mixture was heated with stirring at 100° C. for 8 hours. The resulting solution was diluted with 100 ml of N,N-dimethylformamide and 200 ml of methyl alcohol and stirred for 30 minutes. The obtained reaction solution was charged in 3 liters of water while stirring to precipitate a white polymer, and the polymer was separated by filtration, washed with water and dried in vacuum to obtain Urethane-Based Resin P-1. Subsequently, 1-methoxy-2-propanol was added to the urethane-based resin to prepare Binder Solution B having an acid group content of 1.3 meq/g, a crosslinking group content of 1.59 meq/g, a weight average molecular weight of 15,000 (in terms of polystyrene by GPC) and a solid content of 46 mass %.

| Polymer No. | Diisocyanate Compound Used (mol %) | Diol Compounds Used (mol %) | Weight Average Molecular Weight |
|---|---|---|---|
| P-1 | OCN—C6H4—CH2—C6H4—NCO (50) | HOCH2-CH(OH)-CH2-O-C(=O)-C(CH3)=CH2 (32.5); HOCH2-C(CH3)(CO2H)-CH2OH (17.5) | 15,000 |

<Preparation of Binder Solution C>

A 1,000 mL-volume three-neck flask was charged with 159 g of 1-methoxy-2-propanol and heated to 85° C. in a nitrogen stream and thereto, a solution prepared by adding 63.4 g of benzyl methacrylate, 72.3 g of methacrylic acid and 4.15 g of V-601 (produced by Wako Pure Chemical Industries, Ltd.) to 159 g of 1-methoxy-2-propanol was added dropwise over 2 hours. After the completion of dropwise addition, the reaction was further allowed to proceed for 5 hours under heating.

Subsequently, the heating was stopped, and a copolymer of benzyl methacrylate/methacrylic acid (in a ratio of 30/70 by mol) was obtained.

Thereafter, a 120.0 g portion of the copolymer solution was transferred to a 300 mL-volume three-neck flask, and 48.6 g of glycidyl methacrylate and 0.16 g of p-methoxyphenol were added and dissolved with stirring. After the dissolution, 3.0 g of triphenylphosphine was added, and an addition reaction was performed under heating at 100° C. The progress of the reaction was confirmed by measuring the acid value, and when the acid value became 0, the heating was stopped. Furthermore, 1-methoxy-2-propanol was added to prepare Binder Solution C having an acid group content of 0 meq/g (acid value: 0 mgKOH/g) and a solid content of 46 mass %.

<Preparation of Polymerizable Composition Solution>

Example 1-1

The polymerizable composition solution of Example 1-1 was obtained by mixing the following composition. The viscosity of this composition was 1,060 mPa·s (the solid content concentration of the composition was 50 mass %).

| | |
|---|---|
| Binder Solution A (alkali-soluble binder) | 45.0 parts by mass |
| Dipentaerythritol hexaacrylate (KAYARAD DPHA, trade name, produced by Nippon Kayaku Co., Ltd.) (polymerizable compound) | 10.7 parts by mass |
| Irgacure OXE02 (BASF Japan) (polymerization initiator) | 1.50 parts by mass |
| EPOTOHTO YDF-170 (produced by Tohto Kasei Co., Ltd., bisphenol F-type epoxy resin) (crosslinking agent) | 5.00 parts by mass |
| Liquid dispersion below (filler, alkali-soluble binder, curing accelerator) | 35.7 parts by mass |
| Megaface F-780 (produced by Dainippon Ink and Chemicals, Inc.) (surfactant) | 0.13 parts by mass |
| YMF-02 (produced by Sumitomo Metal Mining Co., Ltd., a 18.5 mass % liquid dispersion of cesium tungsten oxide ($Cs_{0.33}WO_3$) (average dispersion particle diameter: 800 nm or less)) | 18.0 parts by mass |

The liquid dispersion above was prepared by previously mixing 30 parts by mass of silica (SO—C2, produced by Admatechs Co., Ltd.), 48.2 parts by mass of Binder Solution A, 0.37 parts by mass of dicyandiamide (curing accelerator) and 59.0 parts by mass of propylene glycol monomethyl ether acetate, and dispersing the mixture at a peripheral speed of 9 m/s for 3 hours in a motor mill M-250 (manufactured by Eiger Machinery, Inc.) by using zirconia beads of 1.0 mm in diameter Example 1-2

The composition of Example 1-2 was obtained by formulating the same composition as in Example 1-1 except for replacing Irgacure OXE02 by the following Compound B. The viscosity of the composition of Example 1-2 was 1,100 mPa·s.

(Compound B)

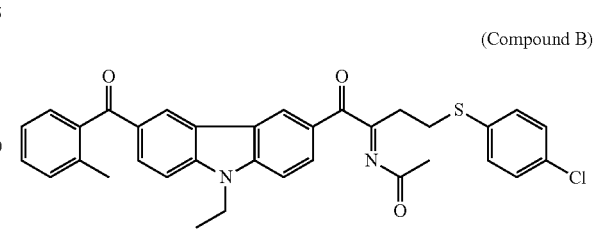

Example 1-3

The composition of Example 1-3 was obtained by formulating the same composition as in Example 1-1 except for replacing dipentaerythritol hexaacrylate by tricyclodecanedimethanol diacrylate (A-DCP, trade name, produced by Shin-Nakamura Chemical Co., Ltd.). The viscosity of the composition of Example 1-3 was 900 mPa·s.

Example 1-4

The composition of Example 1-4 was obtained by formulating the same composition as in Example 1-1 except for replacing Irgacure OXE02 (produced by BASF Japan) by Compound B and replacing dipentaerythritol hexaacrylate by tricyclodecanedimethanol diacrylate (A-DCP, trade name, produced by Shin-Nakamura Chemical Co., Ltd.). The viscosity of the composition of Example 1-4 was 920 mPa·s.

Example 1-5

The composition of Example 1-5 was obtained by formulating the same composition as in Example 1-4 except for changing the amount use of YMF-02 from 18.0 parts by mass to 24.0 parts by mass. The viscosity of the composition of Example 1-5 was 800 mPa·s.

Example 1-6

The composition of Example 1-6 was obtained by formulating the same composition as in Example 1-5 except for replacing Binder Solution A (including Binder Solution A in the liquid dispersion) by Binder Solution B. The viscosity of the composition of Example 1-6 was 700 mPa·s.

Example 1-7

The composition of Example 1-7 was obtained by formulating the same composition as in Example 1-5 except for not using EPOTOHTO YDF-170. The viscosity of the composition of Example 1-7 was 700 mPa·s.

Example 1-8

The composition of Example 1-8 was obtained by formulating the same composition as in Example 1-5 except for not using dicyandiamide in the liquid dispersion. The viscosity of the composition of Example 1-8 was 810 mPa·s.

Example 1-9

The composition of Example 1-9 was obtained by formulating the same composition as in Example 1-5 except for not using silica in the liquid dispersion. The viscosity of the composition of Example 1-9 was 500 mPa·s.

Example 1-10

The composition of Example 1-10 was obtained by formulating the same composition as in Example 1-5 except for replacing dicyandiamide by melamine in the liquid dispersion above. The viscosity of the composition of Example 1-10 was 780 mPa·s.

Example 1-11

The composition of Example 1-11 was obtained by formulating the same composition as in Example 1-8 except for replacing EPOTOHTO YDF-170 by hexamethylated methylolmelamine in the liquid dispersion above. The viscosity of the composition of Example 1-11 was 800 mPa·s.

Example 1-12

The composition of Example 1-12 was obtained by formulating the same composition as in Example 1-11 except for replacing 1.50 parts by mass of Compound B by 0.3 parts by mass of IRGACURE-907 (produced by BASF Japan) (polymerization initiator), adding 0.1 parts by mass of KAYACURE DETX-S (2,4-diethylthioxanthone, produced by Nippon Kayaku Co., Ltd.) (sensitizer), and further replacing Binder Solution A by the following Binder Solution D. The viscosity of the composition of Example 1-12 was 860 mPa·s.
<Preparation of Binder Solution D>
Binder Solution D having a solid content of 46 mass % was prepared by further adding PGME to (ACA)230AA [a propylene glycol monomethyl ether (PGME, another name: 1-methoxy-2-propanol) solution having a solid content of 55 mass % and containing an acid group-containing methacrylic resin (acid group content: 0.7 meq/g, crosslinking group content: 1.9 meq/g, weight average molecular weight: 14,000 (in terms of polystyrene by GPC)), produced by DAICEL-CYTEC Company Ltd.].

Example 1-13

The composition of Example 1-13 was obtained by formulating the same composition as in Example 1-12 except for adding 35.7 parts by mass of the following Silica Liquid Dispersion A. The viscosity of the composition of Example 1-13 was 910 mPa·s.
<Preparation of Silica Liquid Dispersion A>
7 Parts by mass of silica (Aerosil 50, produced by Nippon Aerosil Co., Ltd., filler, particle diameter: 17 nm) and 93 parts by mass of (ACA)230AA (produced by DAICEL-CYTEC Company Ltd., solid content: 55 mass %, solvent: PGME) were previously mixed and then dispersed by a motor mill, M-50 (manufactured by Eiger Japan Co., Ltd.), at a peripheral speed of 9 msec by using zirconia beads of 1.0 mm in diameter for 1.5 hours to prepare Silica Liquid Dispersion A.

Example 1-14

The composition of Example 1-14 was obtained by formulating the same composition as in Example 1-13 except for adding 0.02 parts by mass of DPO (UV absorber produced by Fujifilm Finechemicals Co., Ltd.) and 0.60 parts by mass of KBM-503 (silane coupling agent produced by Shin-Etsu Silicones). The viscosity of the composition of Example 1-14 was 910 mPa·s.

Comparative Example 1-1

The composition of Comparative Example 1-1 was obtained by formulating the same composition as in Example 1-5 except for replacing YMF-02 by Carbon Black Liquid Dispersion A shown below.
(Preparation of Carbon Black Liquid Dispersion A)
Composition I below was subjected to a high viscosity dispersion treatment by using a two-roll mill to obtain a dispersion. The viscosity of this dispersion was 70,000 mPa·s.

Thereafter, the mixture of Composition II below was added to the dispersion, and these were stirred for 3 hours by using a homogenizer under the conditions of 3,000 rpm. The mixed solution obtained was subjected to a fine dispersion treatment by a disperser (Dispermat, trade name, manufactured by GETZMANN) using zirconia beads having a particle diameter of 0.3 mm for 4 hours to prepare Carbon Black Liquid Dispersion A. At this time, the viscosity of the mixed solution was 37 mPa·s.
(Composition I)

| | |
|---|---|
| Carbon black having an average primary particle diameter of 15 nm (Pigment Black 7) | 23 parts by mass |
| A propylene glycol monomethyl ether acetate 45 mass % solution of benzyl methacrylate/methacrylic acid copolymer (benzyl methacrylate unit/methacrylic acid unit = 67/33 (mol %), Mw: 28,000) | 22 parts by mass |
| Solsperse 5000 (produced by Zeneca) | 1.2 parts by mass |

(Composition II)

| | |
|---|---|
| A propylene glycol monomethyl ether acetate 45 mass % solution of benzyl methacrylate/methacrylic acid copolymer (benzyl methacrylate unit/methacrylic acid unit = 67/33 (mol %), Mw: 28,000) | 22 parts by mass |
| Propylene glycol monomethyl ether acetate | 200 parts by mass |

Comparative Example 1-2

The composition of Comparative Example 1-2 was obtained by formulating the same composition as in Example 1-5 except for not using Binder Solution A (including Binder Solution A in the liquid dispersion). The viscosity of the composition of Comparative Example 1-2 was 80 mPa·s.

Comparative Example 1-3

The composition of Comparative Example 1-3 was obtained by formulating the same composition as in Example 1-5 except for replacing Binder Solution A (including Binder Solution A in the liquid dispersion) by Binder Solution C. The viscosity of the composition of Comparative Example 1-3 was 950 mPa·s.

The characteristics of each of polymerizable compositions (dispersions) of Examples 1-1 to 1-14 and Comparative Examples 1-1 to 1-3 are shown together in the Table below.

was coated by a spin coating method on a silicon wafer to a thickness of 25 μm and then heated on a hot plate at 120° C. for 2 minutes to obtain a photosensitive layer.

The obtained photosensitive layer was irradiated using an i-line stepper through a photomask having a pattern of 300 μm in diameter by changing the exposure dose in steps of 50 mJ/cm$^2$ in the exposure dose range of 50 to 2,000 mJ/cm$^2$.

The photosensitive layer after exposure was subjected to puddle development at 25° C. for 40 seconds by using an aqueous 2.38 mass % tetramethylammonium hydroxide solution, then rinsed with a spin shower and further washed with pure water to obtain an infrared-shielding solder resist pattern. At the time of performing the developing step for 60 seconds, the minimum exposure dose when a circle pattern of 300 μm in diameter was obtained, was measured and used as an index of pattern formability. A smaller numerical value indicates higher sensitivity and better pattern formability.

(Evaluation of Infrared-Shielding Property and Visible Light Transparency)

The polymerizable composition was spin-coated on a glass substrate under the conditions above to form a photosensitive layer (polymerizable composition layer) coating film having a thickness of 25 μm, and the coating film was measured for the transmittance at a wavelength of 1,200 nm by using an ultraviolet-visible-near infrared spectrophotometer, UV-3600 (manufactured by Shimadzu Corporation). As the numerical value is lower, the infrared-shielding property is judged as excellent. When the transmittance is 2% or less, the film can be said to exhibit practically good infrared-shielding property.

TABLE 1

| | Infrared-Shielding Material | Alkali-Soluble Binder | Polymerization Initiator | Polymerizable Compound | Crosslinking Agent | Curing Accelerator | Filler |
|---|---|---|---|---|---|---|---|
| Example 1-1 | cesium tungsten oxide | methacrylic resin | Irgacure OXE02 | DPHA | used | used | silica |
| Example 1-2 | cesium tungsten oxide | methacrylic resin | Compound B | DPHA | used | used | silica |
| Example 1-3 | cesium tungsten oxide | methacrylic resin | Irgacure OXE02 | A-DCP | used | used | silica |
| Example 1-4 | cesium tungsten oxide | methacrylic resin | Compound B | A-DCP | used | used | silica |
| Example 1-5 | cesium tungsten oxide (high concentration) | methacrylic resin | Compound B | A-DCP | used | used | silica |
| Example 1-6 | cesium tungsten oxide (high concentration) | urethane-based resin | Compound B | A-DCP | used | used | silica |
| Example 1-7 | cesium tungsten oxide (high concentration) | methacrylic resin | Compound B | A-DCP | not used | used | silica |
| Example 1-8 | cesium tungsten oxide (high concentration) | methacrylic resin | Compound B | A-DCP | used | not used | silica |
| Example 1-9 | cesium tungsten oxide (high concentration) | methacrylic resin | Compound B | A-DCP | used | used | not used |
| Example 1-10 | cesium tungsten oxide (high concentration) | methacrylic resin | Compound B | A-DCP | used | used | silica |
| Example 1-11 | cesium tungsten oxide (high concentration) | methacrylic resin | Compound B | A-DCP | used | not used | silica |
| Example 1-12 | cesium tungsten oxide (high concentration) | methacrylic resin | Irgacure 907 | A-DCP | used | not used | silica |
| Example 1-13 | cesium tungsten oxide (high concentration) | methacrylic resin | Irgacure 907 | A-DCP | used | not used | silica |
| Example 1-14 | cesium tungsten oxide (high concentration) | methacrylic resin | Irgacure 907 | A-DCP | used | not used | silica |
| Comparative Example 1-1 | carbon black | methacrylic resin | Compound B | A-DCP | used | used | silica |
| Comparative Example 1-2 | cesium tungsten oxide (high concentration) | not contained | Compound B | A-DCP | used | used | silica |
| Comparative Example 1-3 | cesium tungsten oxide (high concentration) | methacrylic resin having no alkali-soluble group | Compound B | A-DCP | used | used | silica |

<Evaluation of Polymerizable Composition for Solder Resist>

(Resist Pattern Formation)

Each of the polymerizable compositions obtained in Examples 1-1 to 1-14 and Comparative Examples 1-1 to 1-3

Furthermore, the coating film above was measured for the transmittance at a wavelength of 550 nm by using an ultraviolet-visible-near infrared spectrophotometer, UV-3600 (manufactured by Shimadzu Corporation). As the numerical value is higher, the visible light transparency is judged as excellent. When the visible light transmittance is 30% or more, the film can be said to exhibit practically good visible light transparency.

(Pattern Evaluation)

Exposure using the minimum exposure dose and development were performed according to (Resist Pattern Formation) above to form a pattern. The pattern was evaluated according to the following criteria for judgment. However, with respect to Comparative Examples 1-1 to 1-3, the minimum exposure dose could not be calculated due to lack of sufficient resolution and therefore, exposure was performed with an exposure dose of 200 mJ/cm$^2$.

[Criteria for Judgment]

A: A pattern with sufficient adherence was formed on the substrate and the cross-sectional profile of the pattern had good rectangularity.

B: A pattern-like thing was formed but adherence to the substrate was insufficient and a pattern stably adhering on the substrate could not be formed.

C: A pattern could not be resolved.

(High-Temperature High-Humidity Durability Evaluation (Insulation Reliability Evaluation): HAST Test)

On a silicon wafer as a substrate where comb-like wiring was formed to a copper thickness of 12 μM and a copper line/space ratio of 50 μm/50 μm, each of the polymerizable compositions of Examples 1-1 to 1-14 and Comparative Examples 1-1 to 1-3 was coated by a spin coating method to have a film thickness of 20 μm on the copper. The coating film was then heated on a hot plate at 100° C. for 2 minutes to obtain a photosensitive layer.

The obtained photosensitive layer was irradiated at 800 mJ/cm$^2$ by using a high-pressure mercury lamp.

The photosensitive layer after exposure was subjected to puddle development at 25° C. for 40 seconds by using an aqueous 2.38 mass % tetramethylammonium hydroxide solution, then rinsed with a spin shower, further washed with pure water and heat-treated (post-baking) at 150° C. for 1 hour to form a solder resist pattern (permanent pattern). The formed permanent pattern was subjected to a HAST test to evaluate the dendrite and the insulation resistance (a). In the HAST test, a high acceleration tester was used and after a voltage of 10 V was applied to an electronic module for 200 hours in an atmosphere of a temperature of 130° C. and a relative humidity of 85%, the insulation resistance (Ω) of the conductor bump was measured under the same conditions. Thereafter, the conductor bump was observed for dendrite and evaluated as follows.

Also, a permanent pattern formed by the same method above on a substrate where a comb-like wiring is formed to a copper thickness of 12 μm and a copper line/space ratio of 25 μm/25 μm, was evaluated in the same manner.

[Criteria for Judgment]

A: Wiring was not changed at all.

B: Dendrite was not observed but anode wiring was slightly changed.

C: Dendrite was not observed but anode wiring was unclear.

D: Dendrite was present.

(Repeated Heat/Cold Shock Resistance: Thermal Cycle Test (TCT) Resistance)

On a silicon wafer as a substrate where comb-like wiring was formed to a copper thickness of 12 μm and a copper line/space ratio of 50 μm/50 μm, each of the polymerizable compositions of Examples 1-1 to 1-14 and Comparative Examples 1-1 to 1-3 was coated by a spin coating method to have a film thickness of 20 μm on the copper. The coating film was then heated on a hot plate at 100° C. for 2 minutes to obtain a photosensitive layer.

The obtained photosensitive layer was irradiated at 800 mJ/cm$^2$ by using a high-pressure mercury lamp.

The photosensitive layer after exposure was subjected to puddle development at 25° C. for 40 seconds by using an aqueous 2.38 mass % tetramethylammonium hydroxide solution, then rinsed with a spin shower, further washed with pure water and heat-treated (post-baking) at 150° C. for 1 hour to form a solder resist pattern (permanent pattern). The formed permanent pattern was subjected to a test using a vapor-phase heat/cold tester, where an electronic module was left standing in a vapor phase at a temperature of −55° C. and a temperature of 125° C. each for 30 minutes and this was taken as one cycle. The test was performed under the conditions of 300 cycles, and the permanent pattern in a region of 5 cm×5 cm was evaluated for the heat/cold shock resistance according to the following criteria.

[Criteria for Judgment]

A: Cracks were not generated.

B: Cracks were generated but the number of cracks was less than 10.

C: The number of cracks generated was 10 or more.

TABLE 2

| | Infrared-Shielding Property (1200 nm) | Visible Light Transmissibility (550 nm) | Minimum Exposure Dose (mJ/cm$^2$) | Pattern Profile | Insulation Reliability L/S = 50/50 (10 V, 200 hr) | Insulation Reliability L/S = 25/25 (10 V, 200 hr) | TCT Resistance |
|---|---|---|---|---|---|---|---|
| Example 1-1 | <2% | 65% | 200 | A | B | C | B |
| Example 1-2 | <2% | 65% | 100 | A | B | C | B |
| Example 1-3 | <2% | 65% | 200 | A | A | B | B |
| Example 1-4 | <2% | 65% | 100 | A | A | B | B |
| Example 1-5 | <1% | 61% | 100 | A | A | B | B |
| Example 1-6 | <1% | 61% | 100 | A | B | B | A |
| Example 1-7 | <1% | 61% | 100 | A | B | C | B |
| Example 1-8 | <1% | 61% | 100 | A | B | B | B |
| Example 1-9 | <1% | 61% | 100 | A | B | C | B |
| Example 1-10 | <2% | 65% | 200 | A | A | B | B |
| Example 1-11 | <2% | 65% | 200 | A | A | B | B |
| Example 1-12 | <2% | 61% | 100 | A | A | B | B |
| Example 1-13 | <2% | 61% | 100 | A | A | A | B |
| Example 1-14 | <2% | 61% | 100 | A | A | A | A |
| Comparative | <1% | <1% | 200 | B | could not be | could not be | could not be |

TABLE 2-continued

| | Infrared-Shielding Property (1200 nm) | Visible Light Transmissibility (550 nm) | Minimum Exposure Dose (mJ/cm$^2$) | Pattern Profile | Insulation Reliability L/S = 50/50 (10 V, 200 hr) | Insulation Reliability L/S = 25/25 (10 V, 200 hr) | TCT Resistance |
|---|---|---|---|---|---|---|---|
| Example 1-1 | | | | | evaluated | evaluated | evaluated |
| Comparative Example 1-2 | <1% | 61% | 200 | C | could not be evaluated | could not be evaluated | could not be evaluated |
| Comparative Example 1-3 | <1% | 61% | 200 | C | could not be evaluated | could not be evaluated | could not be evaluated |

As seen from the results in Table 2, according to the polymerizable composition of the present invention, when used for a solder resist, a pattern satisfying all of the conditions that (1) the light-blocking effect in the infrared region is high, (2) the light transparency in the visible region is high, and (3) a desired profile as well as excellent durability (durability to high temperature and high humidity, adherence to substrate) are achieved, can be formed by alkali development.

On the other hand, in Comparative Examples 1-1 to 1-3, a pattern having a desired profile and sufficient durability could not be obtained. Therefore, the compositions of Comparative Examples 1-1 to 1-3 could not be evaluated for the insulation reliability and TCT resistance.

[(2) Example where a Light-Blocking Film for Back Surface of a Silicon Substrate is Produced Using the Polymerizable Composition of the Present Invention]

(Preparation of Infrared-Blocking Polymerizable Composition (BA))

The components of the following composition were mixed with a stirrer to prepare an infrared-blocking curable composition.

| | |
|---|---|
| A propylene glycol monomethyl ether acetate 30 mass % solution of Alkali-Soluble Resin (D-1) (acid group content: 0.56 meq/g, crosslinking group content: 2.2 meq/g) | 10 parts by mass |
| Dipentaerythritol hexaacrylate | 2.0 parts by mass |
| Pentaerythritol triacrylate | 1.0 parts by mass |
| Irgacure OXE01 (BASF Japan) | 0.3 parts by mass |
| A 18.5 mass % liquid dispersion of cesium tungsten oxide (Cs$_{0.33}$WO$_3$) (YMF-02, produced by Sumitomo Metal Mining Co., Ltd., average dispersion particle diameter: 800 nm or less) | 24 parts by mass |
| Propylene glycol monomethyl ether acetate | 10 parts by mass |
| Ethyl-3-ethoxypropionate | 8 parts by mass |
| γ-Methacryloxypropyltrimethoxysilane | 0.1 parts by mass |

(Preparation of Infrared-Blocking Polymerizable Composition (B-2))

Infrared-Blocking Polymerizable Composition (B-2) was prepared in the same manner as Infrared-Blocking Polymerizable Composition (B-1) except that the amounts added of dipentaerythritol hexaacrylate and pentaerythritol triacrylate used in the preparation of Infrared-Blocking Polymerizable Composition (B-1) were changed to 0.5 parts by mass and the content of the polymerizable compound contained in the infrared-blocking polymerizable composition was set to 9 mass % by changing the amount added of the propylene glycol monomethyl ether acetate 30 mass % solution in Alkali-Soluble Resin (D-1) to 16.7 parts by mass.

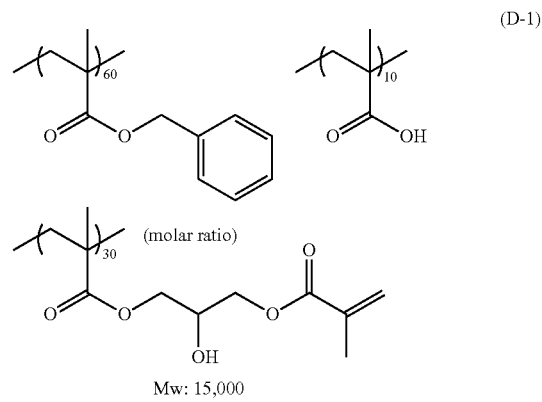

(D-1)

Mw: 15,000

—Production of Light-Blocking Film and Solid-State Imaging Device—

<Preparation of Substrate A and Substrate B>

(Preparation of Substrate A)

In the solid-state imaging device of one embodiment above (an embodiment having no solder resist layer on the back surface), Substrate A was prepared as follows.

Figure 3:
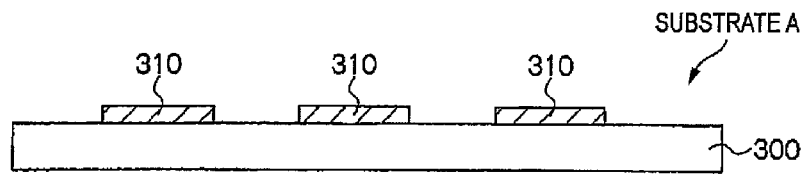
FIG. 3 is a schematic cross-sectional view of Substrate A used in Example 2-1 and Example 2-2.

That is, a copper (Cu)-made circular metal electrode having a thickness of 5 μm and a diameter of 10 μm was obtained on a silicon substrate by using a microfabrication (photolithography) technique, a sputtering method and an electrolytic plating method. In this way, Substrate A having a plurality of circular metal electrodes 310 on a silicon substrate 300, as shown in the schematic cross-sectional view of FIG. 3, was obtained.

(Preparation of Substrate B)

In the solid-state imaging device of one embodiment above (an embodiment having a solder resist layer on the back surface), Substrate B was prepared as follows.

On the circular metal electrode forming surface side of Substrate A, a solder resist layer having a circular pattern of 10 μm was formed by photolithography using a solder resist below.

Figure 5:
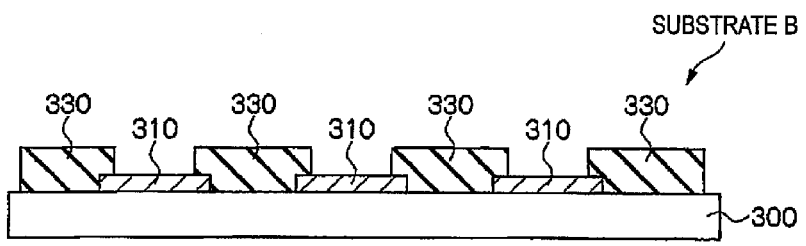
FIG. 5 is a schematic cross-sectional view of Substrate B used in Example 2-1 and Example 2-2.

The pattern of the solder resist layer was a pattern having an opening to expose a part of the metal electrode, as shown in FIG. 5.

In this way, Substrate B of configuration having a plurality of circular metal electrodes 310 and a plurality of solder resist layers 330 on a silicon substrate 300, as shown in the schematic cross-sectional view of FIG. 5, was obtained.

The components of the solder resist were as follows.

| | |
|---|---|
| Resin solution shown below | 155 parts by mass |
| 2-(Acetyloxyiminomethyl)thioxanthen-9-one (photopolymerization initiator) | 2 parts by mass |

-continued

| | |
|---|---|
| 2-Methyl-1-[4-(methylthiopheny1)]-2-morpholinopropan-1-one (photopolymerization initiator) | 6 parts by mass |
| 2,4-Diethylthioxanthone (sensitizer) | 1 parts by mass |
| C.I. Pigment Blue 15:6 (coloring agent) | 0.9 parts by mass |
| C.I. Pigment Yellow 199 (coloring agent) | 2.3 parts by mass |
| Dipentaerythritol hexaacrylate (polymerizable compound) | 20 parts by mass |
| Trimethylolpropane triacrylate (polymerizable compound) | 10 parts by mass |
| Barium sulfate (filler) | 130 parts by mass |
| Phenol novolak-type epoxy resin (EPPN-201, produced by Nippon Kayaku Co., Ltd.) (heat curing component) | 15 parts by mass |
| Bixylenol-type epoxy resin (YX-4000, produced by Japan Epoxy Resins Co., Ltd.) | 30 parts by mass |
| Melamine | 3 parts by mass |
| Propylene glycol monomethyl ether acetate | 5 parts by mass |
| Ipsol #150 (produced by Idemitsu Petro-Chemical Co., Ltd., aromatic organic solvent) | 5 parts by mass |

(Preparation of Resin Solution)

Cresol novolak-type epoxy resin (EOCN-104S, produced by Nippon Kayaku Co., Ltd.) (660 g), 421.3 g of carbitol acetate and 180.6 g of solvent naphtha were charged, dissolved under heat with stirring at 90° C., and then cooled to 60° C. Subsequently, 216 g of acrylic acid, 4.0 g of triphenylphosphine and 1.3 g of p-methoxyphenol were added, and a reaction was performed at 100° C. for 12 hours. The acid value at this time was 0.3 mgKOH/g. Thereto, 241.7 g of tetrahydrophthalic anhydride was charged, and a reaction was performed for 6 hours under heating at 90° C. In this way, a resin solution having a solid content concentration of 65 mass %, a solid content acid value of 77 mgKOH/g, a double-bond equivalent (weight in g of the resin per mol of unsaturated group) of 400 g/equivalent and a weight average molecular weight of 8,000 was obtained.

<Production of Light-Blocking Film>

The infrared-blocking polymerizable composition of Examples prepared above was coated by a spin coating method on the metal electrode-formed surface side of each of Substrate A and Substrate B to a thickness of 3 μm and then heated on a hot plate at 120° C. for 2 minutes to obtain an infrared-blocking polymerizable composition coated layer.

The coated layer obtained was exposed using an i-line stepper through a photomask for formation of a circular pattern of 10 μM in diameter by changing the exposure dose in steps of 50 mJ/cm² to an exposure dose of 1,000 mJ/cm² from 100 mJ/cm².

The coated layer after exposure was subjected to puddle development at 23° C. for 60 seconds by using an aqueous 0.3 mass % tetramethylammonium hydroxide solution, then rinsed with a spin shower and further washed with pure water to obtain a patterned infrared-blocking film.

Figure 4:
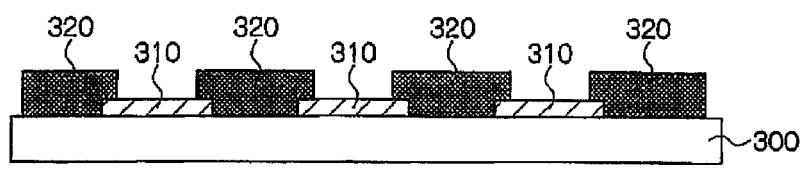
FIG. 4 is a schematic cross-sectional view showing how a light-blocking film is formed on Substrate A.

Here, the light-blocking film on Substrate A had a pattern having an opening to expose a part of the metal electrode 310 as shown in FIG. 4 (light-blocking film 320 in FIG. 4).

Figure 6:
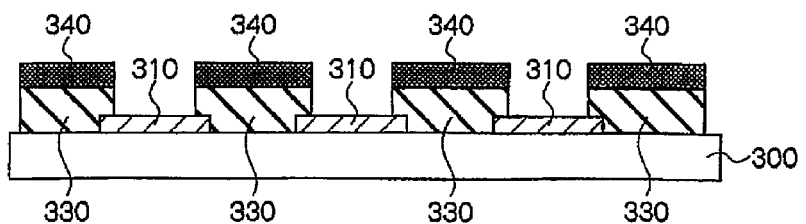
FIG. 6 is a schematic cross-sectional view showing how a light-blocking film is formed on Substrate B.

The light-blocking film on Substrate B had a pattern having an opening to expose a part of the metal electrode 310 as shown in FIG. 6 (more specifically, a pattern overlapping the solder resist layer when viewed from the substrate normal direction; light-blocking film 340 in FIG. 6).

—Evaluation—

The light-blocking films above were subjected to the following evaluations. The evaluation results are shown in Table 3.

(Adherence Evaluation)

With respect to the light-blocking film, the minimum exposure dose causing no separation from the silicon substrate side was evaluated as the adhesion sensitivity. A smaller adhesion sensitivity value indicates higher adherence to substrate. As for the minimum exposure dose causing no separation, when the exposure dose at the development was stepwise increased and the film was irradiated with an exposure dose corresponding to each step and when the region of 100 μm (length)×100 μm (width) was observed by SEM, the time when all patterns could be formed without chipping was defined as "causing no separation" and the exposure dose irradiated at this time was taken as the "minimum exposure dose causing no separation".

(Step Evaluation)

Each cross-section of 20 light-blocking films produced on each of Substrate A and Substrate B by performing development with the minimum exposure dose causing no separation of the light-blocking film from the silicon substrate side was observed by SEM, and the average of width of the step region (the region where the film thickness was 90% or less of the film thickness in the center part of the light-blocking film) in the light-blocking film was measured. As the average of the width of the step region in 20 light-blocking films produced on each substrate is smaller, this indicates that a pattern having a desired profile is obtained and also indicates that the film has excellent light-blocking ability in the center part and the peripheral part.

(Evaluation of Infrared-Shielding Property and Visible Light Transparency)

The light-blocking film before development produced on each of Substrate A and Substrate B was measured for the maximum transmittance in the wavelength region of 1,200 nm by using a spectrophotometer (UV-3600, manufactured by Shimadzu Corporation). A smaller numerical value indicates higher performance. When the maximum transmittance is less than 1%, this indicates that the infrared-shielding property is good.

Furthermore, the light-blocking film above was measured for the transmittance at a wavelength of 550 nm by using a spectrophotometer (UV-3600, manufactured by Shimadzu Corporation). As the numerical value is higher, the visible light transparency is judged as excellent. When the visible light transmittance is 25% or more, the film can be said to exhibit practically good visible light transparency.

TABLE 3

| | Infrared-Blocking Polymerizable Composition | Adhesion Sensitivity (mJ/cm²) | | Step (μm) | | Infrared-Shielding Property (1200 nm) | | Visible Light Transparency (550 nm) | |
|---|---|---|---|---|---|---|---|---|---|
| | | Substrate A | Substrate B | Substrate A | Substrate B | Substrate A | Substrate B | Substrate A | Substrate B |
| Example 2-1 | B-1 | 200 | 250 | 0.10 | 0.09 | 0.7% | 0.7% | 50% | 49% |
| Example 2-2 | B-2 | 150 | 200 | 0.10 | 0.11 | 0.7% | 0.7% | 52% | 50% |

As seen from the results in Table 3, according to the polymerizable composition of the present invention, even when used as a light-blocking film for back surface of a silicon substrate, a pattern satisfying all of the conditions that (1) the light-blocking effect in the infrared region is high, (2) the light transparency in the visible region is high, and (3) a desired profile as well as excellent durability (adherence to substrate) are achieved, can be formed by alkali development.

[(3) Example where a Light-Blocking Film for Wafer-Level Lens is Produced Using the Polymerizable Composition of the Present Invention]

<Preparation of Infrared-Blocking Polymerizable Composition>

Example 3-1

The following composition was mixed with a stirrer to prepare an infrared-blocking curable composition.

| | |
|---|---|
| A 18.5 mass % liquid dispersion of cesium tungsten oxide ($Cs_{0.33}WO_3$) (YMF-02, produced by Sumitomo Metal Mining Co., Ltd., average dispersion particle diameter: 800 nm or less) | 200 parts by mass |
| A 30 mass % propylene glycol monomethyl ether acetate solution of Alkali-Soluble Resin (D-1') (acid group content: 0.80 meq/g, crosslinking group content: 1.2 meq/g) | 15 parts by mass |
| Dipentaerythritol hexaacrylate | 15 parts by mass |
| Pentaerythritol triacrylate | 5.0 parts by mass |
| Irgacure OXE01 (BASF Japan) | 20.0 parts by mass |
| Propylene glycol monomethyl ether acetate | 50 parts by mass |
| γ-Methacryloxypropyltrimethoxysilane | 0.1 parts by mass |
| Fluorine-containing surfactant (Megaface F171, produced by DIC) | 0.05 parts by mass |

Example 3-2

The following composition was mixed with a stirrer to prepare an infrared-blocking curable composition.

| | |
|---|---|
| A 18.5 mass % liquid dispersion of cesium tungsten oxide ($Cs_{0.33}WO_3$) (YMF-02, produced by Sumitomo Metal Mining Co., Ltd., average dispersion particle diameter: 800 nm or less) | 200 parts by mass |
| A 30 mass % propylene glycol monomethyl ether acetate solution of Alkali-Soluble Resin (D-1') (acid group content: 0.80 meq/g, crosslinking group content: 1.2 meq/g) | 18 parts by mass |
| Dipentaerythritol hexaacrylate | 16.5 parts by mass |
| Pentaerythritol triacrylate | 6.5 parts by mass |
| Irgacure OXE01 (BASF Japan) | 20.0 parts by mass |
| Propylene glycol monomethyl ether acetate | 50 parts by mass |
| γ-Methacryloxypropyltrimethoxysilane | 0.1 parts by mass |
| Fluorine-containing surfactant (Megaface F171, produced by DIC) | 0.05 parts by mass |

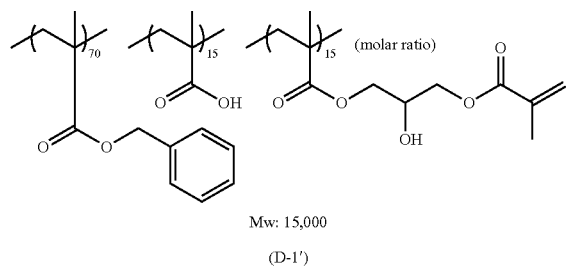

Mw: 15,000

(D-1')

<Production and Evaluation of Light-Blocking Film for Wafer-Level Lens on Glass Substrate>

(Coating Step)

Each of the infrared-blocking polymerizable compositions of Examples 3-1 and 3-2 was uniformly coated on a glass substrate of 5 cm×5 cm (thickness: 1 mm, BK7, produced by Schott) to give a film thickness of 2.0 μm after heat treatment by adjusting the rotation speed during coating by spin coating and then heat-treated by a hot plate at a surface temperature of 120° C. for 120 seconds. In this way, an infrared-blocking polymerizable composition coated layer having a film thickness of 2.0 μm was obtained.

(Exposure Step)

Figure 15:
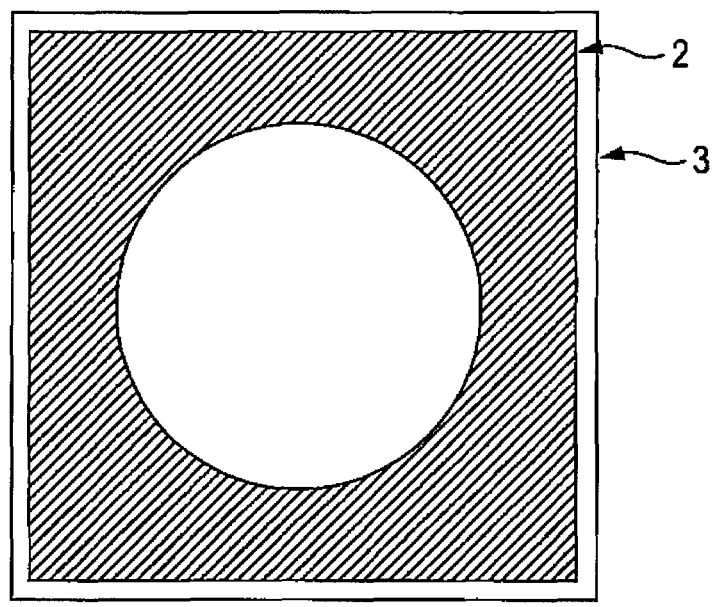
FIG. 15 is a view of the pattern in exposure used in Examples, wherein 2 denotes large pattern, 3 denotes fine pattern, 10 denotes silicon substrate, 12 denotes imaging device, 13 denotes interlayer insulating film, 14 denotes base layer, 15 denotes color filter, 16 denotes overcoat, 17 denotes microlens, 18 denotes light-blocking film, 20 denotes adhesive, 22 denotes insulating film, 23 denotes metal electrode, 24 denotes solder resist layer, 26 denotes internal electrode, 27 denotes device surface electrode, 30 denotes glass substrate, 40 denotes imaging lens, 41 denotes adhesive, 42 denotes infrared cut filter, 43 denotes adhesive, 44 denotes light-blocking and electromagnetic shield, 45 denotes adhesive, 50 denotes lens holder, 60 denotes solder ball, 70 denotes circuit board, 100 denotes solid-state imaging device substrate, 200 denotes camera module, 300 denotes silicon substrate, 310 denotes circular metal electrode, 320 denotes light-blocking film, 330 denotes resist layer, 340 denotes light-blocking film, 410 denotes substrate, 412 and 420 denote lens, 412a denotes lens face, 412b denotes lens edge part, 414 denotes light-blocking film, 414A denotes light-blocking coated layer, 414a denotes lens opening, 450 denotes dispenser, 460 and 480 each denote mold, 462 and 482 each denote concave, and 470 denotes mask.

The coated layer obtained was exposed using a high-pressure mercury lamp through a photomask having a pattern shown in FIG. 15 by changing the exposure dose in steps of 50 $mJ/cm^2$ to an exposure dose of 1,000 $mJ/cm^2$ from 100 $mJ/cm^2$. In FIG. 15, the portion denoted by 2 is a rectangular large pattern of 0.2×0.2 mm having a circular hole part with a diameter of 0.1 mm in the center part, and the portion denoted by 3 is a fine pattern as a line-and-space pattern of 10 μm.

(Developing Step)

The coated layer after exposure was subjected to puddle development at 23° C. for 60 seconds by using an aqueous 0.3 mass % tetramethylammonium hydroxide solution, then rinsed with a spin shower and further washed with pure water to obtain a patterned infrared-blocking film.

<Evaluation of Adherence on Glass Substrate>

The thus-obtained substrate with a light-blocking film formed on a glass substrate was subjected to the following evaluations.

The minimum exposure dose causing no separation at the development in the large pattern and that in the small pattern were designated as Adhesion Sensitivity A and Adhesion Sensitivity B, respectively. A lower adhesion sensitivity indicates higher adherence, and a smaller difference in the adhesion sensitivity between the large pattern and the fine pattern indicates better pattern formability.

<Evaluation of Film Thickness Uniformity on Glass Substrate>

The thickness of the substrate having thereon the infrared-blocking polymerizable composition coated layer with a film thickness of 2.0 μm obtained in the coating step above was measured by a stylus thickness meter, DECTAC-3 (manufactured by ULVAC, Inc.), in the portion from the center part to 10 μm inside the edge part in the diagonal direction. The thickness unevenness is represented by the following formula and expressed in "%". A smaller thickness unevenness indicates that a pattern having a desired profile was obtained.

Thickness unevenness=(thickness in center part−thickness at 30 μm inside edge part)/thickness in center part <Evaluation of Infrared-Shielding Property and Visible Light Transparency>

Using the substrate produced above in which an infrared-blocking polymerizable composition coated layer was formed on a glass wafer, the maximum transmittance in the wavelength region of 1,200 nm was measured by a spectrophotometer (UV-3600, manufactured by Shimadzu Corporation). A smaller numerical value indicates higher performance. When the maximum transmittance is less than 1%, this indicates that the infrared-shielding property is good.

Furthermore, the coated layer above was measured for the transmittance at a wavelength of 550 nm by using a spectrophotometer (UV-3600, manufactured by Shimadzu Corporation). As the numerical value is higher, the visible light transparency is judged as excellent. When the visible light transmittance is 25% or more, the film can be said to exhibit practically good visible light transparency.

TABLE 4

|  | Adhesion Sensitivity B (mJ/cm²) | Adhesion Sensitivity A (mJ/cm²) | Adhesion Sensitivity A-Adhesion Sensitivity B (mJ/cm²) | Film Thickness Uniformity (thickness unevenness) | Infrared-Shielding Property (1200 nm) | Visible Light Transparency (550 nm) |
|---|---|---|---|---|---|---|
| Example 3-1 | 100 | 150 | 50 | 0% | 0.8% | 55% |
| Example 3-2 | 80 | 100 | 20 | 0% | 0.8% | 53% |

As seen from Table 4, in Examples 3-1 and 3-2, the adhesion sensitivity of large pattern, adhesion sensitivity of fine pattern, infrared-shielding property, visible light transparency and film thickness uniformity are high.

Example 3-3

A curable resin layer was formed using a curable composition for lens (a composition prepared by adding 1 mass % of an arylsulfonium salt derivative (SP-172, produced by ADEKA) to an alicyclic epoxy resin (EHPE-3150, produced by Daicel Chemical Industries, Ltd.)) on a substrate where a patterned light-blocking film was formed in the same manner as in Example 3-1, and after transferring a lens shape by using a quartz mold having the shape, cured with an exposure dose of 400 mJ/cm² by means of a high-pressure mercury lamp, whereby a wafer-level lens array having a plurality of wafer-level lenses was produced.

The produced wafer-level lens array was cut and to the lens module obtained, an imaging device and a sensor substrate were fixed, whereby an imaging unit was manufactured.

The light-blocking film of the wafer-level lens obtained in Example 3-3 was high in the adherence to substrate, the film thickness uniformity, the infrared-shielding property and the visible light transparency.

It is seen that according to the polymerizable composition of the present invention, even when used as a light-blocking film for wafer-level lens, a pattern satisfying all of the conditions that (1) the light-blocking effect in the infrared region is high, (2) the light transparency in the visible region is high, and (3) a desired profile as well as excellent durability (adherence to substrate) are achieved, can be formed by alkali development.

In this way, the polymerizable composition of the present invention is an infrared-blocking polymerizable composition suitable for use in producing a light-blocking film for wafer-level lens.

INDUSTRIAL APPLICABILITY

According to the present invention, a polymerizable composition capable of forming a pattern with high light-blocking effect in the infrared region, high light transparency in the visible region, and desired profile and excellent durability (for example, durability to high temperature/high humidity, and adherence to substrate) by alkali development, is provided.

This application is based on Japanese patent application Nos. JP 2010-115841 filed on May 19, 2010, JP 2010-255380 filed on Nov. 15, 2010 and JP 2011-040902 filed on Feb. 25, 2011, and U.S. Provisional Application No. 61/351,407 filed on Jun. 4, 2010, the entire contents of which are hereby incorporated by reference, the same as if set forth at length.

The invention claimed is:

1. A polymerizable composition, comprising:
a polymerization initiator;
a polymerizable compound;
a tungsten compound;
an alkali-soluble binder; and
a filler,
wherein the polymerizable composition has a viscosity at 25° C. of 700 to 1400 mPa·s and the polymerization initiator is an acetophenone-based compound.

2. The polymerizable composition according to claim 1, wherein the alkali-soluble binder has an acid group and a crosslinking group.

3. The polymerizable composition according to claim 1, wherein the alkali-soluble binder is a urethane-based resin.

4. The polymerizable composition according to claim 1, wherein the alkali-soluble binder is a (meth)acrylic resin.

5. The polymerizable composition according to claim 1, wherein the tungsten compound is represented by the following formula (1):

$$M_xW_yO_z \qquad (I)$$

wherein M represents a metal;
W represents tungsten;
O represents oxygen;
$001 \leq x/y \leq 1.1$; and
$2.2 \leq z/y \leq 3.0$.

6. The polymerizable composition according to claim 5, wherein M is an alkali metal.

7. The polymerizable composition according to claim 1, wherein the polymerizable compound is a polyfunctional polymerizable compound having a plurality of polymerizable groups within a molecule.

8. The polymerizable composition according to claim 1, wherein the filler includes at least two kinds of fillers having different volume average particle diameters of primary particles.

9. The polymerizable composition according to claim 1, further comprising:
a silane coupling agent.

10. A solder resist comprising a polymerizable composition comprising:
a polymerization initiator;
a polymerizable compound;
a tungsten compound;
an alkali-soluble binder; and
a filler,
wherein the polymerizable composition has a viscosity at 25° C. of 700 to 1400 mPa·s.

11. The solder resist according to claim 10, wherein the polymerizable composition has a solid content concentration of from 30 to 80 mass %.

12. The polymerizable composition according to claim 3, wherein the urethane-based resin is a urethane-based resin having, as the basic structure, a structure unit represented by a reaction product between at least one diisocyanate compound represented by formula (1) and at least one diol compound represented by formula (2):

$$OCN-X-NCO \qquad (1)$$

$$HO-L^1-OH \qquad (2)$$

wherein in formulae (1) and (2), each of X and $L^1$ independently represents a divalent organic residue.

13. A polymerizable composition comprising:
a polymerization initiator;
a polymerizable compound;

a tungsten compound;
an alkali-soluble binder; and
a filler,
wherein:
the polymerizable composition has a viscosity at 25° C. of 700 to 1400 mPa·s, and
the polymerization initiator is an oxime compound selected from the group consisting of 1,2-octanedione, 1-[4-(phenylthio)-, 2-(O-benzoyloxime)] and ethanone, 1-[9-ethyl-6-(2-methylbenzoyl)-9H-carbazol-3-yl]-, 1-(O-acetyloxime).

14. The polymerizable composition according to claim 1, wherein the filler is a silica.

15. A polymerizable composition comprising:
a polymerization initiator;
a polymerizable compound;
a tungsten compound;
an alkali-soluble binder;
a filler; and
a dispersant,
wherein:
the polymerizable composition has a viscosity at 25° C. of 700 to 1400 mPa·s, and
the dispersant has a structural unit represented by any one of formulae (1) to (5):

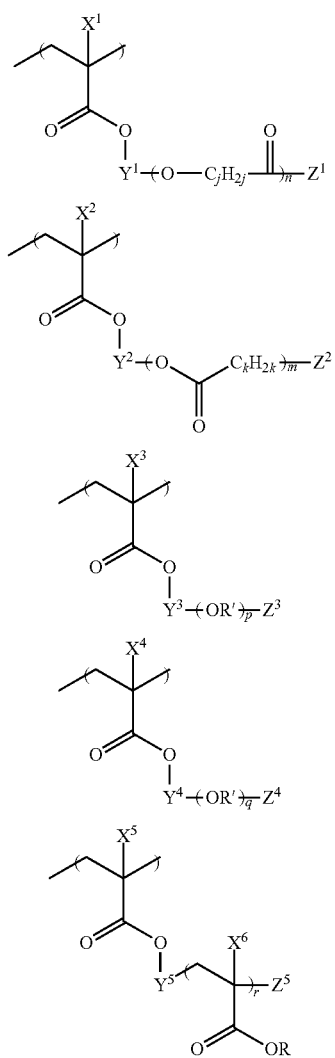

wherein, in formulae (1) to (5), each of $X^1$, $X^2$, $X^3$, $X^4$, $X^5$ and $X^6$ independently represents a hydrogen atom or a monovalent organic group,
each of $Y^1$, $Y^2$, $Y^3$, $Y^4$ and $Y^5$ independently represents a divalent linking group,
each of $Z^1$, $Z^2$, $Z^3$, $Z^4$ and $Z^5$ independently represents a hydrogen atom or a monovalent substituent,
each of n, m, p, q and r represents an integer of 1 to 500,
in formulae (1) and (2), each of j and k independently represents an integer of 2 to 8,
in formulae (3) and (4), R' represents a branched or linear alkylene group, and
in formula (5), R represents a hydrogen atom or a monovalent organic group.

16. A polymerizable composition comprising:
a polymerization initiator;
a polymerizable compound;
a tungsten compound;
an alkali-soluble binder;
a filler; and
a rubber-modified epoxy resin,
wherein the polymerizable composition has a viscosity at 25° C. of 700 to 1400 mPa·s.

17. The polymerizable composition according to claim 1, further comprising a crosslinking agent.

18. The polymerizable composition according to claim 1, further comprising a curing accelerator.

19. A polymerizable composition comprising:
a polymerization initiator;
a polymerizable compound;
a tungsten compound;
an alkali-soluble binder; and
a filler.
wherein the polymerizable composition has a viscosity at 25° C. of 700 to 1400 mPa·s and the filler is a spherical filler surface-treated with a silane coupling agent.

20. The polymerizable composition according to claim 1, wherein a content of the filler is 1 to 60% by mass based on an entire solid content of the polymerizable composition.

21. The solder resist according to claim 10, wherein the alkali-soluble binder has an acid group and a crosslinking group.

22. The solder resist according to claim 10, wherein the alkali-soluble binder is a urethane-based resin.

23. The solder resist according to claim 10, wherein the alkali-soluble binder is a (meth)acrylic resin.

24. The solder resist according to claim 10, wherein the tungsten compound is represented by the following formula (1):

$$M_xW_yO_z \qquad (I)$$

wherein M represents a metal;
W represents tungsten;
O represents oxygen;
$0.001 \leq x/y \leq 1.1$; and
$2.2 \leq z/y \leq 3.0$.

25. The solder resist according to claim 10, wherein M is an alkali metal.

26. The solder resist according to claim 10, wherein the polymerizable compound is a polyfunctional polymerizable compound having a plurality of polymerizable groups within a molecule.

27. The solder resist according to claim 10, wherein the polymerization initiator is an acetophenone-based compound.

28. The solder resist according to claim 10, wherein the filler includes at least two kinds of fillers having different volume average particle diameters of primary particles.

29. The solder resist according to claim 10, further comprising:
a silane coupling agent.

30. The solder resist according to claim 10, further comprising a dispersant,
wherein the dispersant has a structural unit represented by any one of formulae (1) to (5):

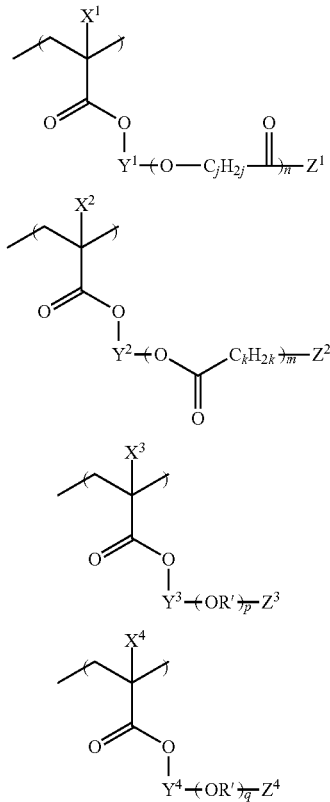

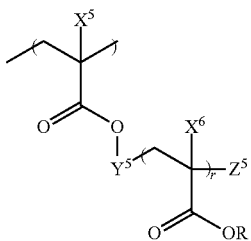

wherein, in formulae (1) to (5), each of $X^1$, $X^2$, $X^3$, $X^4$, $X^5$ and $X^6$ independently represents a hydrogen atom or a monovalent organic group, each of $Y^1$, $Y^2$, $Y^3$, $Y^4$ and $Y^5$ independently represents a divalent linking group, each of $Z^1$, $Z^2$, $Z^3$, $Z^4$ and $Z^5$ independently represents a hydrogen atom or a monovalent substituent, each of n, m, p, q and r represents an integer of 1 to 500, in formulae (1) and (2), each of j and k independently represents an integer of 2 to 8, in formulae (3) and (4), R' represents a branched or linear alkylene group, and in formula (5), R represents a hydrogen atom or a monovalent organic group.

* * * * *